United States Patent
Liu et al.

(10) Patent No.: US 12,518,694 B2
(45) Date of Patent: Jan. 6, 2026

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Biao Liu, Beijing (CN); Tinghua Shang, Beijing (CN); Yi Zhang, Beijing (CN); Peng Xu, Beijing (CN); Jiaxing Chen, Beijing (CN); Zuoji Niu, Beijing (CN); Yixuan Long, Beijing (CN); Qian Xu, Beijing (CN); Yan Huang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/576,041

(22) PCT Filed: Feb. 28, 2023

(86) PCT No.: PCT/CN2023/078596
§ 371 (c)(1),
(2) Date: Jan. 2, 2024

(87) PCT Pub. No.: WO2024/178580
PCT Pub. Date: Sep. 6, 2024

(65) Prior Publication Data
US 2025/0342802 A1    Nov. 6, 2025

(51) Int. Cl.
*G09G 3/3233* (2016.01)
*H10K 59/121* (2023.01)
*H10K 59/131* (2023.01)

(52) U.S. Cl.
CPC ....... *G09G 3/3233* (2013.01); *H10K 59/1213* (2023.02); *H10K 59/131* (2023.02);
(Continued)

(58) Field of Classification Search
USPC .............................................. 257/40; 438/82
See application file for complete search history.

(56) References Cited

U.S. PATENT DOCUMENTS

2004/0207580 A1    10/2004    Yaguma et al.
2018/0315801 A1    11/2018    Matsueda
(Continued)

FOREIGN PATENT DOCUMENTS

CN    100449772 C    1/2009
CN    101937647 B    9/2012
(Continued)

OTHER PUBLICATIONS

International Search Report & Written Opinion mailed Jun. 21, 2023, regarding PCT/CN2023/078596.
(Continued)

*Primary Examiner* — Kevin M Nguyen
(74) *Attorney, Agent, or Firm* — Intellectual Valley Law, P.C.

(57) ABSTRACT

An array substrate includes a first subpixel having a second conductive layer and an anode layer. The anode layer includes a first anode in the first subpixel. The second conductive layer includes a first signal line and a second signal line. The second signal line includes a main body extending along a direction substantially parallel to a second direction and a branch connected to the main body. The branch is on a side of the main body away from the first signal line along a first direction. An orthographic projection of the first anode on the base substrate at least partially overlaps with an orthographic projection of the first signal
(Continued)

line on the base substrate, at least partially overlaps with an orthographic projection of the main body on the base substrate, and at least partially overlaps with an orthographic projection of the branch on the base substrate.

20 Claims, 56 Drawing Sheets

(52) U.S. Cl.
CPC ............... *G09G 2300/0426* (2013.01); *G09G 2300/0819* (2013.01); *G09G 2330/06* (2013.01)

(56) References Cited

U.S. PATENT DOCUMENTS

| | | | |
|---|---|---|---|
| 2021/0028265 A1 | 1/2021 | Kim et al. | |
| 2022/0285458 A1 | 9/2022 | Shang et al. | |
| 2022/0302242 A1 | 9/2022 | Dai et al. | |
| 2022/0310708 A1* | 9/2022 | Dai | H10K 59/131 |
| 2022/0320194 A1 | 10/2022 | Du et al. | |
| 2023/0138949 A1 | 5/2023 | Wang et al. | |
| 2023/0142259 A1 | 5/2023 | Liu et al. | |
| 2023/0263020 A1 | 8/2023 | Yu et al. | |

FOREIGN PATENT DOCUMENTS

| | | |
|---|---|---|
| CN | 108807466 A | 11/2018 |
| CN | 108766355 B | 2/2020 |
| CN | 112289262 A | 1/2021 |
| CN | 110473501 B | 2/2021 |
| CN | 113707704 A | 11/2021 |
| CN | 113781961 A | 12/2021 |
| CN | 114241999 A | 3/2022 |
| CN | 114373773 A | 4/2022 |
| CN | 114843329 A | 8/2022 |
| CN | 114974130 A | 8/2022 |
| CN | 113380180 B | 9/2022 |
| CN | 115039229 A | 9/2022 |
| CN | 115152027 A | 10/2022 |
| CN | 115398638 A | 11/2022 |
| WO | 2021238478 A1 | 12/2021 |
| WO | 2022160255 A1 | 8/2022 |
| WO | 2022232988 A1 | 11/2022 |
| WO | 2022266979 A1 | 12/2022 |

OTHER PUBLICATIONS

Extended European Search Report in the European Patent Application No. 23924558.2, dated Aug. 20, 2025.

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/078596, filed Feb. 28, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of subpixels; wherein the plurality of subpixels comprises a first subpixel; the array substrate further comprises a base substrate, a second conductive layer on the base substrate, and an anode layer on a side of the second conductive layer away from the base substrate; the anode layer comprises a first anode in the first subpixel; the second conductive layer comprises a first signal line and a second signal line extending along a direction substantially parallel to a second direction, respectively; the second signal line comprises a main body extending along a direction substantially parallel to the second direction and a branch connected to the main body, the branch is on a side of the main body away from the first signal line along a direction substantially parallel to a first direction, the first direction and the second direction intersecting each other; and an orthographic projection of the first anode on the base substrate at least partially overlaps with an orthographic projection of the first signal line on the base substrate, at least partially overlaps with an orthographic projection of the main body on the base substrate, and at least partially overlaps with an orthographic projection of the branch on the base substrate.

Optionally, the array substrate comprises a plurality of first voltage supply lines and a plurality of data lines; wherein the first signal line is one of the plurality of data lines; and the second signal line is one of the plurality of first voltage supply lines; wherein a first adjacent first voltage supply line of the plurality of first voltage supply lines comprises a first main body and a first branch connected to the first main body; an orthographic projection of the first anode on the base substrate at least partially overlaps with an orthographic projection of a data line of the plurality of data lines on the base substrate; at least partially overlaps with an orthographic projection of the first main body on the base substrate; and at least partially overlaps with an orthographic projection of the first branch on the base substrate; and portions of the data line, the first main body, and the first branch, in a region crossing over the first anode, have a substantial mirror symmetry with respect to a plane perpendicular to the first anode and intersecting the first anode.

Optionally, the branch comprises a support part and one or more connecting parts; the support part is spaced apart from the main body; the one or more connecting parts connect the support part with the main body.

Optionally, the array substrate further comprises a first reset signal network and a second reset signal network, and comprising a first column of pixel driving circuits, a second column of pixel driving circuits, and a third column of pixel driving circuits adjacent to each other; wherein the first reset signal network comprises a plurality of first reset signal lines and a plurality of third reset signal lines interconnected to each other; the second reset signal network comprises a plurality of second reset signal lines and a plurality of fourth reset signal lines interconnected to each other; a third reset signal line of the plurality of third reset signal lines is present in the first column of pixel driving circuits, and the plurality of third reset signal lines are absent in the second column of pixel driving circuits; a fourth reset signal line of the plurality of fourth reset signal lines is present in the second column of pixel driving circuits, and the plurality of fourth reset signal lines are absent in the first column of pixel driving circuits; and the plurality of third reset signal lines and the plurality of fourth reset signal lines are absent in the third column of pixel driving circuits.

Optionally, the first column of pixel driving circuits is configured to drive light emission of a first column of subpixels of a first color; the second column of pixel driving circuits is configured to drive light emission of a second column of subpixels of a second color; the third column of pixel driving circuits is configured to drive light emission of a third column of subpixels of a third color; and the first color, the second color, and the third color are different colors.

Optionally, the plurality of first reset signal lines and the plurality of second reset signal lines are in a same conductive layer; the plurality of third reset signal lines and the plurality of fourth reset signal lines are in a same layer on a side of the same conductive layer away from a base substrate.

Optionally, pixel driving circuits of the array substrate are arranged in K columns including a (3k−2)-th column, a (3k−1)-th column, and a (3k)-th column, K and k being positive integers, 1≤k≤(K/3); a third reset signal line of the plurality of third reset signal lines is present in the (3k−2)-th column of pixel driving circuits, and the plurality of third reset signal lines are absent in the (3k)-th column of pixel driving circuits; a fourth reset signal line of the plurality of fourth reset signal lines is present in the (3k)-th column of pixel driving circuits, and the plurality of fourth reset signal lines are absent in the (3k−2)-th column of pixel driving circuits; and the plurality of third reset signal lines and the plurality of fourth reset signal lines are absent in the (3k−1)-th column of pixel driving circuits.

Optionally, a pixel driving circuit in the second column of pixel driving circuits comprises a first connecting line connecting a first electrode of a first reset transistor to a first reset signal line of the plurality of first reset signal lines; a pixel driving circuit in the first column of pixel driving circuits comprises a second connecting line connecting a first electrode of a second reset transistor to a second reset signal line of the plurality of second reset signal lines; a pixel driving circuit in the third column of pixel driving circuits comprises a first connecting line connecting a first electrode of a first reset transistor to a first reset signal line of the plurality of first reset signal lines and a second connecting line connecting a first electrode of a second reset transistor to a second reset signal line of the plurality of second reset signal lines; a first connecting line is absent in the first column of pixel driving circuits, the third reset signal line connects a first electrode of a first reset transistor to a first reset signal line of the plurality of first reset signal lines; and a second connecting line is absent in the second column of pixel driving circuits, the fourth reset signal line connects a first electrode of a second reset transistor to a second reset signal line of the plurality of second reset signal lines.

Optionally, a respective pixel driving circuit comprises a first connecting line connecting a first electrode of a first reset transistor to a first reset signal line of the plurality of first reset signal lines and a second connecting line connecting a first electrode of a second reset transistor to a second reset signal line of the plurality of second reset signal lines; in the first column of pixel driving circuits, the third reset signal line is connected to a first reset signal line of the plurality of first reset signal lines through a first connecting line in a pixel driving circuit in the first column of pixel driving circuits; and in the second column of pixel driving circuits, the fourth reset signal line is connected to a second reset signal line of the plurality of second reset signal lines through a second connecting line in a pixel driving circuit in the second column of pixel driving circuits.

Optionally, an orthographic projection of the first anode on the base substrate at least partially overlaps with an orthographic projection of a fourth reset signal line of the plurality of fourth reset signal lines on the base substrate; at least partially overlaps with an orthographic projection of a first voltage supply line of a plurality of first voltage supply lines on the base substrate; and at least partially overlaps with an orthographic projection of a data line of a plurality of data lines on the base substrate; and portions of the fourth reset signal line, the first voltage supply line, and the data line, in a region crossing over the first anode, have a substantial mirror symmetry with respect to a plane perpendicular to the first anode and intersecting the first anode.

Optionally, in the region where portions of the fourth reset signal line, the first voltage supply line, and the data line cross over the first anode, the first voltage supply line spaces apart the fourth reset signal line from the data line.

Optionally, in the region where portions of the fourth reset signal line, the first voltage supply line, and the data line cross over the first anode, the fourth reset signal line and the data line have a substantial mirror symmetry with respect to the first voltage supply line.

Optionally, the array substrate further comprises a second anode; wherein an orthographic projection of the second anode on the base substrate at least partially overlaps with an orthographic projection of a first adjacent first voltage supply line of a plurality of first voltage supply lines on the base substrate; at least partially overlaps with an orthographic projection of a third reset signal line of the plurality of third reset signal lines on the base substrate; at least partially overlaps with an orthographic projection of a data line of a plurality of data lines on the base substrate; and at least partially overlaps with an orthographic projection of a second adjacent first voltage supply line of the plurality of first voltage supply lines on the base substrate; and portions of the first adjacent first voltage supply line, the third reset signal line, the data line, and the second adjacent first voltage supply line, in a region crossing over the second anode, have a substantial mirror symmetry with respect to a plane perpendicular to the second anode and intersecting the second anode.

Optionally, in the region where portions of the first adjacent first voltage supply line, the third reset signal line, the data line, and the second adjacent first voltage supply line cross over the second anode, the third reset signal line and the data line space apart the first adjacent first voltage supply line from the second adjacent first voltage supply line.

Optionally, the array substrate further comprises a second anode and a plurality of first voltage supply lines; wherein a second adjacent first voltage supply line of the plurality of first voltage supply lines comprises a second main body and a second branch connected to the second main body; an orthographic projection of the second anode on the base substrate at least partially overlaps with an orthographic projection of the second main body on the base substrate, at least partially overlaps with an orthographic projection of the second branch on the base substrate, at least partially overlaps with an orthographic projection of a data line of a plurality of data lines on the base substrate, and at least partially overlaps with an orthographic projection of a third adjacent first voltage supply line of the plurality of first voltage supply lines on the base substrate; and portions of the second main body, the second branch, the data line, and the third adjacent first voltage supply line, in a region crossing over the second anode, have a substantial mirror symmetry with respect to a plane perpendicular to the second anode and intersecting the second anode.

Optionally, in the region where portions of the second main body, the second branch, the data line, and the third adjacent first voltage supply line cross over the second anode, the second branch and the data line space apart the second main body from the third adjacent first voltage supply line.

Optionally, the array substrate further comprises a second anode and a third anode; wherein a respective pixel driving circuit comprises a compensating transistor and a driving transistor; the compensating transistor comprises a first channel part connected to a second electrode of the compensating transistor and a second channel part connected to a first electrode of the compensating transistor; the second electrode of the compensating transistor is connected to a gate electrode of the driving transistor; and an orthographic projection of the first anode on the base substrate substantially covers an orthographic projection of a first channel part of a compensating transistor in a first pixel driving circuit on the base substrate.

Optionally, an orthographic projection of the second anode on the base substrate substantially covers an orthographic projection of a first channel part of a compensating transistor in a second pixel driving circuit on the base substrate, and substantially covers an orthographic projection of a first channel part of a compensating transistor in a third pixel driving circuit on the base substrate; and an orthographic projection of the third anode on the base substrate is non-overlapping with an orthographic projection of an active layer of a compensating transistor in any pixel driving circuit on the base substrate.

Optionally, the first subpixel comprises an interference prevention block; wherein the interference prevention block comprises a main pad part, a first extension, and a second extension; the first extension and the second extension extend away from the main pad part along a direction substantially parallel to the second direction; the main pad part connects the first extension with the second extension; an orthographic projection of the first extension on the base substrate at least partially overlaps with an orthographic projection of a portion of a semiconductor material layer between two channel parts of a compensating transistor on the base substrate; and an orthographic projection of the second extension on the base substrate is non-overlapping with the orthographic projection of the portion of the semiconductor material layer between the two channel parts of the compensating transistor on the base substrate.

Optionally, the first subpixel comprises a node connecting line; the node connecting line connects a gate electrode of a driving transistor with a second electrode of the compensating transistor; the second extension overlaps with the node connecting line along the second direction; and the second extension spaces apart the node connecting line from a data line connected to a pixel driving circuit comprising the node connecting line.

In another aspect, the present disclosure provides a display apparatus, comprising the array substrate described herein or fabricated by a method described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of subpixels. Optionally, the plurality of subpixels comprises a first subpixel. Optionally, the array substrate comprises a base substrate, a second conductive layer on the base substrate, and an anode layer on a side of the second conductive layer away from the base substrate. Optionally, the anode layer comprises a first anode in the first subpixel. Optionally, the second conductive layer comprises a first signal line and a second signal line extending along a direction substantially parallel to a second direction, respectively. Optionally, the second signal line comprises a main body extending along a direction substantially parallel to the second direction and a branch connected to the main body, the branch is on a side of the main body away from the first signal line along a direction substantially parallel to a first direction, the first direction and the second direction intersecting each other. Optionally, the branch is on a side of the main body away from the first signal line. Optionally, an orthographic projection of the first anode on the base substrate at least partially overlaps with an orthographic projection of the first signal line on the base substrate, at least partially overlaps with an orthographic projection of the main body on the base substrate, and at least partially overlaps with an orthographic projection of the branch on the base substrate.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
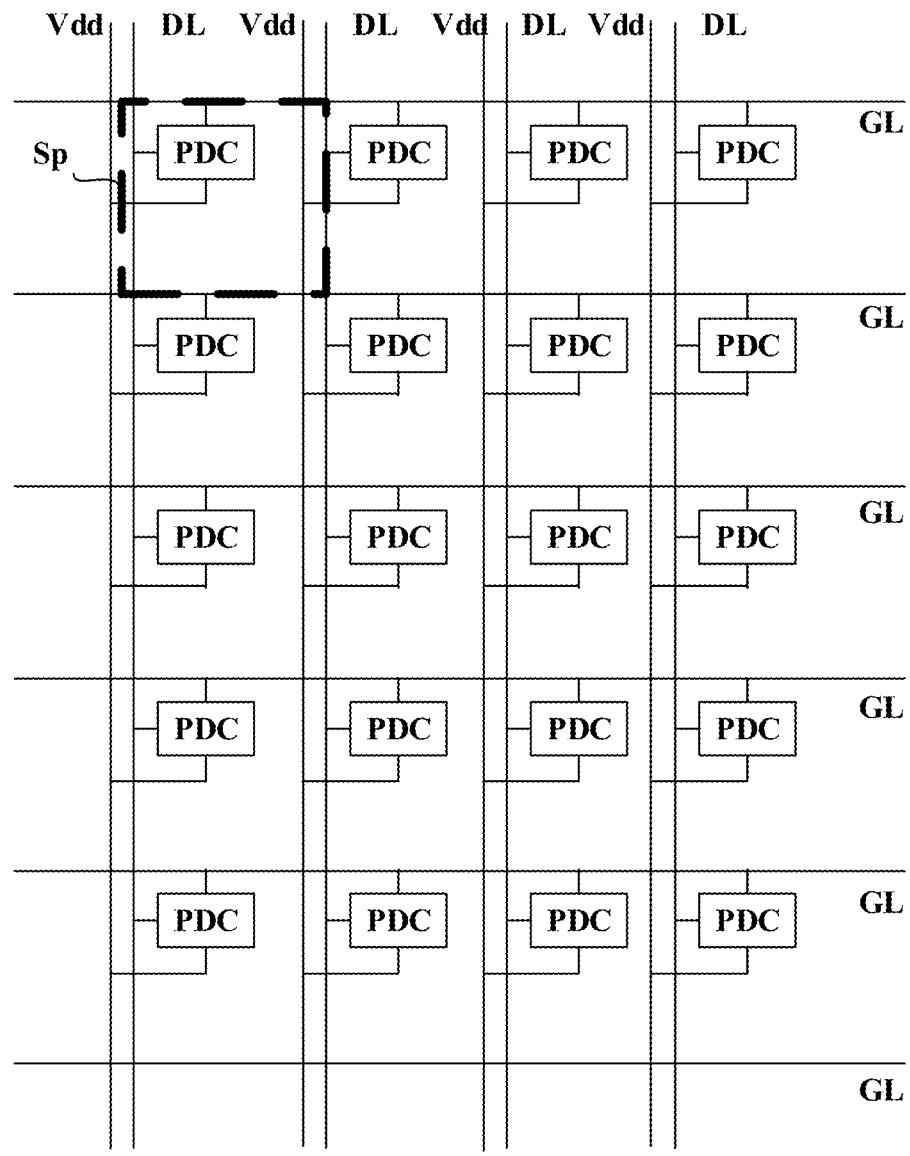
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, a plurality of second voltage supply line Vdd (including a plurality of second voltage supply line Vdd2, and a respective first voltage supply line (e.g., a high voltage supply line)). Light emission in a respective subpixel Sp is driven by a respective pixel driving circuit PDC. In one example, a high voltage signal (e.g., a VDD signal) is input, through the respective second voltage supply line of the plurality of second voltage supply line Vdd2, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Figure 2A:
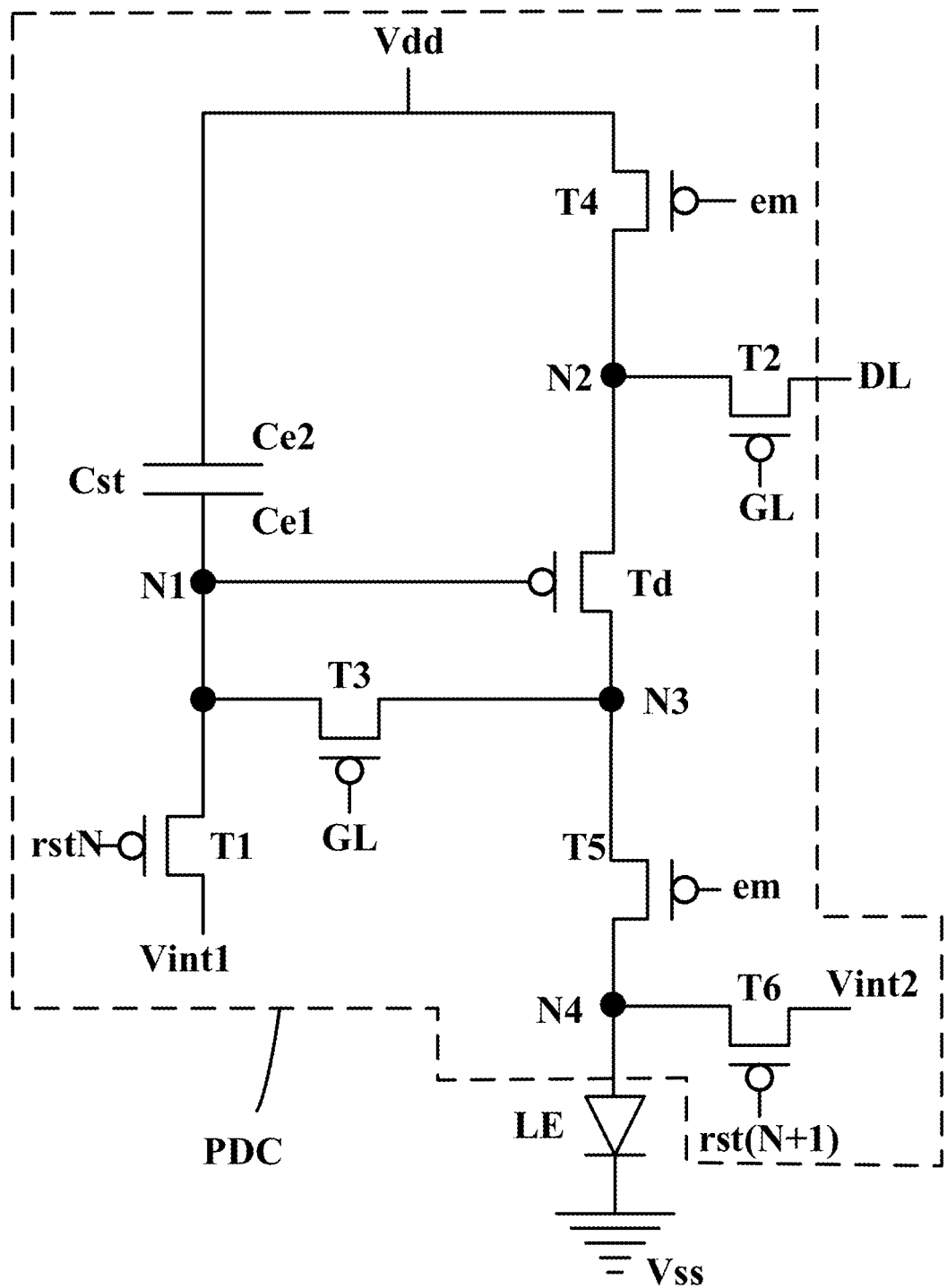
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage, a first electrode connected to a respective first reset signal line of a plurality of first reset signal lines Vint1, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to a reset control signal line rst(N+1) in a next stage, a first electrode connected to a second reset signal line of a plurality of second reset signal lines Vint2, and a second electrode connected to the second electrode of the fifth transistor and the anode of the light emitting element LE. The second capacitor electrode Ce2 is connected to the respective voltage supply line and the first electrode of the fourth transistor T4.

In some embodiments, the pixel driving circuit includes a driving transistor Td, a data write transistor (e.g., the second transistor T2), a compensating transistor (e.g., the third transistor T3), two light emitting control transistors (e.g., the fourth transistor T4 and the fifth transistor T5), and two reset transistors (e.g., the first transistor T1 and the sixth transistor T6).

Figure 2B:
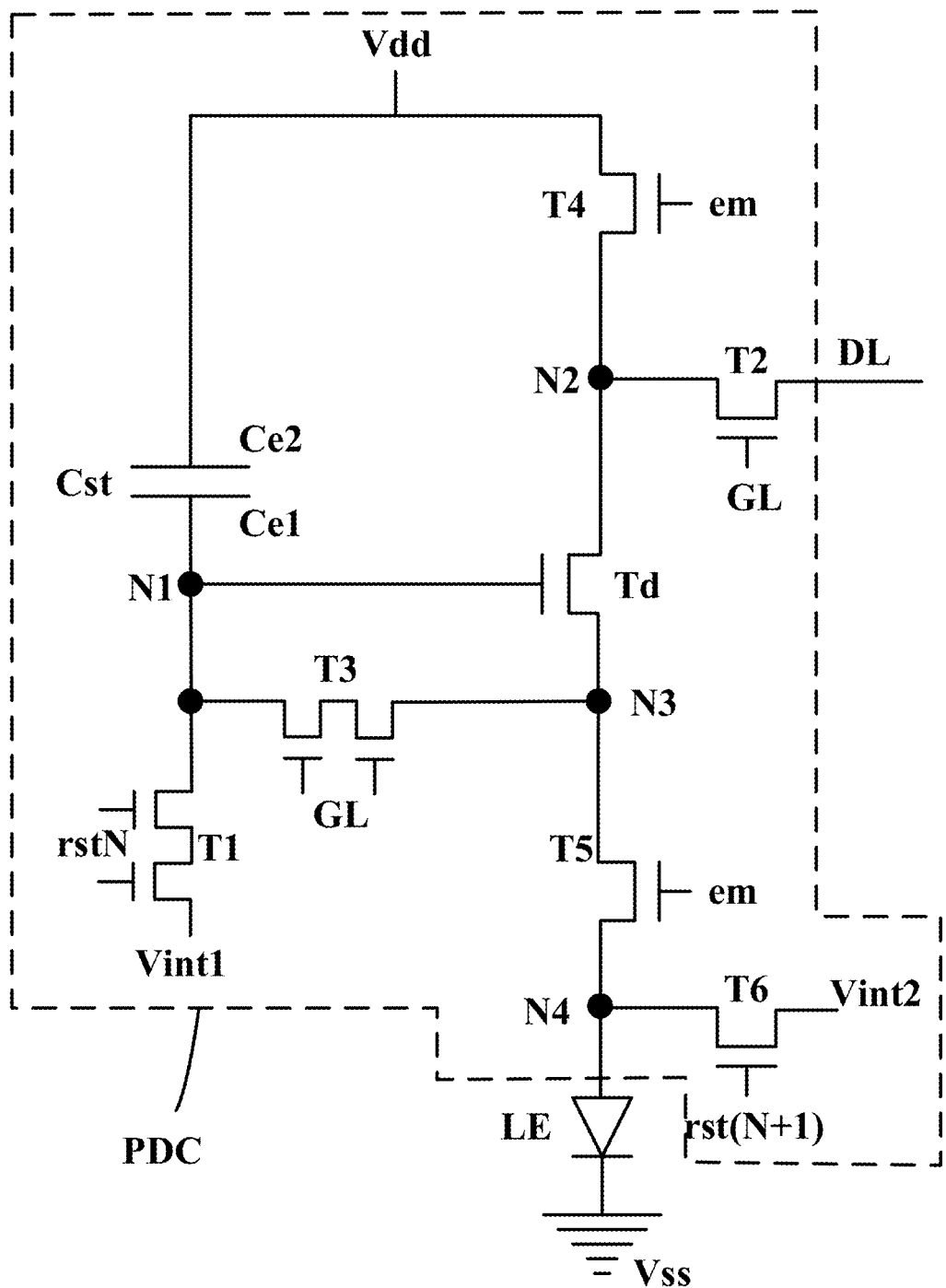
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective first gate line of the plurality of first gate lines GL1 twice (alternatively, the respective gate line crosses over the active layer of the third transistor T3 twice). The gate electrode of the first transistor T1 is denoted as "G1" in FIG. 3D and FIG. 5D, in which the first transistor T1 is a "double gate" transistor. The gate electrode of the third transistor T3 is denoted as "G3" in FIG. 3D and FIG. 5D, in which the third transistor T3 is a "double gate" transistor.

The pixel driving circuit further include a first node N1, a second node N2, a third node N3, and a fourth node N4. The first node N1 is connected to the gate electrode of the driving transistor Td, the first capacitor electrode Ce1, and the first electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the second electrode of the third transistor T3, and the first electrode of the fifth transistor T5. The fourth node N4 is connected to the second electrode of the fifth transistor T5, the second electrode of the sixth transistor T6, and the anode of the light emitting element LE.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

Figure 2C:
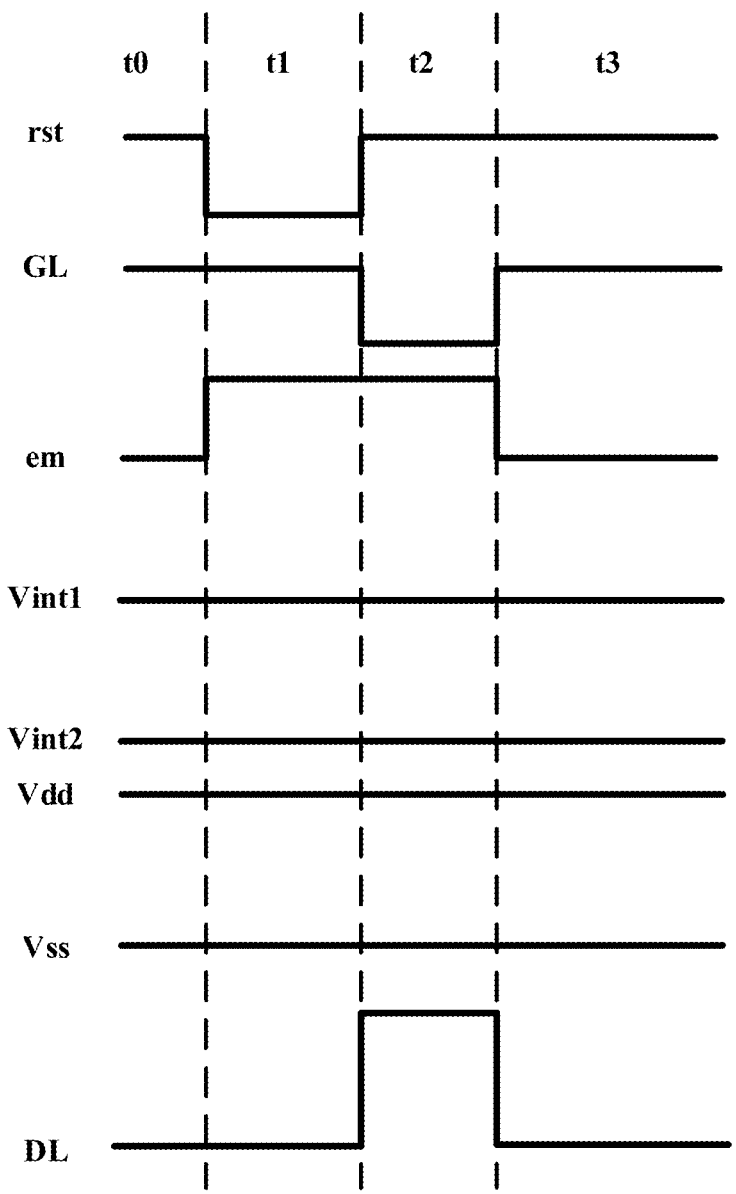
FIG. 2C is a timing diagram illustrating the operation of a pixel driving circuit in some embodiments according to the present disclosure.

FIG. 2C is a timing diagram illustrating the operation of a pixel driving circuit in some embodiments according to the present disclosure. Referring to FIG. 2A to FIG. 2C, during one frame of image, the operation of the pixel driving circuit includes a reset sub-phase t1, a data write sub-phase t2, and a light emitting sub-phase t3. In the initial sub-phase t0, a turning-off reset control signal is provided through the respective reset control signal line of the plurality of reset control signal lines rst to the gate electrode of the first transistor T1 to turn off the first transistor T1. In the initial sub-phase t0, the respective gate line of the plurality of gate lines GL is provided with a turning-off signal, thus the second transistor T2 and the third transistor T3 are turned off.

In the reset sub-phase t1, a turning-on reset control signal is provided through the respective reset control signal line of the plurality of reset control signal lines rst to the gate electrode of the first transistor T1 to turn on the first transistor T1; allowing an initialization voltage signal from the respective first reset signal line of the plurality of first reset signal lines Vint1 to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective second voltage supply line of the plurality of second voltage supply lines Vdd2. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a high voltage signal to turn off the fourth transistor T4 and the fifth transistor T5.

In the data write sub-phase t2, the turning-off reset control signal is again provided through the respective reset control signal line of the plurality of reset control signal lines rst to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the second electrode of the third transistor T3. A gate electrode of the driving transistor Td is electrically connected with the first electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase t2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a high voltage signal to turn off the fourth transistor T4 and the fifth transistor T5.

In the data write sub-phase t2, a turning-on reset control signal is provided through the respective reset control signal line of the plurality of reset control signal line rst in a next adjacent stage to the gate electrode of the sixth transistor T6 to turn on the sixth transistor T6; allowing an initialization voltage signal from the respective second reset signal line of the plurality of second reset signal lines Vint2 to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the respective reset control signal line of the plurality of reset control signal lines rst to the gate electrode of the first transistor T1 to turn off the first transistor T1. The respective gate line of the plurality of gate lines GL is provided with a turning-off signal, the second transistor T2 and the third transistor T3 are turned off. The respective light emitting control signal line of the plurality of light emitting control signal lines em is provided with a low voltage signal to turn on the fourth transistor T4 and the fifth transistor T5. The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In another example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes a respective first subpixel, a respective second subpixel, and a respective third subpixel. Optionally, each of the respective first subpixel, the respective second subpixel, and the respective third subpixel, includes the first transistor T1, the second transistor T2, the third transistor T3, the fourth transistor T4, the fifth transistor T5, the sixth transistor T6, the driving transistor Td, and the storage capacitor Cst.

In alternative embodiments, a minimum repeating unit of the plurality of subpixels of the array substrate includes a respective first subpixel, a respective second subpixel, a respective third subpixel, and a respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, the driving transistor Td, and the storage capacitor Cst.

Figure 3A:
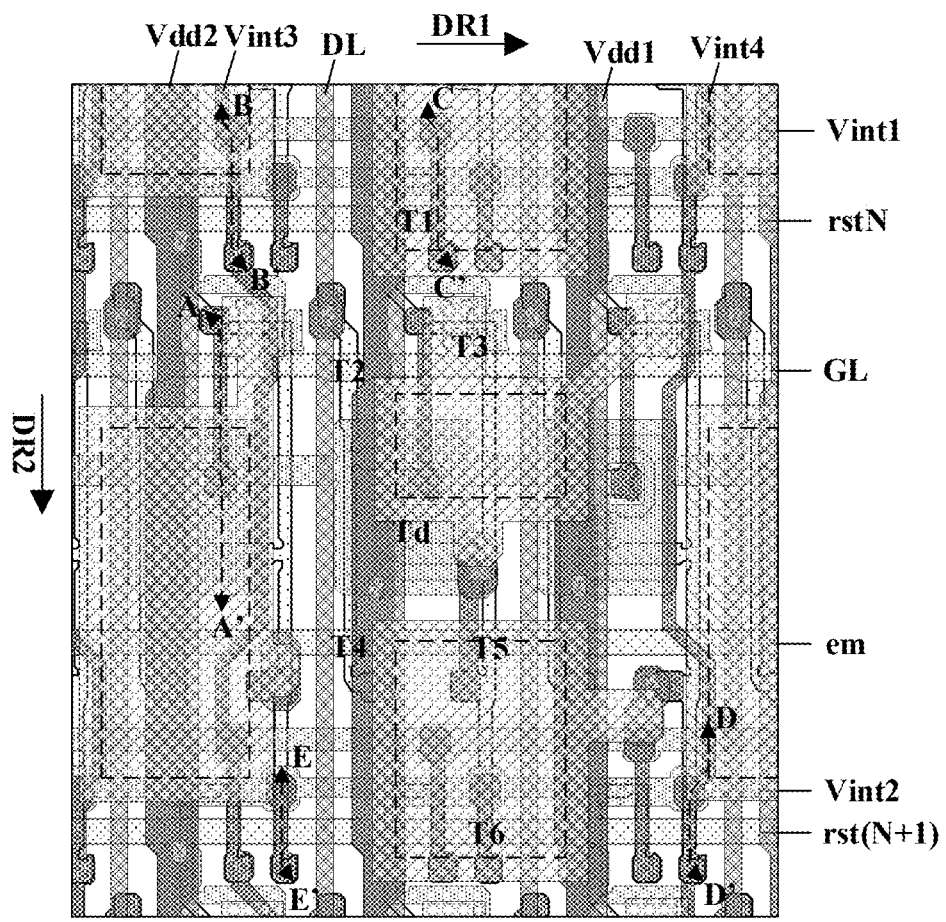
FIG. 3A is a diagram illustrating the structure of an array substrate in some embodiments according to the present disclosure.
Figure 3B:
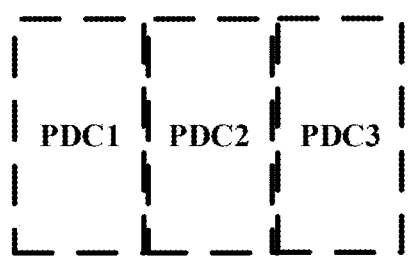
FIG. 3B is a schematic diagram illustrating an arrangement of a plurality of pixel driving circuits in an array substrate depicted in FIG. 3A.

FIG. 3A is a diagram illustrating the structure of an array substrate in some embodiments according to the present disclosure. FIG. 3B is a schematic diagram illustrating an arrangement of a plurality of pixel driving circuits in an array substrate depicted in FIG. 3A. FIG. 3A and FIG. 3B depicts a portion of the array substrate having three pixel driving circuits, including PDC1, PDC2, and PDC3.

Figure 3C:
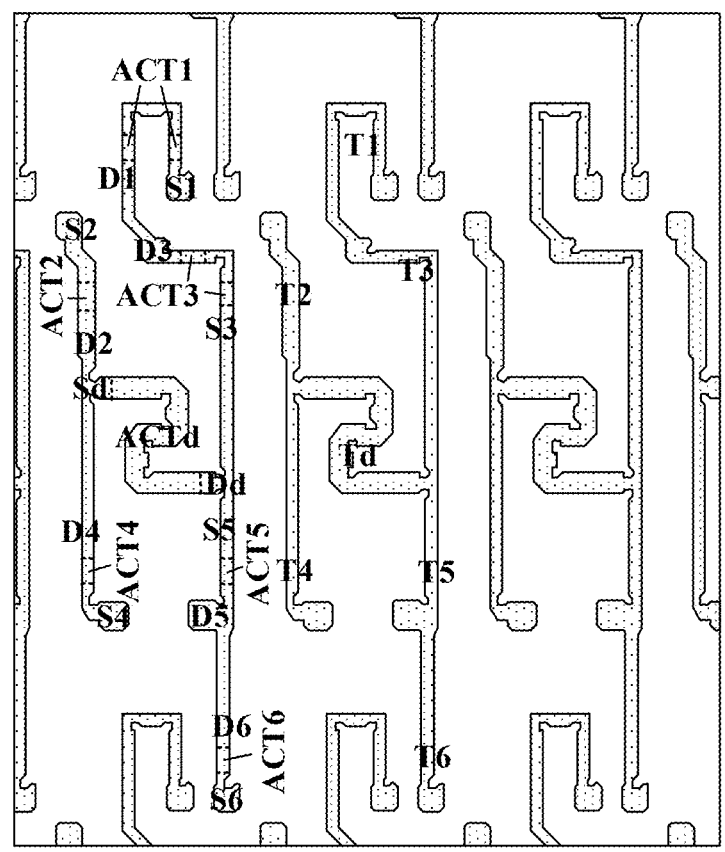
FIG. 3C is a diagram illustrating the structure of a semiconductor material layer in an array substrate depicted in FIG. 3A.
Figure 3D:
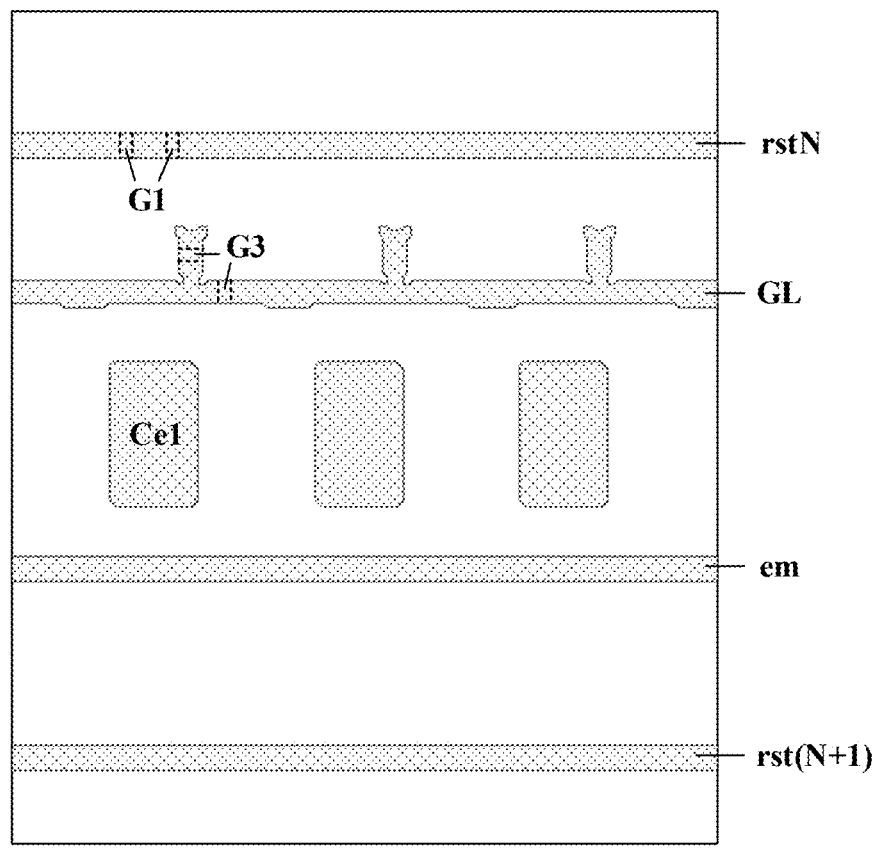
FIG. 3D is a diagram illustrating the structure of a first conductive layer in an array substrate depicted in FIG. 3A.
Figure 3E:
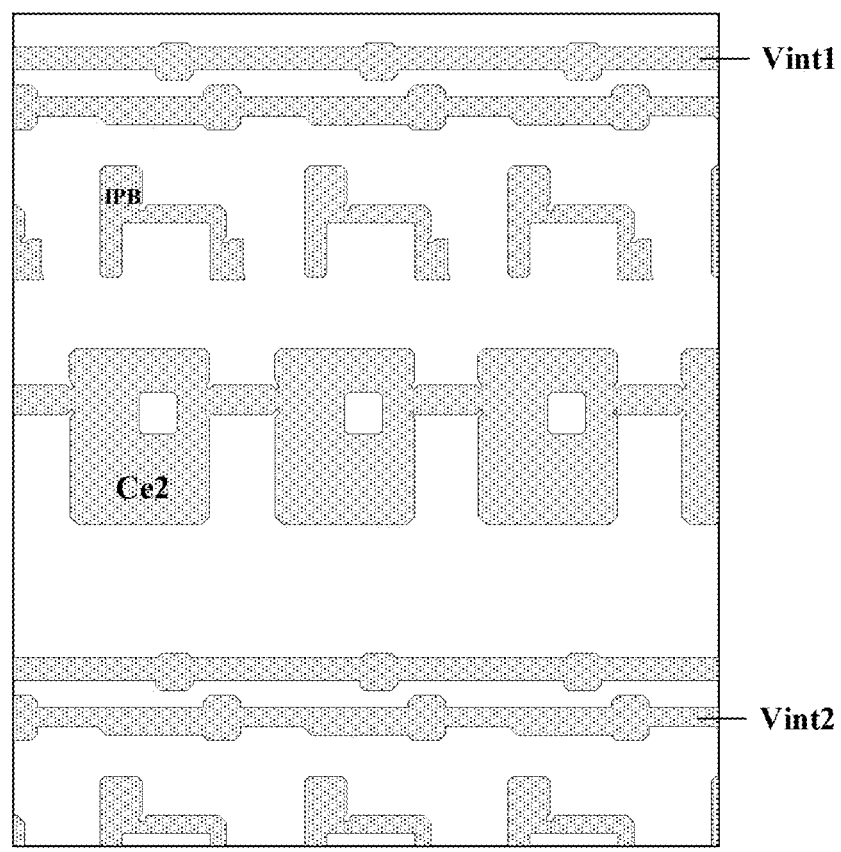
FIG. 3E is a diagram illustrating the structure of a second conductive layer in an array substrate depicted in FIG. 3A.
Figure 3F:
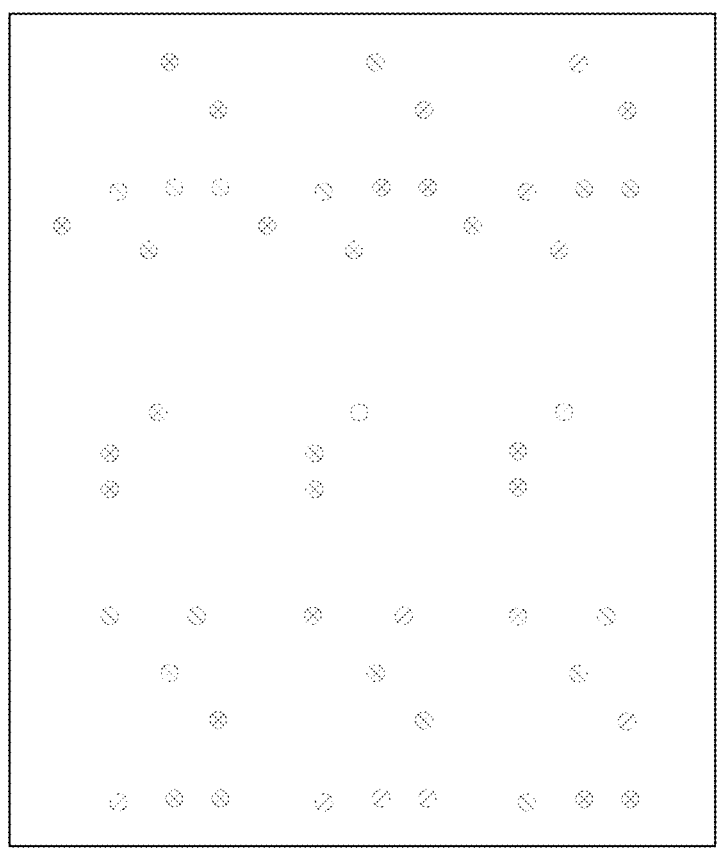
FIG. 3F is a diagram illustrating the structure of an inter-layer dielectric layer in an array substrate depicted in FIG. 3A.
Figure 3G:
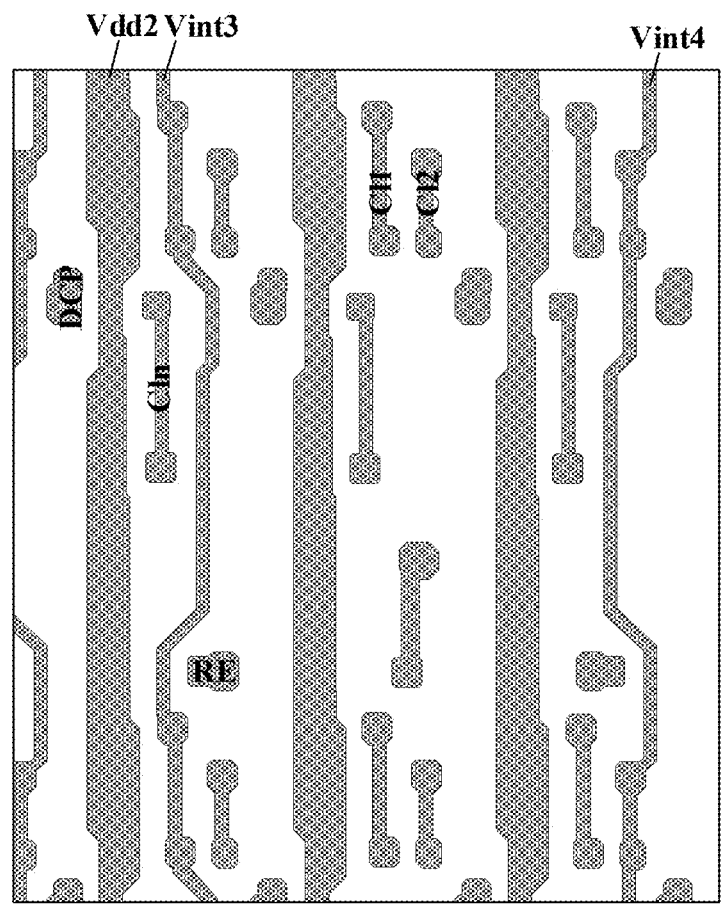
FIG. 3G is a diagram illustrating the structure of a first signal line layer in an array substrate depicted in FIG. 3A.
Figure 3H:
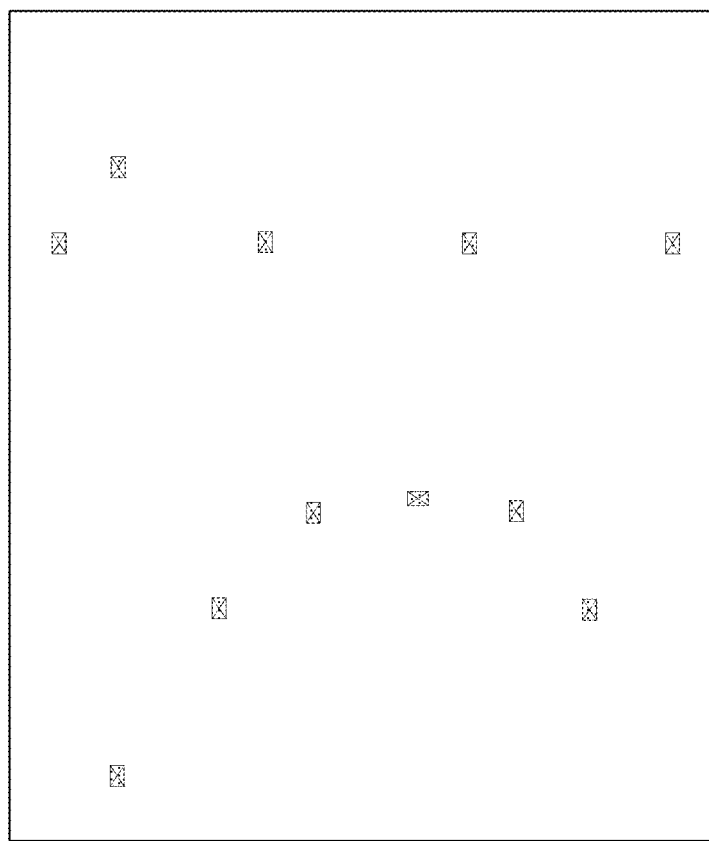
FIG. 3H is a diagram illustrating the structure of a first planarization layer in an array substrate depicted in FIG. 3A.
Figure 3I:
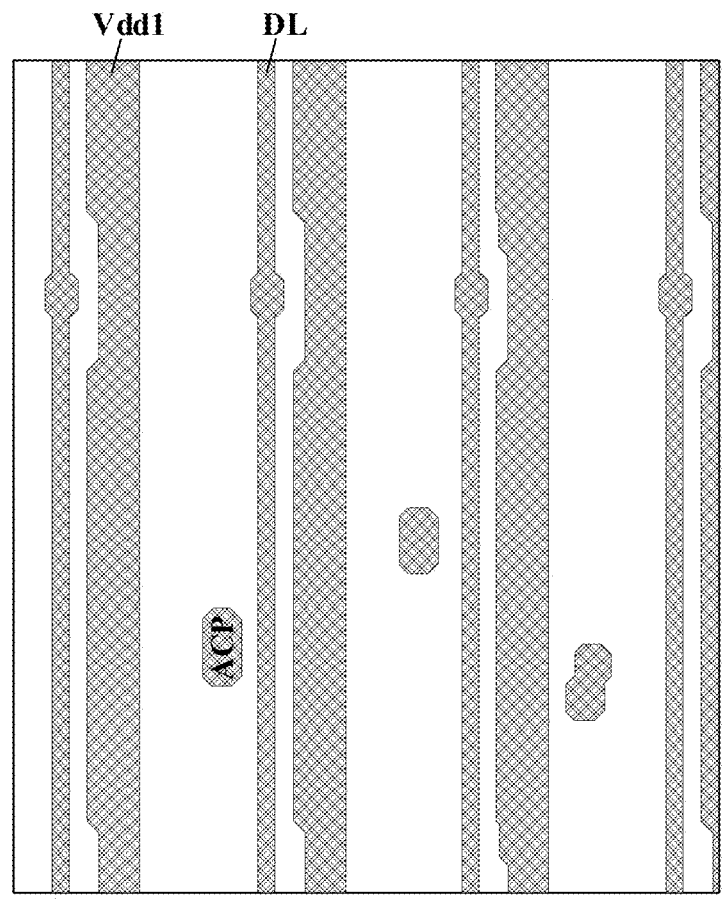
FIG. 3I is a diagram illustrating the structure of a second signal line layer in an array substrate depicted in FIG. 3A.
Figure 3J:
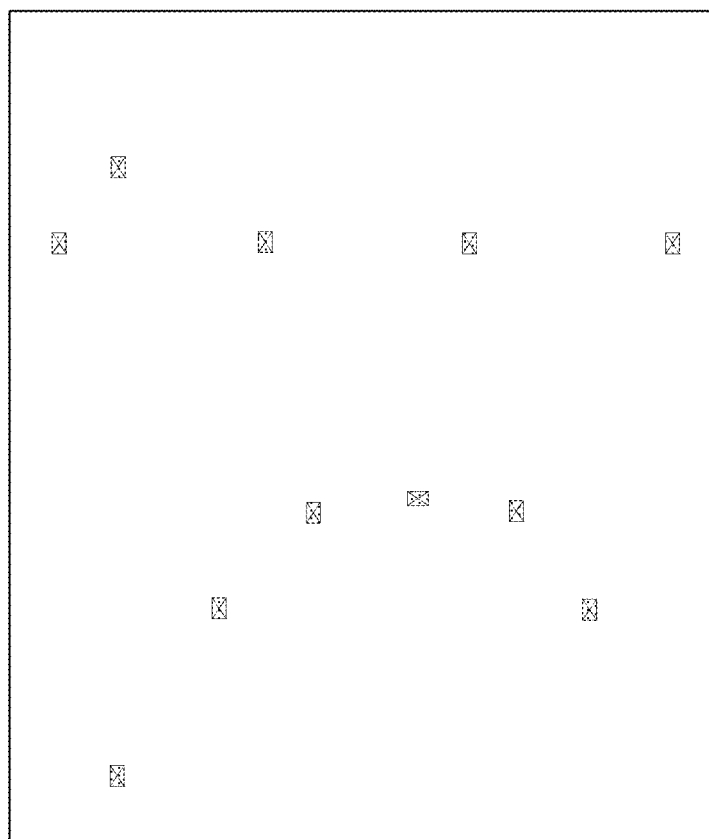
FIG. 3J is a diagram illustrating the structure of a second planarization layer in an array substrate depicted in FIG. 3A.
Figure 3K:
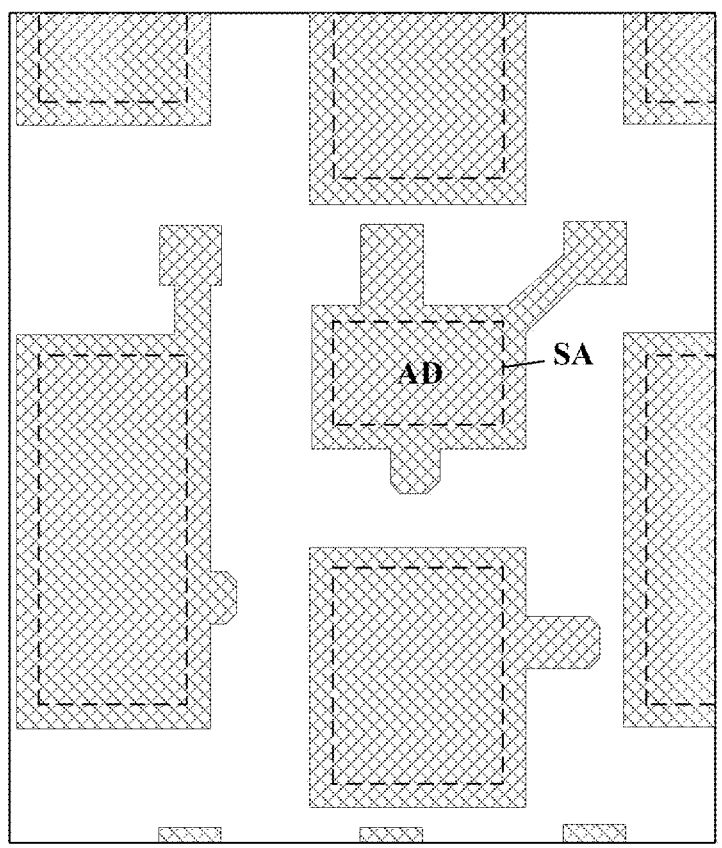
FIG. 3K is a diagram illustrating the structure of an anode layer in an array substrate depicted in FIG. 3A.
Figure 3L:
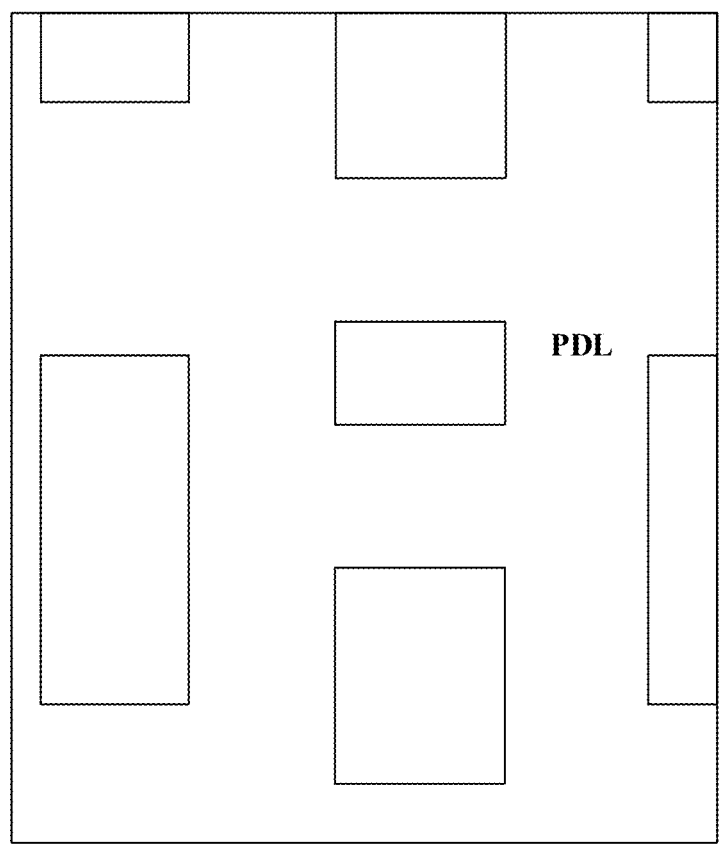
FIG. 3L is a diagram illustrating the structure of a pixel definition layer in an array substrate depicted in FIG. 3A.
Figure 4A:
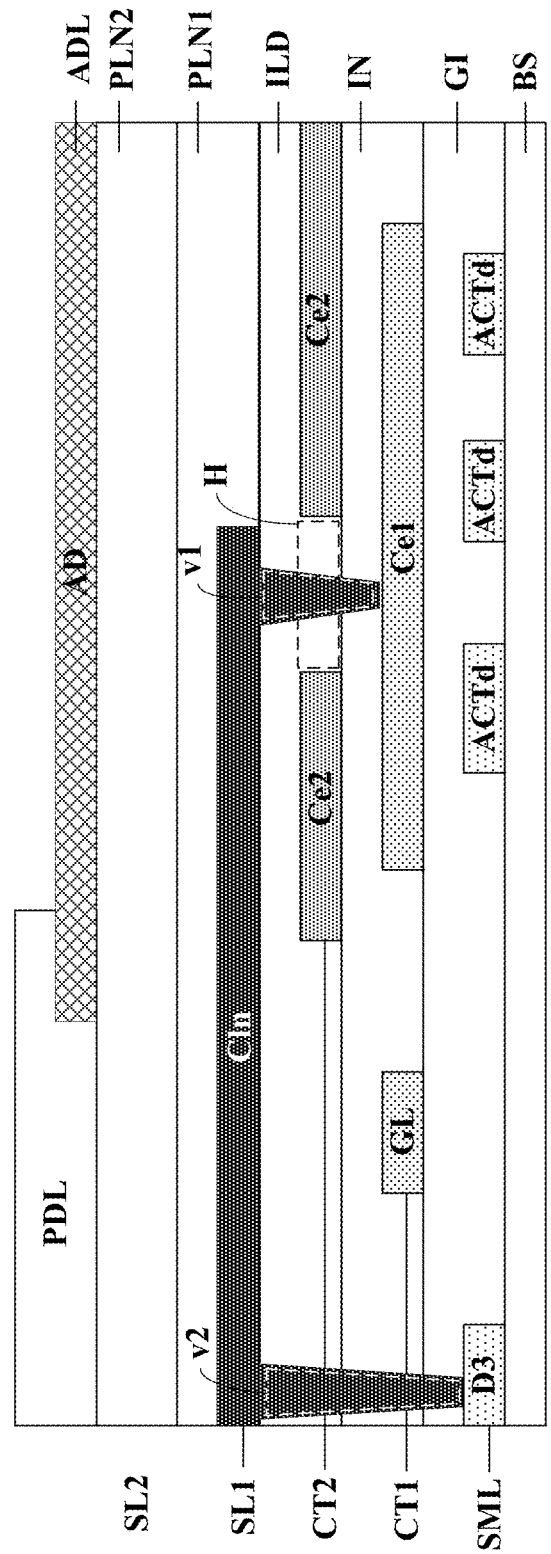
FIG. 4A is a cross-sectional view along an A-A' line in FIG. 3A.
Figure 4B:
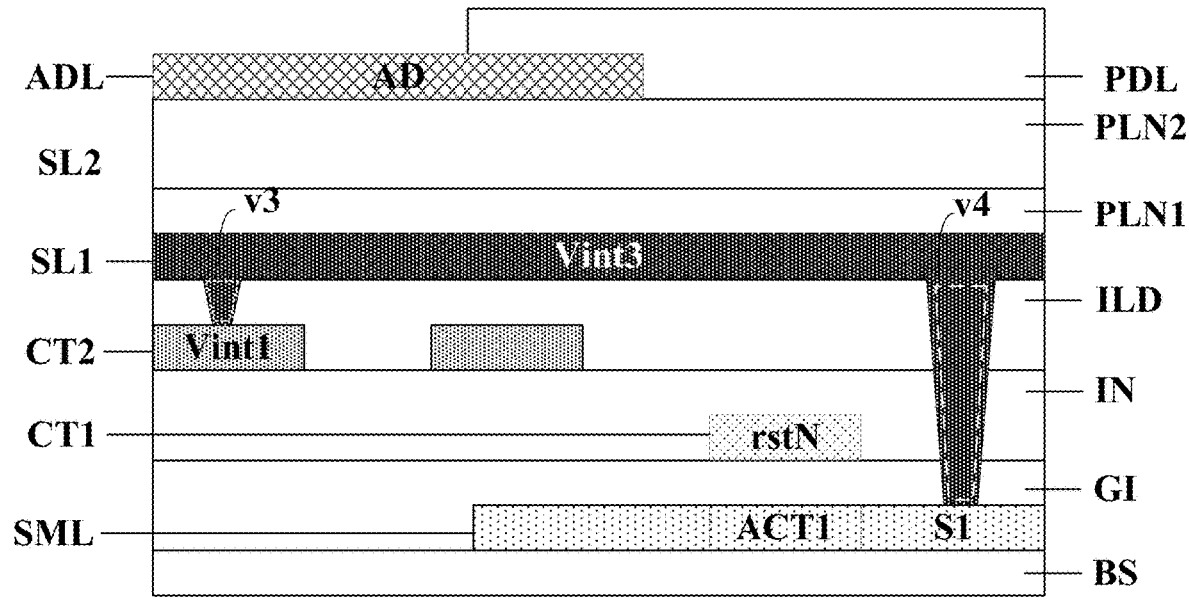
FIG. 4B is a cross-sectional view along a B-B' line in FIG. 3A.
Figure 4C:
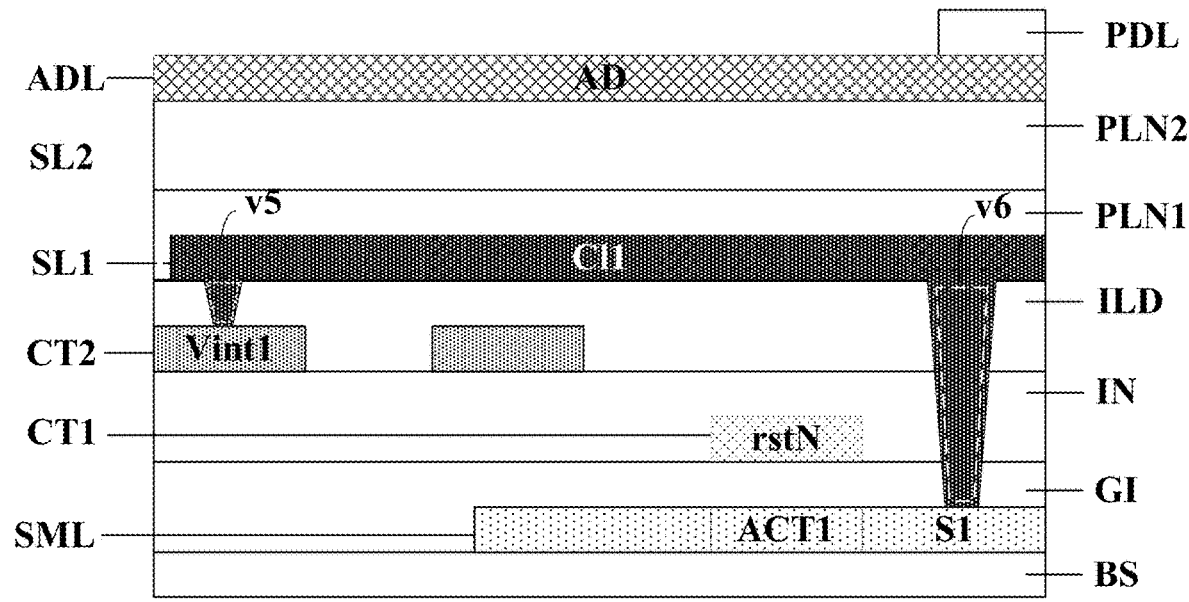
FIG. 4C is a cross-sectional view along a C-C' line in FIG. 3A.
Figure 4D:
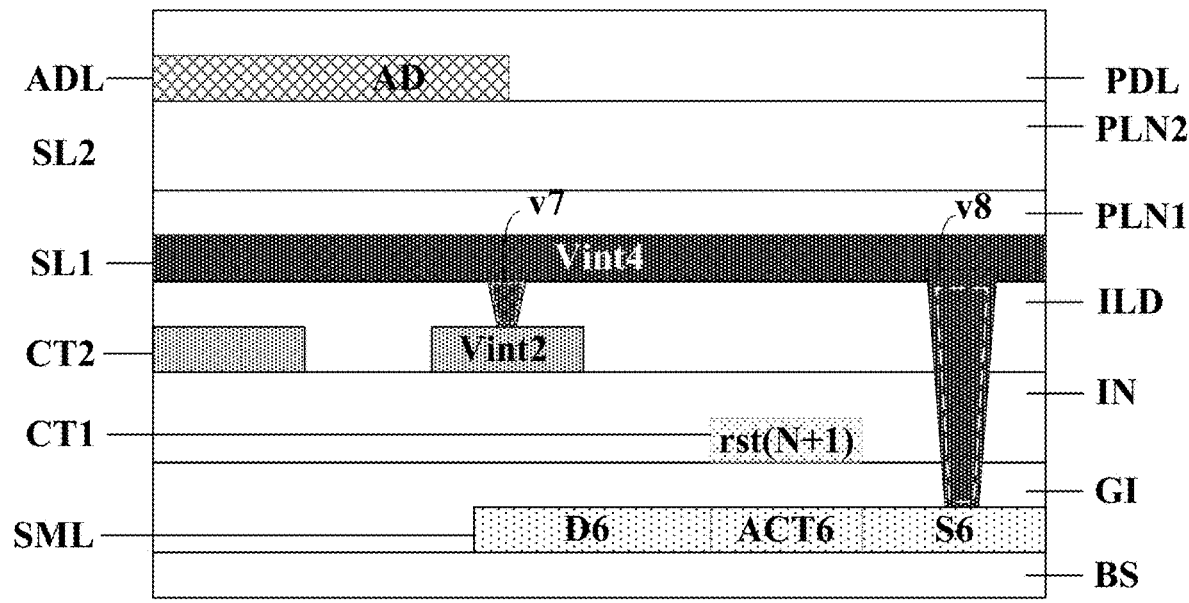
FIG. 4D is a cross-sectional view along a D-D' line in FIG. 3A.
Figure 4E:
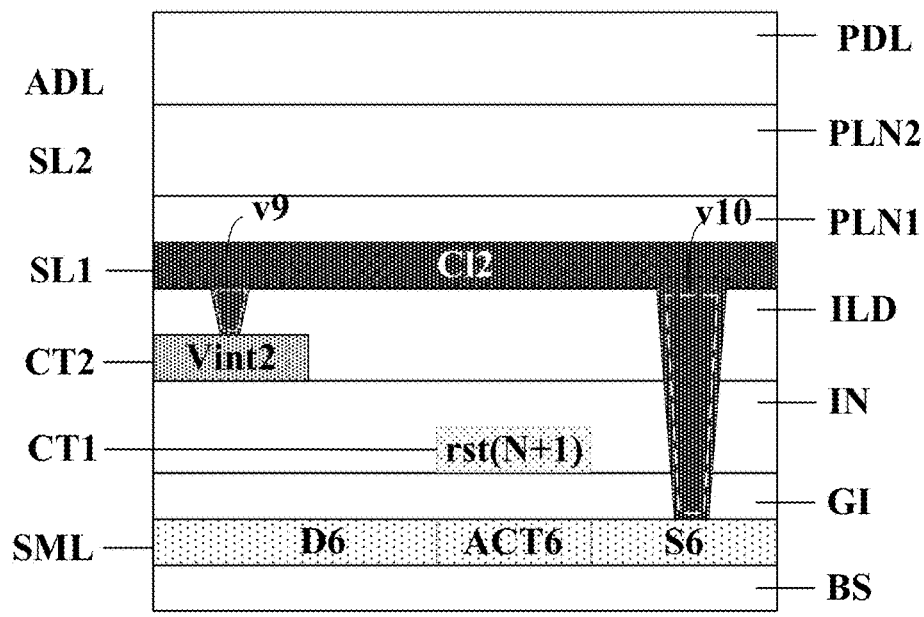
FIG. 4E is a cross-sectional view along a E-E' line in FIG. 3A.

FIG. 3C is a diagram illustrating the structure of a semiconductor material layer in an array substrate depicted in FIG. 3A. FIG. 3D is a diagram illustrating the structure of a first conductive layer in an array substrate depicted in FIG. 3A. FIG. 3E is a diagram illustrating the structure of a second conductive layer in an array substrate depicted in FIG. 3A. FIG. 3F is a diagram illustrating the structure of an inter-layer dielectric layer in an array substrate depicted in FIG. 3A. FIG. 3G is a diagram illustrating the structure of a first signal line layer in an array substrate depicted in FIG. 3A. FIG. 3H is a diagram illustrating the structure of a first planarization layer in an array substrate depicted in FIG. 3A. FIG. 3I is a diagram illustrating the structure of a second signal line layer in an array substrate depicted in FIG. 3A. FIG. 3J is a diagram illustrating the structure of a second planarization layer in an array substrate depicted in FIG. 3A. FIG. 3K is a diagram illustrating the structure of an anode layer in an array substrate depicted in FIG. 3A. FIG. 3L is a diagram illustrating the structure of a pixel definition layer in an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. FIG. 4E is a cross-sectional view along a E-E' line in FIG. 3A.

Referring to FIG. 3A to FIG. 3L, and FIG. 4A to FIG. 4B, in some embodiments, the display panel includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer CT1 away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode layer ADL on a side of the second planarization layer PLN2 away from the second signal line layer SL2, and a pixel definition layer PDL on a side of the anode layer ADL away from the base substrate BS.

Referring to FIG. 2A, FIG. 2B, FIG. 3A, and FIG. 3C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd. In one example, the active layers (ACT1, ACT2, ACT3, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. A first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Referring to FIG. 2A to FIG. 2C, FIG. 3A, and FIG. 3D, the first conductive layer in some embodiments includes a plurality of first reset control signal lines rst (including a reset control signal line in a present stage rstN and a reset control signal line in a next stage rst(N+1)), a plurality of light emitting control signal lines em, a plurality of gate lines GL, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of reset control signal lines rst, the plurality of light emitting control signal lines em, the plurality of gate lines GL, and the first capacitor electrode Ce1 of the storage capacitor Cst are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2A, FIG. 2B, FIG. 3A, and FIG. 3E, the second conductive layer in some embodiments includes an interference prevention block IPB, a plurality of first reset signal lines Vint1, a plurality of second reset signal lines Vint2, and a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the interference prevention block IPB, the plurality of first reset signal lines Vint1, the plurality of second reset signal lines Vint2, and the second capacitor electrode Ce2 of the storage capacitor Cst are in a same layer.

Vias extending through the inter-layer dielectric layer ILD are depicted in FIG. 3F.

Referring to FIG. 2A, FIG. 2B, FIG. 3A, and FIG. 3G, the first signal line layer in some embodiments includes a node connecting line Cln, a plurality of second voltage supply lines Vdd2, a first connecting line Cl1, a second connecting line Cl2, a relay electrode RE, and a data signal connecting pad DCP. In some embodiments, the first signal line layer further includes a plurality of third reset signal lines Vint3 and a plurality of fourth reset signal lines Vint4.

The node connecting line Cln connects the first capacitor electrode Ce1 and the second electrode of the third transistor T3 in a respective pixel driving circuit together. The data signal connecting pad DCP is configured to connect a respective data line of the plurality of data lines to a first electrode of the second transistor T2. The relay electrode RE connects the fourth node N4 and an anode contact pad together. The relay electrode is connected to second electrodes of the fifth transistor T5 and the sixth transistor T6. The anode contact pad is in the second signal line layer, and is connected to an anode in a respective subpixel.

The plurality of second voltage supply lines Vdd2 are connected to a plurality of first voltage supply lines in the second signal line layer, and are connected to the second capacitor electrode Ce2 of the storage capacitor in the second conductive layer. Second capacitor electrodes in a same row are interconnected as parts of a unitary structure. The plurality of unitary structures of second capacitor electrodes in a plurality of rows, the plurality of second voltage supply lines Vdd2, and the plurality of first voltage supply lines form an interconnected voltage signal network. A respective second voltage supply line of the plurality of second voltage supply lines Vdd2 is connected to a first electrode of the fourth transistor T4, and connected to the second capacitor electrode Ce2 of the storage capacitor Cst. Optionally, the plurality of second voltage supply lines Vdd2 extend along a direction substantially parallel to a second direction DR2; the plurality of first voltage supply lines extend along a direction substantially parallel to the second direction DR2. Optionally, the unitary structure comprising interconnected second capacitor electrodes in a same row extend along a direction substantially parallel to a first direction DR1. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

The first connecting line Cl1 connects a first electrode of the first transistor T1 to a first reset signal line of the plurality of first reset signal lines Vint1. In a pixel driving circuit having a respective third reset signal line of the plurality of third reset signal lines Vint3, the first connecting line Cl1 is absent; and the respective third reset signal line of the plurality of third reset signal lines Vint3 connects a first electrode of the first transistor T1 to a first reset signal line of the plurality of first reset signal lines Vint1. In the pixel driving circuit having a respective third reset signal line of the plurality of third reset signal lines Vint3, a portion of the respective third reset signal line may be considered as the first connecting line.

The second connecting line Cl2 connects a first electrode of the sixth transistor T6 to a second reset signal line of the plurality of second reset signal lines Vint2. In a pixel driving circuit having a respective fourth reset signal line of the plurality of fourth reset signal lines Vint4, the second connecting line Cl2 is absent; and the respective fourth reset signal line of the plurality of fourth reset signal lines Vint4 connects a first electrode of the sixth transistor T6 to a second reset signal line of the plurality of second reset signal lines Vint2. In the pixel driving circuit having a respective fourth reset signal line of the plurality of fourth reset signal lines Vint4, a portion of the respective fourth reset signal line may be considered as the second connecting line.

Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the node connecting line Cln, the plurality of second voltage supply lines Vdd2, the first connecting line Cl1, the second connecting line Cl2, the relay electrode RE, the data signal connecting pad DCP, the plurality of third reset signal lines Vint3, and the plurality of fourth reset signal lines Vint4 are in a same layer.

Vias extending through the first planarization layer PLN1 are depicted in FIG. 3H.

Referring to FIG. 2A, FIG. 2B, FIG. 3A, and FIG. 3I, the second signal line layer in some embodiments includes a plurality of first voltage supply lines Vdd1, a plurality of data line DL, and an anode contact pad ACP. The anode contact pad ACP is electrically connected to second electrodes of the fifth transistor T5 and the sixth transistor T6 in the respective pixel driving circuit through a relay electrode. The anode contact pad ACP is electrically connected to an anode in a respective subpixel. The plurality of first voltage supply lines Vdd1 are connected to a plurality of second voltage supply lines in the first signal line layer, as discussed above. A respective data line of the plurality of data lines is electrically connected to a first electrode of the second transistor T2 through a data signal connecting pad.

Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first voltage supply lines Vdd1, the plurality of data line DL, and the anode contact pad ACP are in a same layer.

Vias extending through the second planarization layer PLN2 are depicted in FIG. 3J.

Referring to FIG. 2A, FIG. 2B, FIG. 3A, and FIG. 3K, the array substrate further includes an anode layer ADL. A plurality of subpixel apertures SA respectively corresponding to a plurality of anodes are denoted in FIG. 3M. Vias extending through the second planarization layer PLN2 are depicted in FIG. 3J. A respective anode is connected to a respective anode contact pad through a respective via extending through the second planarization layer PLN2.

Referring to FIG. 2A, FIG. 2B, FIG. 3A, and FIG. 3L, the array substrate further includes a pixel definition layer PDL defining a plurality of subpixel apertures SA.

Figure 5A:
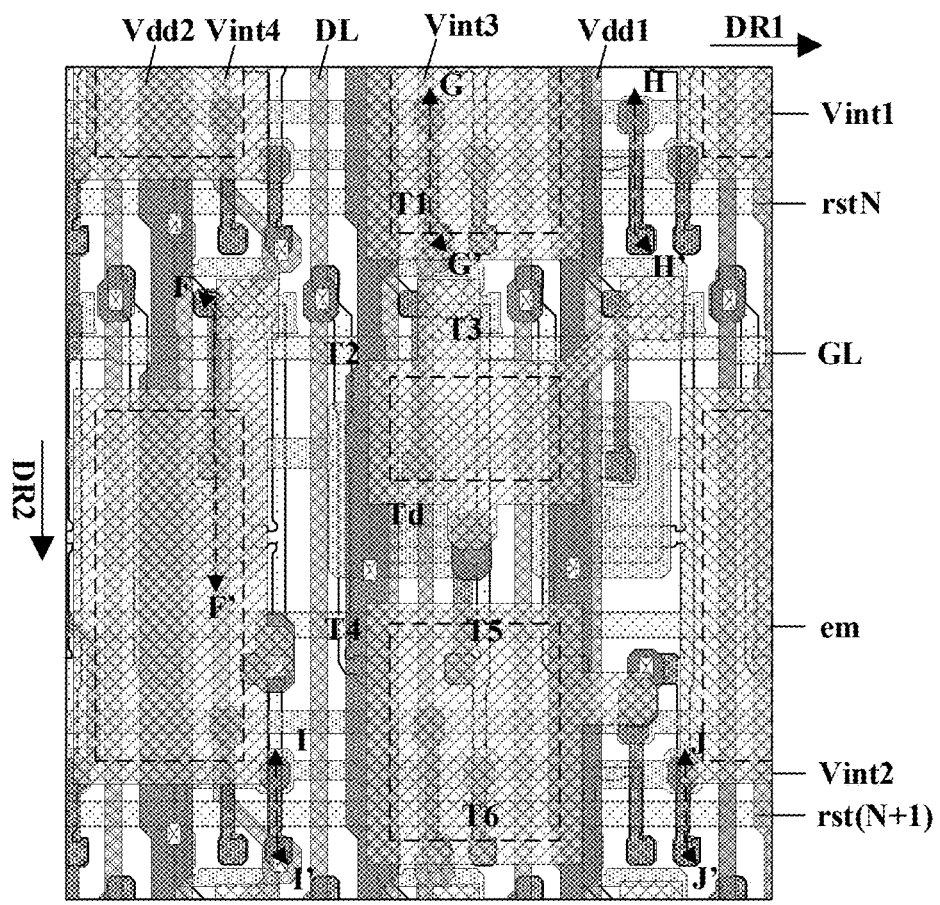
FIG. 5A is a diagram illustrating the structure of an array substrate in some embodiments according to the present disclosure.
Figure 5B:
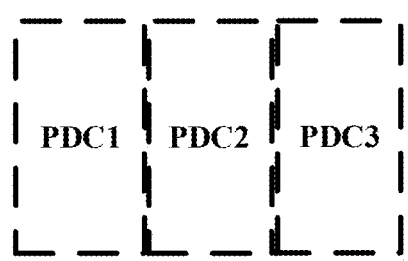
FIG. 5B is a schematic diagram illustrating an arrangement of a plurality of pixel driving circuits in an array substrate depicted in FIG. 5A.
Figure 5C:
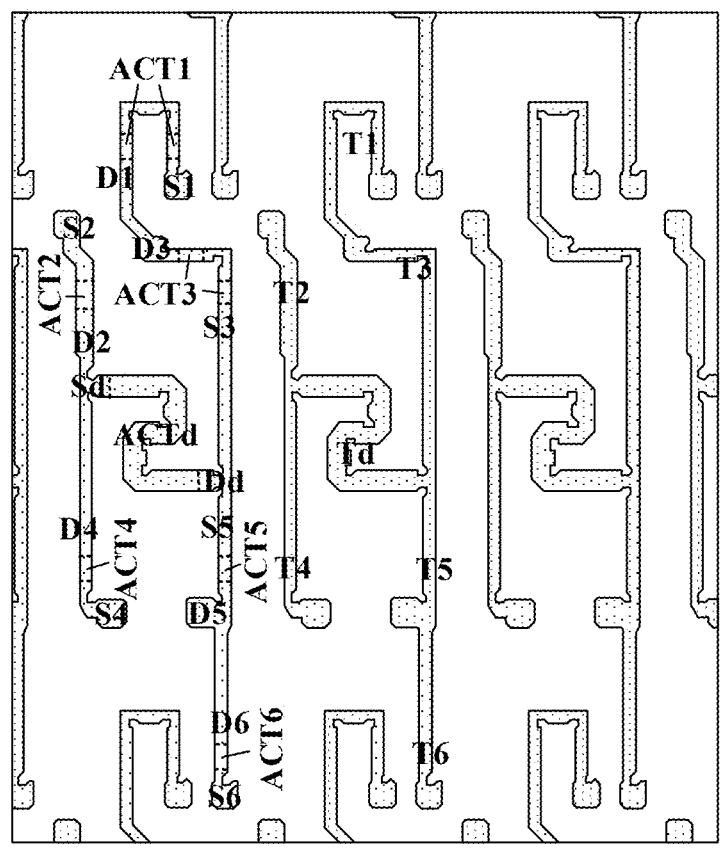
FIG. 5C is a diagram illustrating the structure of a semiconductor material layer in an array substrate depicted in FIG. 5A.
Figure 5D:
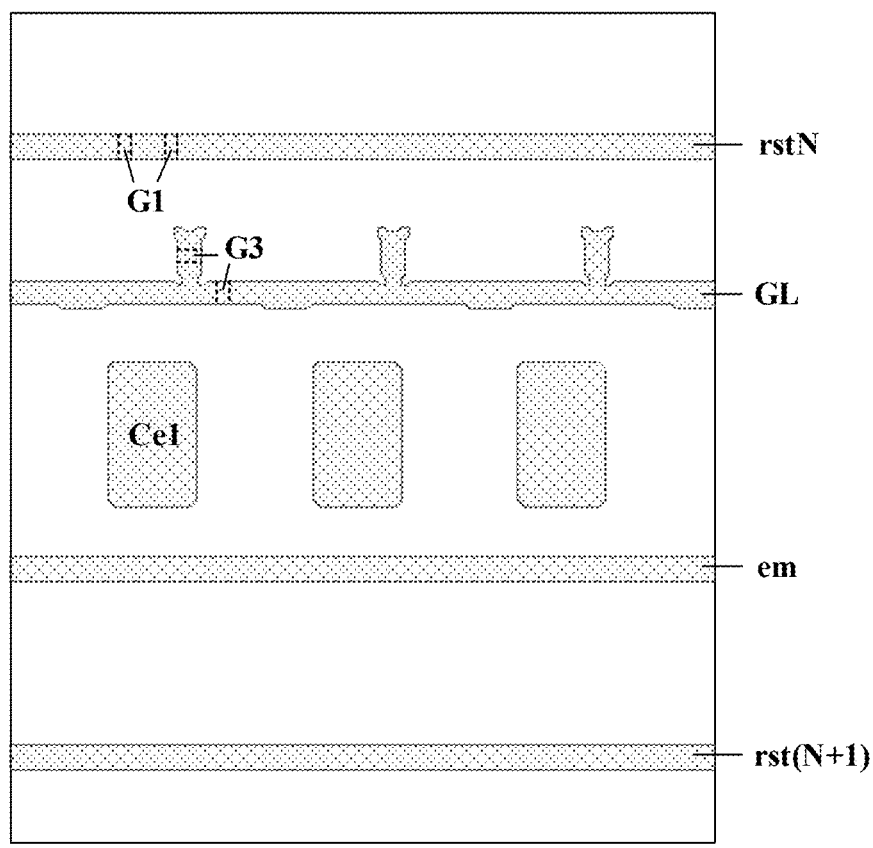
FIG. 5D is a diagram illustrating the structure of a first conductive layer in an array substrate depicted in FIG. 5A.
Figure 5E:
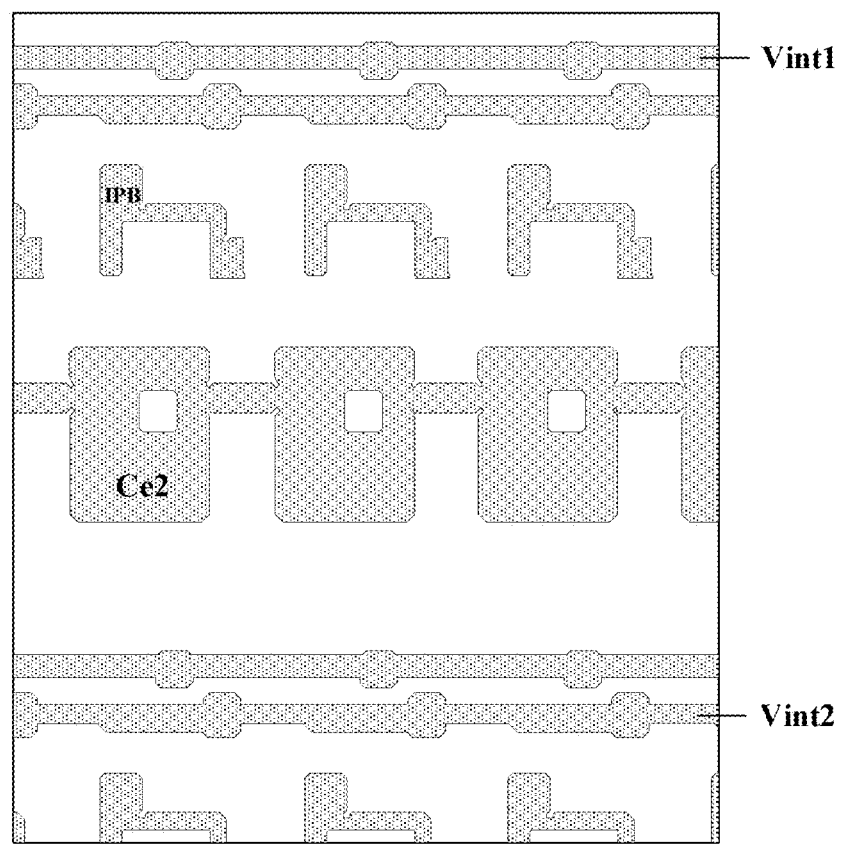
FIG. 5E is a diagram illustrating the structure of a second conductive layer in an array substrate depicted in FIG. 5A.
Figure 5F:
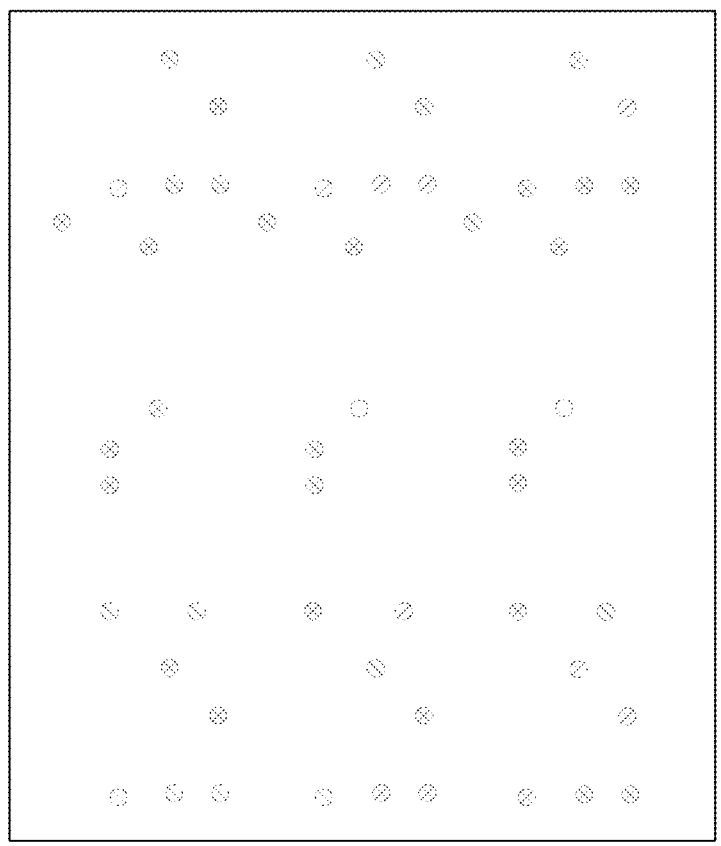
FIG. 5F is a diagram illustrating the structure of an inter-layer dielectric layer in an array substrate depicted in FIG. 5A.
Figure 5G:
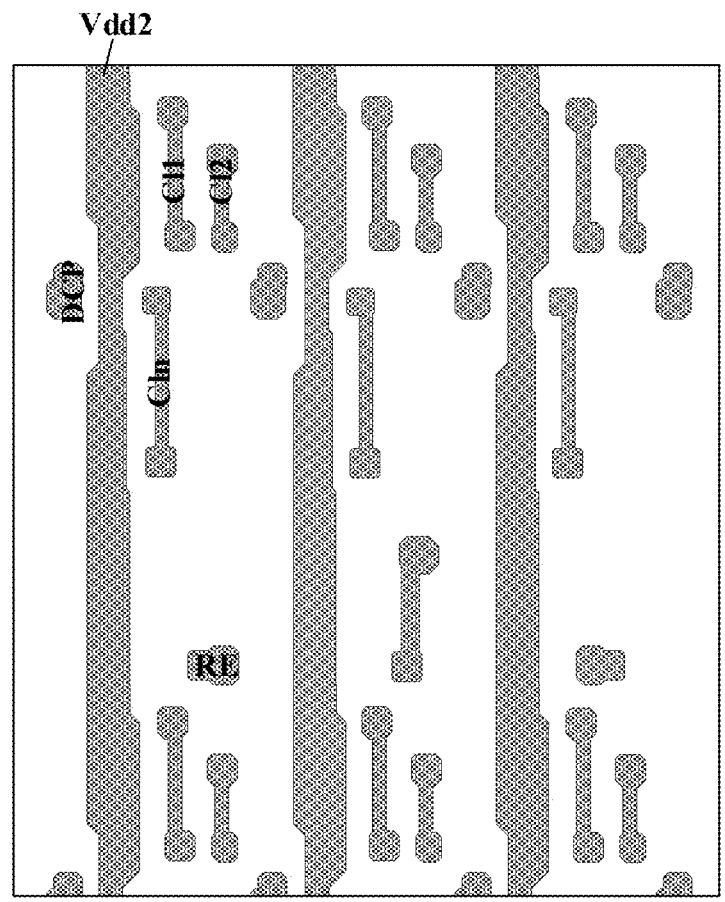
FIG. 5G is a diagram illustrating the structure of a first signal line layer in an array substrate depicted in FIG. 5A.
Figure 5H:
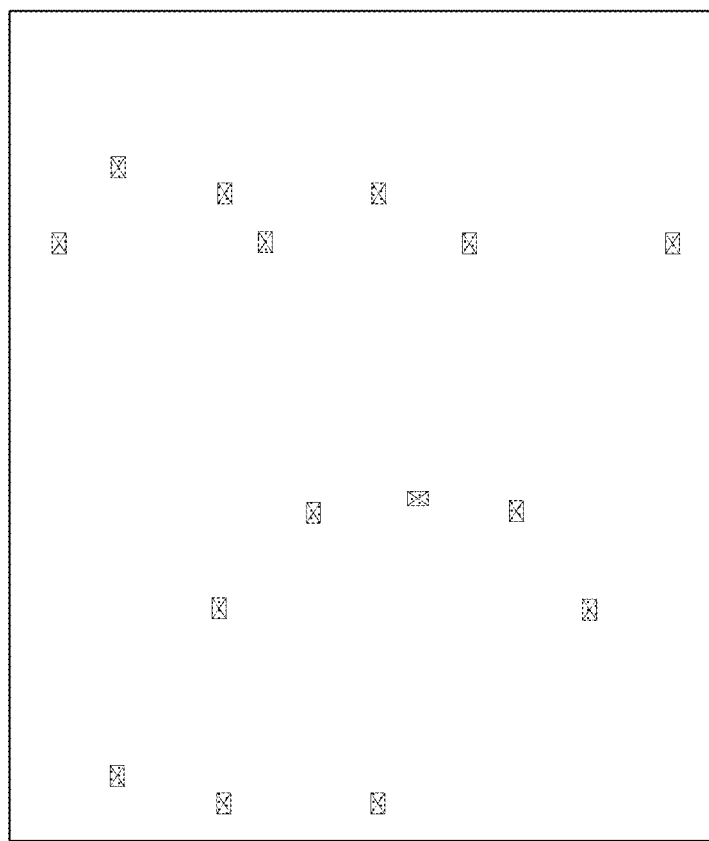
FIG. 5H is a diagram illustrating the structure of a first planarization layer in an array substrate depicted in FIG. 5A.
Figure 5I:
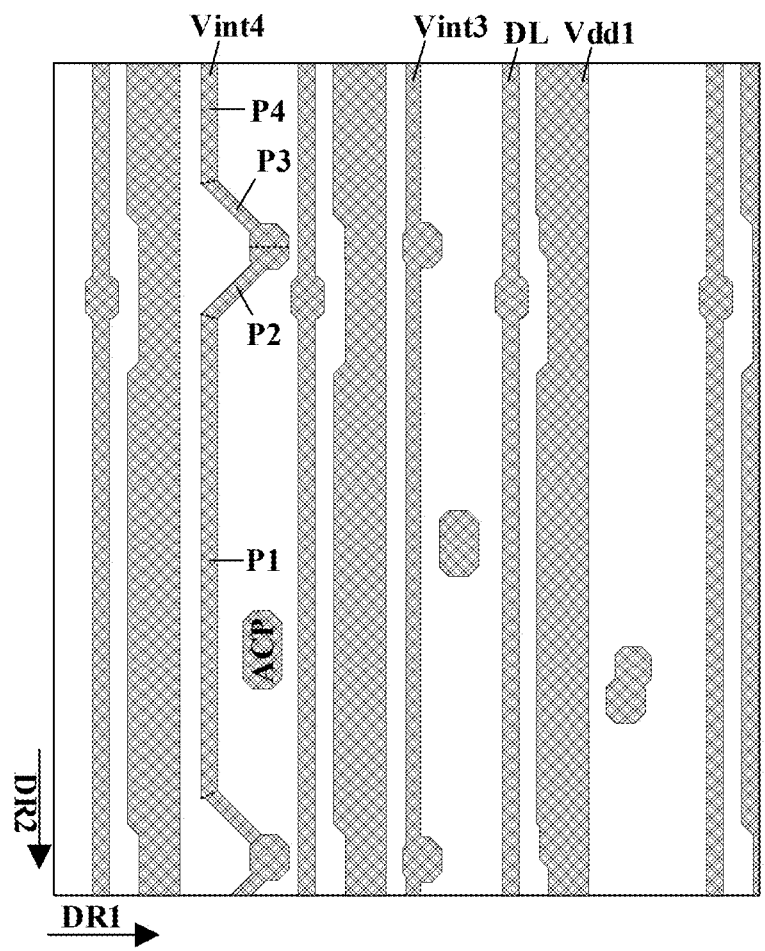
FIG. 5I is a diagram illustrating the structure of a second signal line layer in an array substrate depicted in FIG. 5A.
Figure 5J:
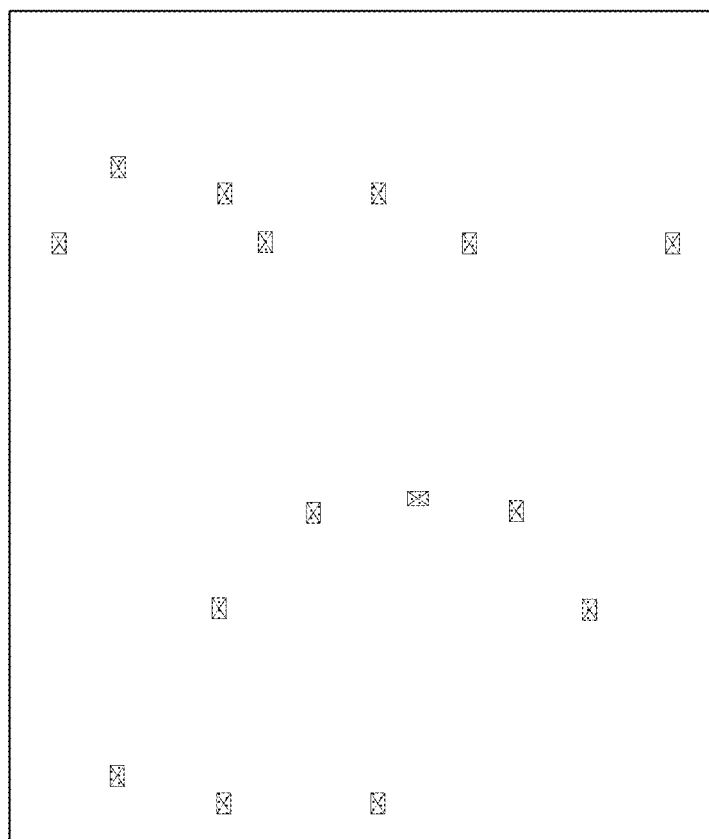
FIG. 5J is a diagram illustrating the structure of a second planarization layer in an array substrate depicted in FIG. 5A.
Figure 5K:
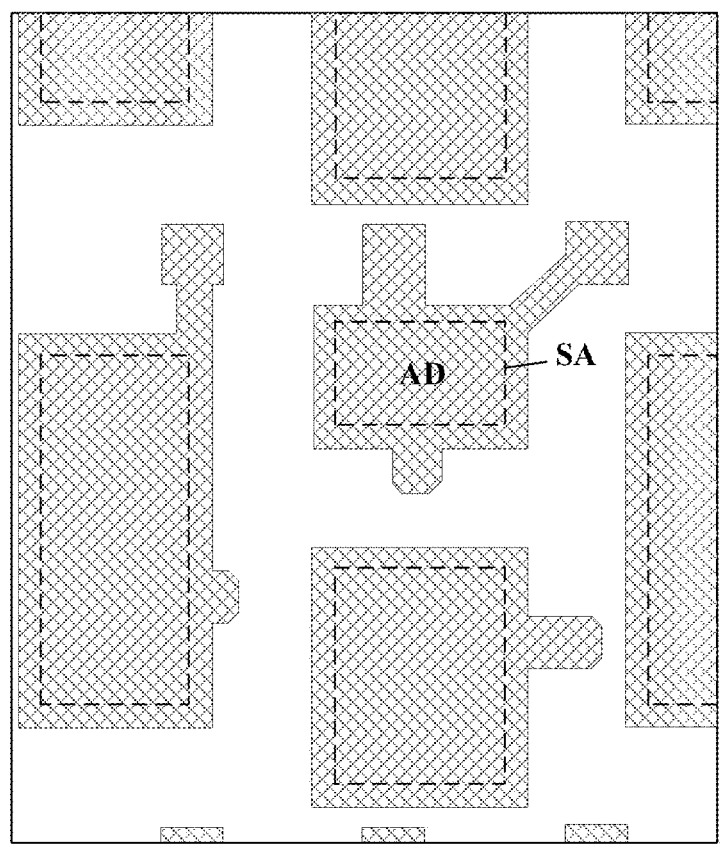
FIG. 5K is a diagram illustrating the structure of an anode layer in an array substrate depicted in FIG. 5A.
Figure 5L:
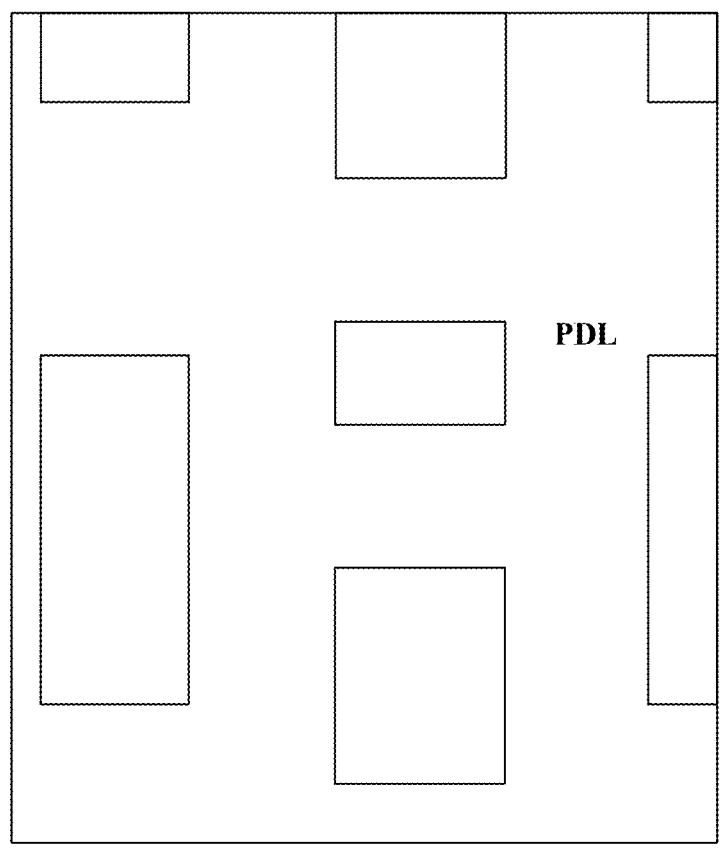
FIG. 5L is a diagram illustrating the structure of a pixel definition layer in an array substrate depicted in FIG. 5A.
Figure 6A:
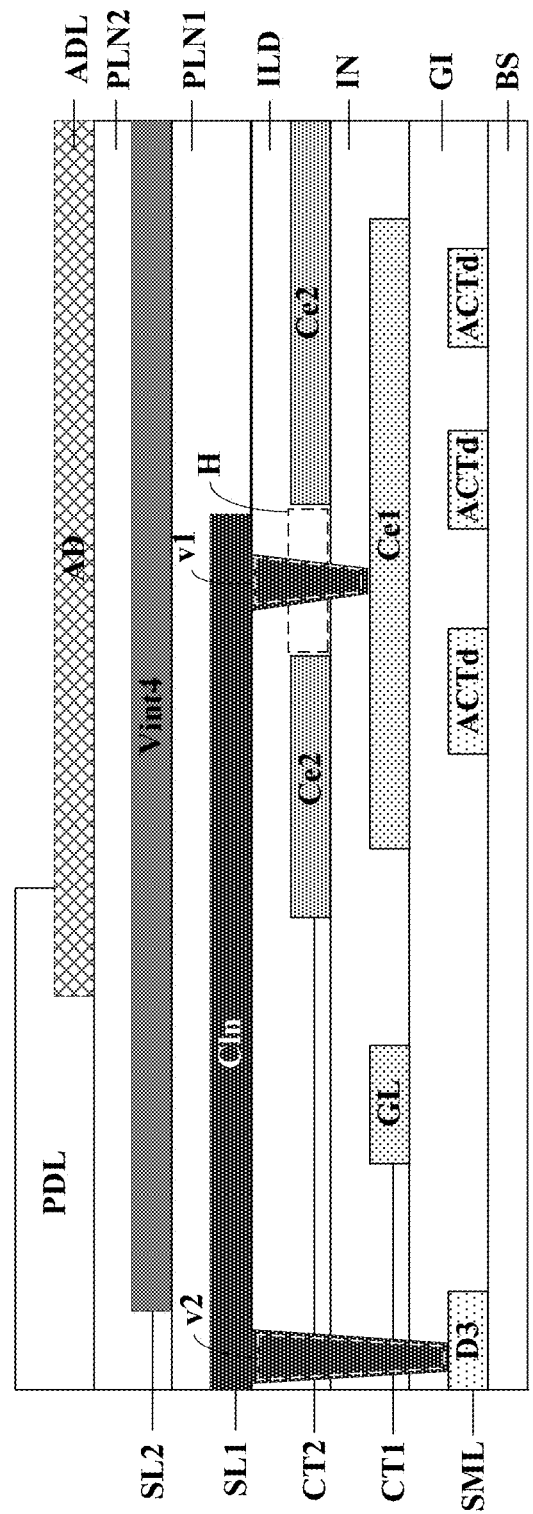
FIG. 6A is a cross-sectional view along an F-F' line in FIG. 5A.
Figure 6B:
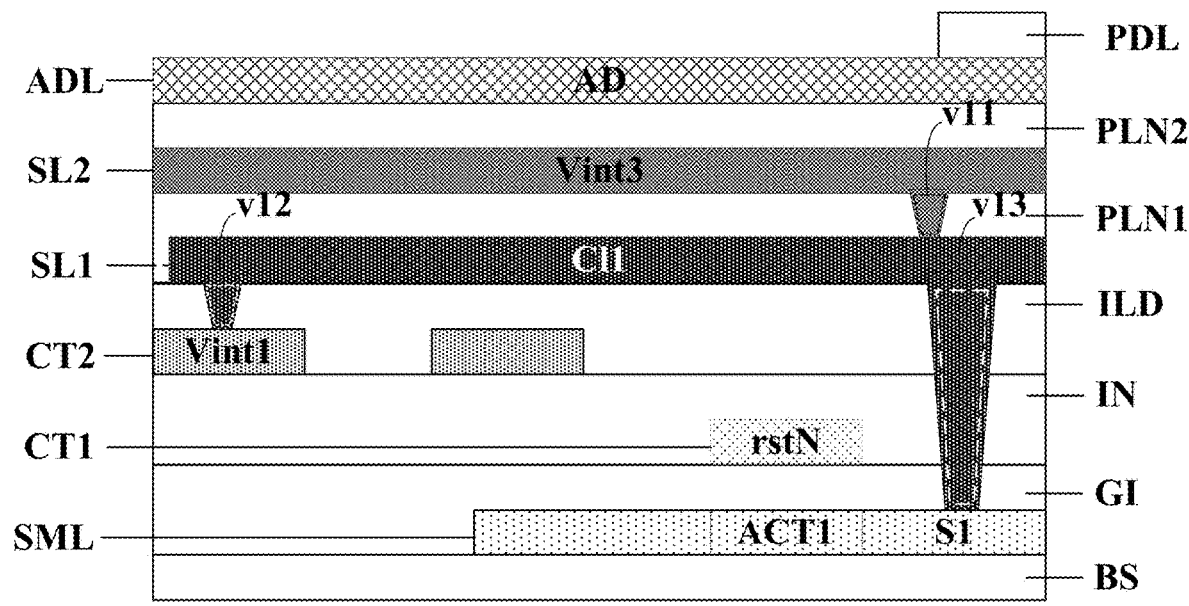
FIG. 6B is a cross-sectional view along a G-G' line in FIG. 5A.
Figure 6C:
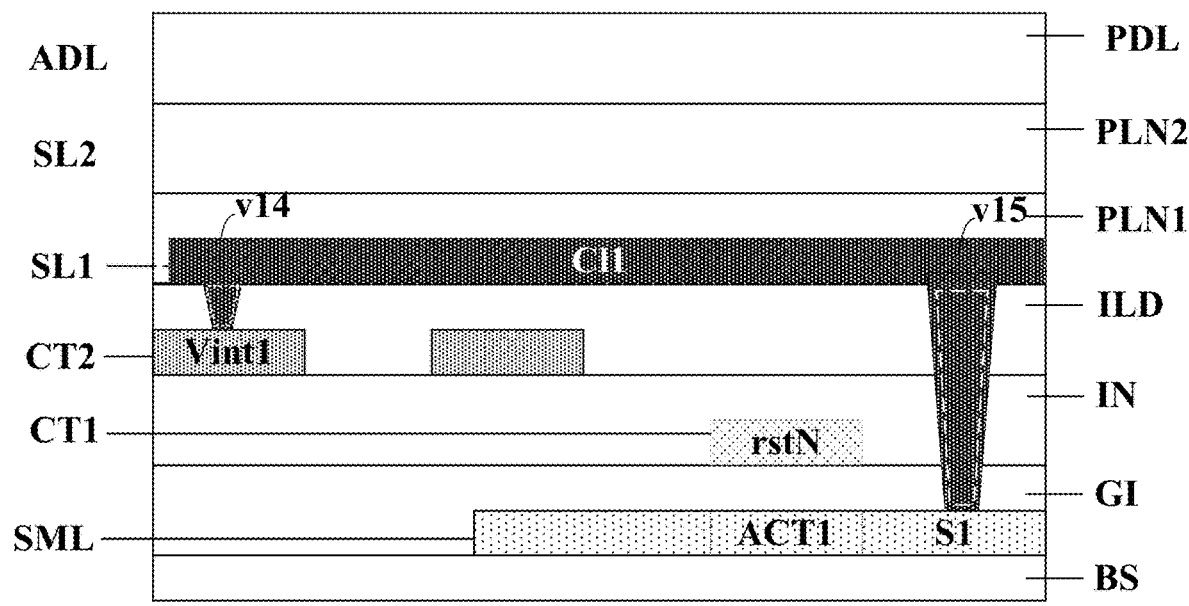
FIG. 6C is a cross-sectional view along an H-H' line in FIG. 5A.
Figure 6D:
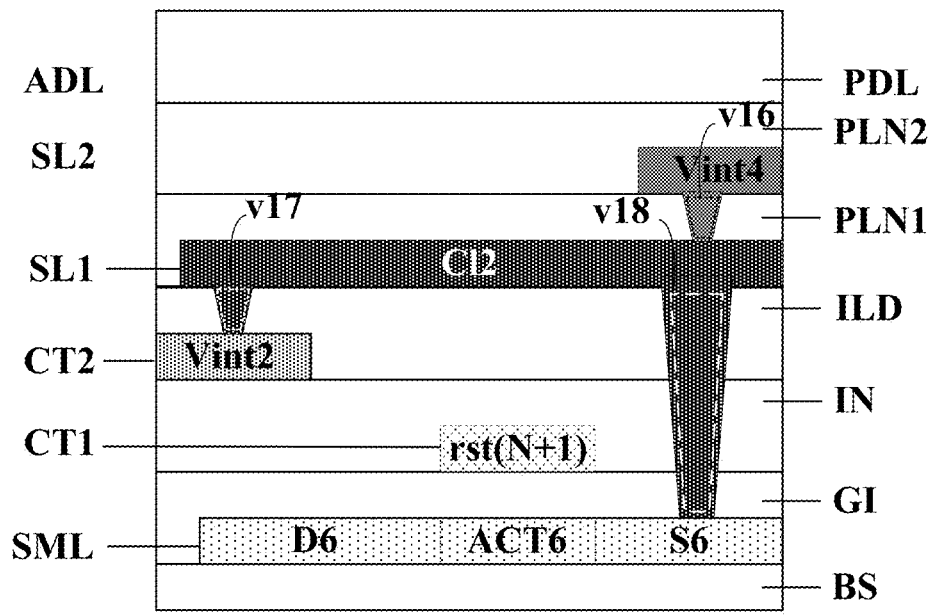
FIG. 6D is a cross-sectional view along an I-I' line in FIG. 5A.
Figure 6E:
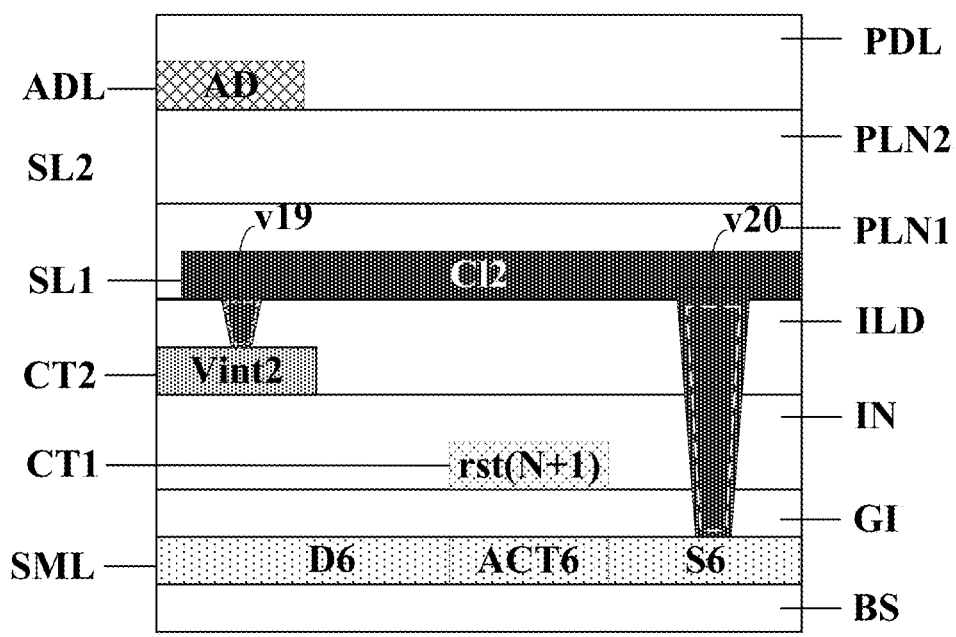
FIG. 6E is a cross-sectional view along a J-J' line in FIG. 5A.

FIG. 5A is a diagram illustrating the structure of an array substrate in some embodiments according to the present disclosure. FIG. 5B is a schematic diagram illustrating an arrangement of a plurality of pixel driving circuits in an array substrate depicted in FIG. 5A. FIG. 5C is a diagram illustrating the structure of a semiconductor material layer in an array substrate depicted in FIG. 5A. FIG. 5D is a diagram illustrating the structure of a first conductive layer in an array substrate depicted in FIG. 5A. FIG. 5E is a diagram illustrating the structure of a second conductive layer in an array substrate depicted in FIG. 5A. FIG. 5F is a diagram illustrating the structure of an inter-layer dielectric layer in an array substrate depicted in FIG. 5A. FIG. 5G is a diagram illustrating the structure of a first signal line layer in an array substrate depicted in FIG. 5A. FIG. 5H is a diagram illustrating the structure of a first planarization layer in an array substrate depicted in FIG. 5A. FIG. 5I is a diagram illustrating the structure of a second signal line layer in an array substrate depicted in FIG. 5A. FIG. 5J is a diagram illustrating the structure of a second planarization layer in an array substrate depicted in FIG. 5A. FIG. 5K is a diagram illustrating the structure of an anode layer in an array substrate depicted in FIG. 5A. FIG. 5L is a diagram illustrating the structure of a pixel definition layer in an array substrate depicted in FIG. 5A. FIG. 6A is a cross-sectional view along an F-F' line in FIG. 5A. FIG. 6B is a cross-sectional view along a G-G' line in FIG. 5A. FIG. 6C is a cross-sectional view along an H-H' line in FIG. 5A. FIG. 6D is a cross-sectional view along an I-I' line in FIG. 5A. FIG. 6E is a cross-sectional view along a J-J' line in FIG. 5A.

The structures of the semiconductor material layer, the first conductive layer, the second conductive layer, and the anode layer as shown in FIG. 5C, FIG. 5D, FIG. 5E, and FIG. 5K are substantially similar to the corresponding structures depicted in FIG. 3C, FIG. 3D, FIG. 3E, and FIG. 3K.

Referring to FIG. 2A, FIG. 2B, FIG. 5A, and FIG. 5G, the first signal line layer in some embodiments does not include a plurality of third reset signal lines Vint3 and a plurality of fourth reset signal lines Vint4. The first signal line layer in some embodiments includes a node connecting line Cln, a plurality of second voltage supply lines Vdd2, a first connecting line Cl1, a second connecting line Cl2, a relay electrode RE, and a data signal connecting pad DCP.

The node connecting line Cln connects the first capacitor electrode Ce1 and the second electrode of the third transistor T3 in a respective pixel driving circuit together. The data signal connecting pad DCP is configured to connect a respective data line of the plurality of data lines to a first electrode of the second transistor T2. The relay electrode RE connects the fourth node N4 and an anode contact pad together. The relay electrode is connected to second electrodes of the fifth transistor T5 and the sixth transistor T6. The anode contact pad is in the second signal line layer, and is connected to an anode in a respective subpixel.

The plurality of second voltage supply lines Vdd2 are connected to a plurality of first voltage supply lines in the second signal line layer, and are connected to the second capacitor electrode Ce2 of the storage capacitor in the second conductive layer. Second capacitor electrodes in a same row are interconnected as parts of a unitary structure. The plurality of unitary structures of second capacitor electrodes in a plurality of rows, the plurality of second voltage supply lines Vdd2, and the plurality of first voltage supply lines form an interconnected reset signal network. A respective second voltage supply line of the plurality of second voltage supply lines Vdd2 is connected to a first electrode of the fourth transistor T4, and connected to the second capacitor electrode Ce2 of the storage capacitor Cst. Optionally, the plurality of second voltage supply lines Vdd2 extend along a direction substantially parallel to a second direction DR2; the plurality of first voltage supply lines extend along a direction substantially parallel to the second direction DR2. Optionally, the unitary structure comprising interconnected second capacitor electrodes in a same row extend along a direction substantially parallel to a first direction DR1.

The first connecting line Cl1 connects a first electrode of the first transistor T1 to a first reset signal line of the plurality of first reset signal lines Vint1. The second connecting line Cl2 connects a first electrode of the sixth transistor T6 to a second reset signal line of the plurality of second reset signal lines Vint2.

Referring to FIG. 2A, FIG. 2B, FIG. 5A, and FIG. 5I, the second signal line layer in some embodiments includes a plurality of first voltage supply lines Vdd1, a plurality of data line DL, and an anode contact pad ACP. The anode contact pad ACP is electrically connected to second electrodes of the fifth transistor T5 and the sixth transistor T6 in the respective pixel driving circuit through a relay electrode. The anode contact pad ACP is electrically connected to an anode in a respective subpixel. The plurality of first voltage supply lines Vdd1 are connected to a plurality of second voltage supply lines in the first signal line layer, as discussed above. A respective data line of the plurality of data lines is electrically connected to a first electrode of the second transistor T2 through a data signal connecting pad. In some embodiments, the second signal line layer further includes a plurality of third reset signal lines Vint3 and a plurality of fourth reset signal lines Vint4.

A respective third reset signal line of the plurality of third reset signal lines Vint3 is connected to the first connecting line in the first signal line layer, the first connecting line connects a first electrode of the first transistor T1 to a first reset signal line of the plurality of first reset signal lines.

A respective fourth reset signal line of the plurality of fourth reset signal lines Vint4 is connected to the second connecting line in the first signal line layer, the second connecting line connects a first electrode of the sixth transistor T6 to a second reset signal line of the plurality of second reset signal lines.

Referring to FIG. 3A, FIG. 3B, FIG. 3G, FIG. 5A, FIG. 5B, and FIG. 5I, the array substrate includes three adjacent columns of pixel driving circuits, e.g., a first column of pixel driving circuits comprising PDC1, a second column of pixel driving circuits comprising PDC2, and a third column of pixel driving circuits comprising PDC3. In some embodiments, a third reset signal line of the plurality of third reset signal lines Vint3 is present in a first column of the three adjacent columns of pixel driving circuits, and the plurality of third reset signal lines Vint3 are absent in a second column and a third column of the three adjacent columns of pixel driving circuits. In some embodiments, a fourth reset signal line of the plurality of fourth reset signal lines Vint4 is present in a second column of the three adjacent columns of pixel driving circuits, and the plurality of fourth reset signal lines Vint4 are absent in a first column and a third column of the three adjacent columns of pixel driving circuits. In some embodiments, the plurality of third reset signal lines Vint3 and the plurality of fourth reset signal lines Vint4 are both absent in a third column of the three adjacent columns of pixel driving circuits.

In some embodiments, the first column of the three adjacent columns of pixel driving circuits is configured to drive light emission of a first column of subpixels of a first color, the second column of the three adjacent columns of pixel driving circuits is configured to drive light emission of a second column of subpixels of a second color, and the third column of the three adjacent columns of pixel driving circuits is configured to drive light emission of a third column of subpixels of a third color. Optionally, the plurality of third reset signal lines Vint3 and the plurality of fourth reset signal lines Vint4 are both absent in the third column of the three adjacent columns of pixel driving circuits. Optionally, the third color is a red color, and the third column of subpixels of the third color is a column of red subpixels. Optionally, the first color and the second color are two different colors selected from a green color and a blue color. In one example, the first color is a green color, the second color is a blue color, and the third color is a red color. In another example, the first color is a blue color, the second color is a green color, and the third color is a red color.

Figure 7A:
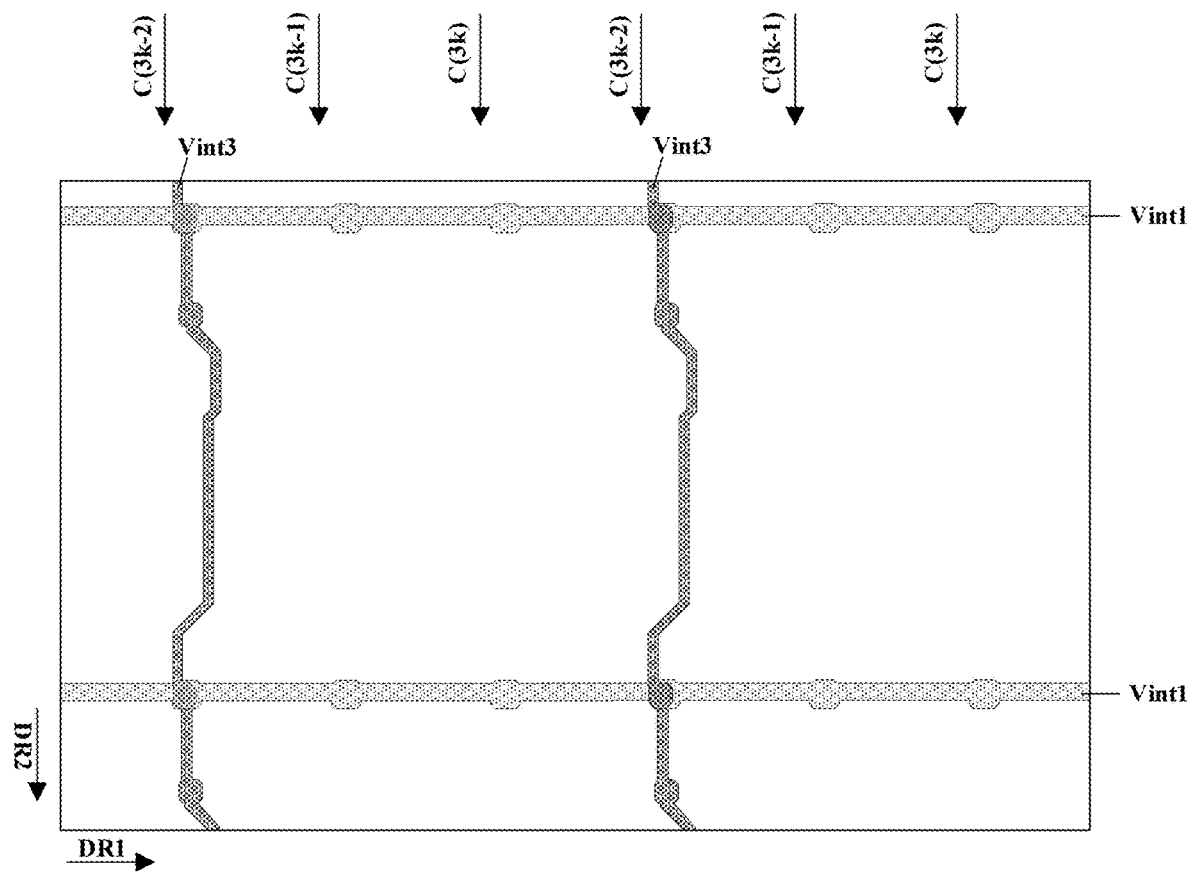
FIG. 7A is a diagram illustrate the structure of a first reset signal network in an array substrate in some embodiments according to the present disclosure.
Figure 7B:
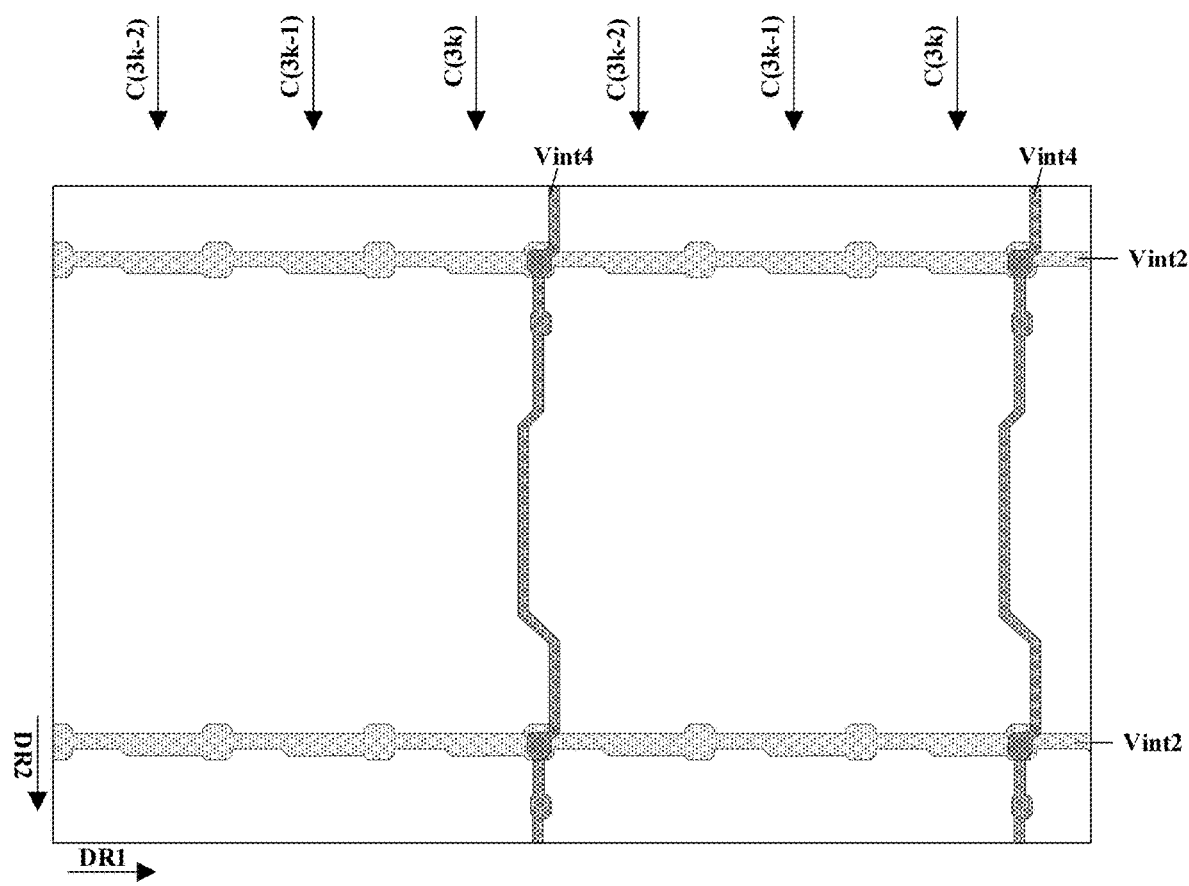
FIG. 7B is a diagram illustrate the structure of a second reset signal network in an array substrate in some embodiments according to the present disclosure.
Figure 7C:
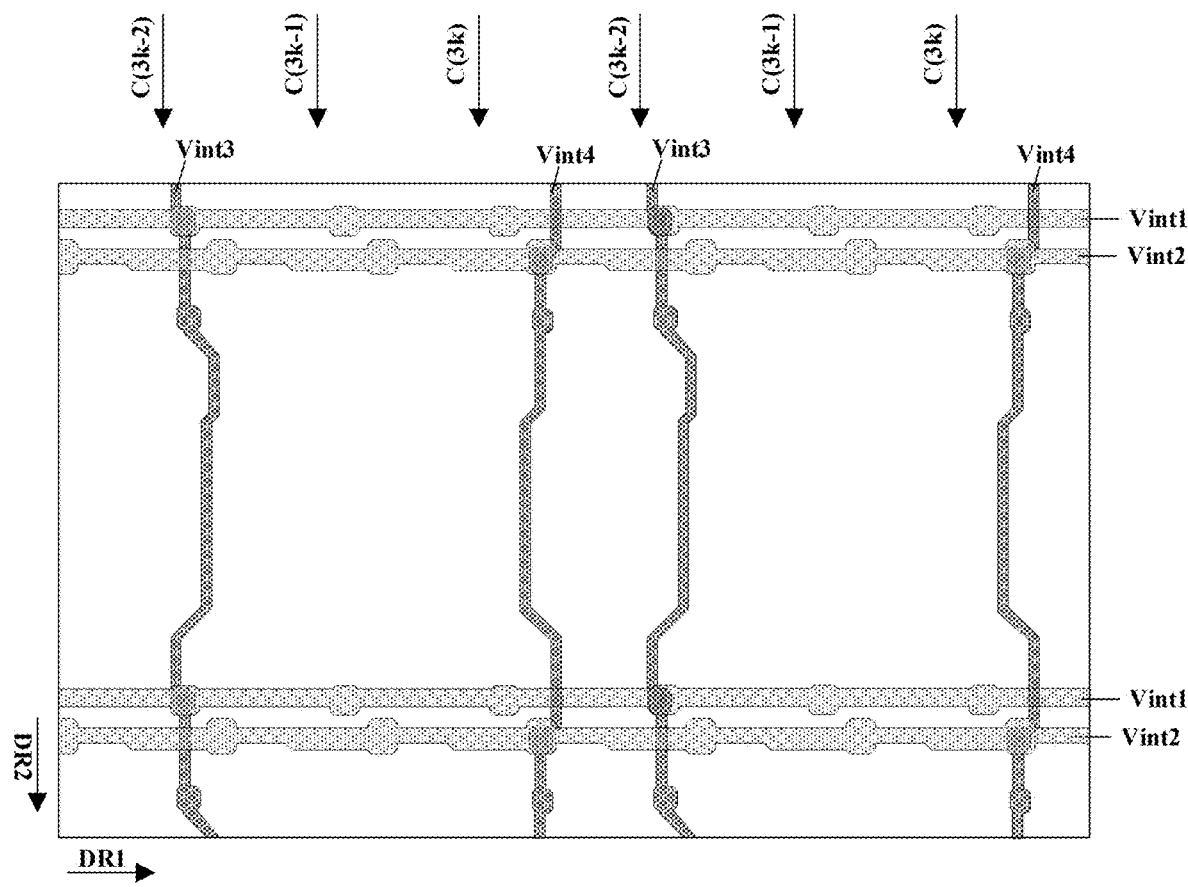
FIG. 7C is a diagram illustrate the structure of a first reset signal network and a second reset signal network in an array substrate in some embodiments according to the present disclosure.
Figure 8A:
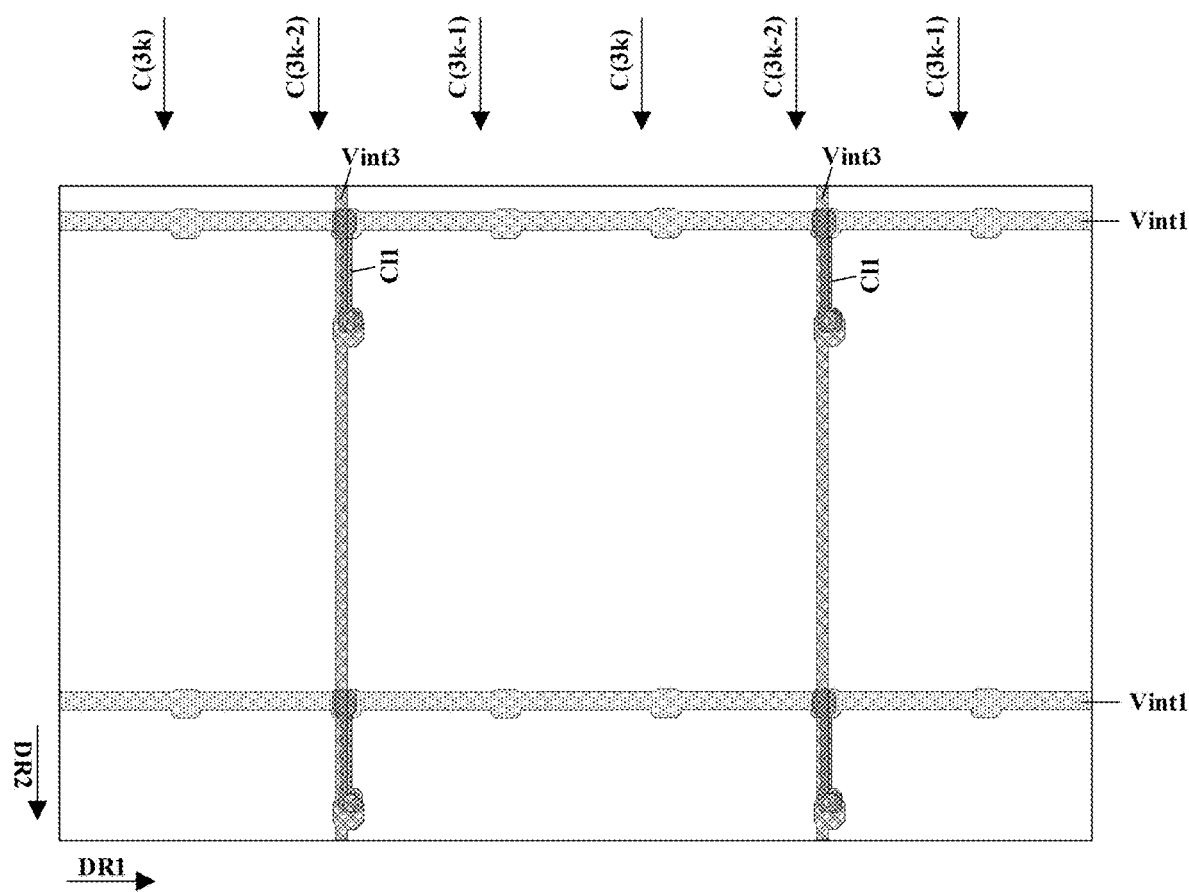
FIG. 8A is a diagram illustrate the structure of a first reset signal network in an array substrate in some embodiments according to the present disclosure.
Figure 8B:
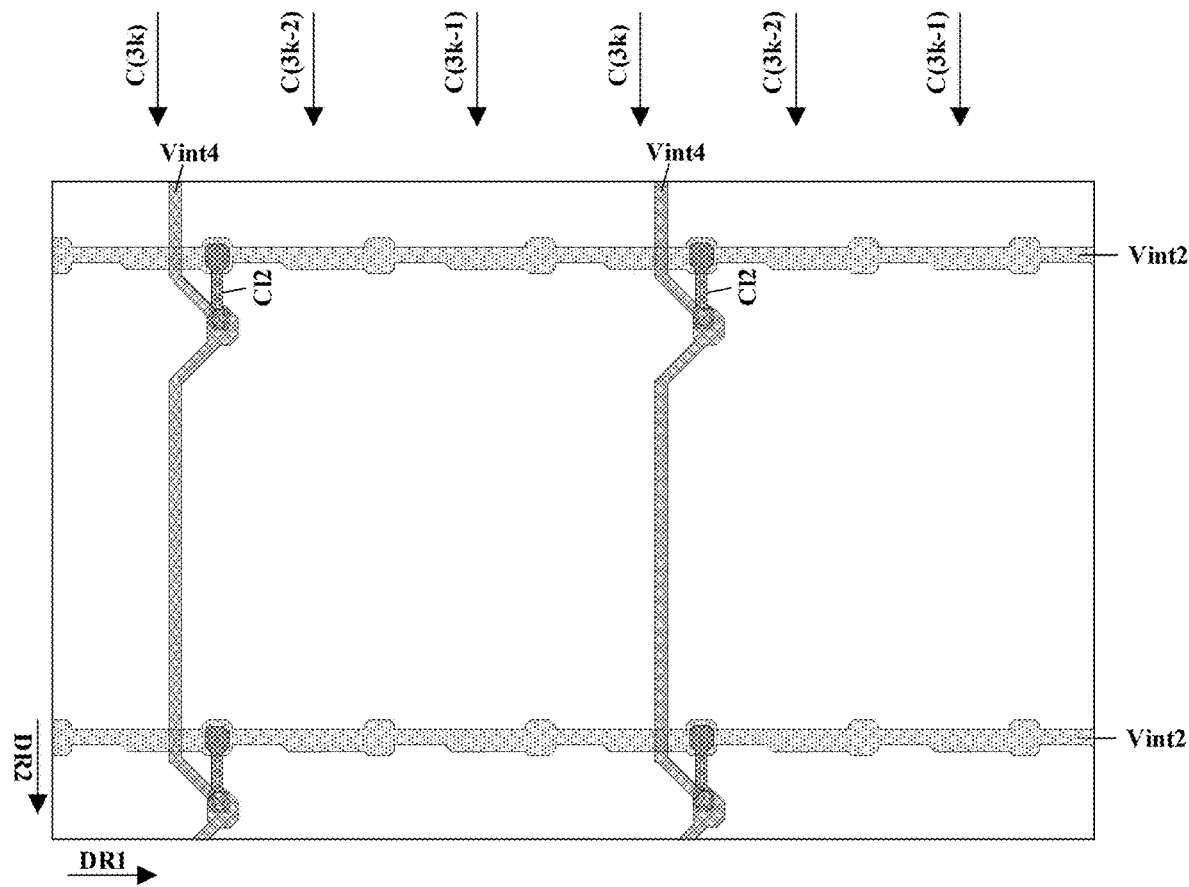
FIG. 8B is a diagram illustrate the structure of a second reset signal network in an array substrate in some embodiments according to the present disclosure.
Figure 8C:
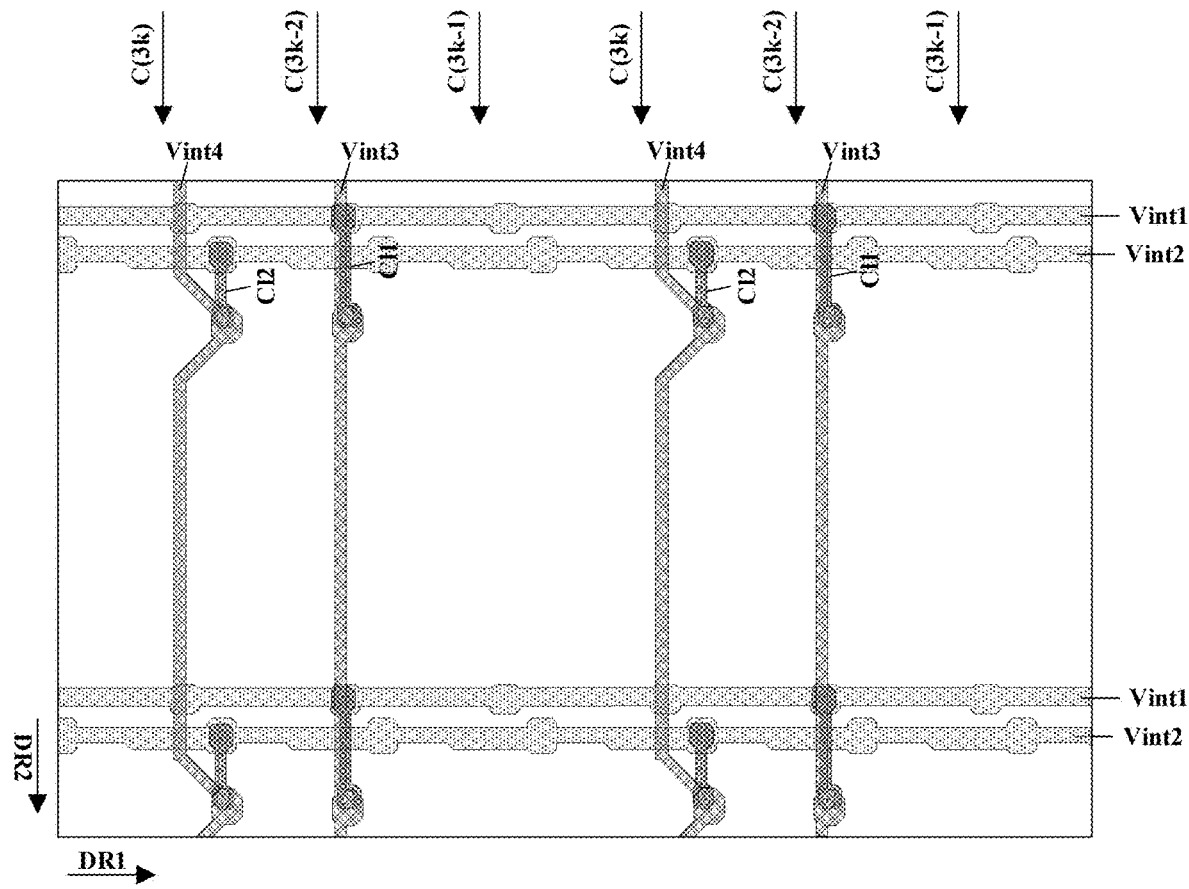
FIG. 8C is a diagram illustrate the structure of a first reset signal network and a second reset signal network in an array substrate in some embodiments according to the present disclosure.

FIG. 7A is a diagram illustrate the structure of a first reset signal network in an array substrate in some embodiments according to the present disclosure. FIG. 7B is a diagram illustrate the structure of a second reset signal network in an array substrate in some embodiments according to the present disclosure. FIG. 7C is a diagram illustrate the structure of a first reset signal network and a second reset signal network in an array substrate in some embodiments according to the present disclosure. FIG. 8A is a diagram illustrate the structure of a first reset signal network in an array substrate in some embodiments according to the present disclosure. FIG. 8B is a diagram illustrate the structure of a second reset signal network in an array substrate in some embodiments according to the present disclosure. FIG. 8C is a diagram illustrate the structure of a first reset signal network and a second reset signal network in an array substrate in some embodiments according to the present disclosure. FIG. 7A to FIG. 7C depict a first reset signal network and a second reset signal network corresponding to those depicted in FIG. 3A. FIG. 8A to FIG. 8C depict a first reset signal network and a second reset signal network corresponding to those depicted in FIG. 5A.

Referring to FIG. 7A to FIG. 7C, and FIG. 8A to FIG. 8C, the first reset signal network in some embodiments includes a plurality of first reset signal lines Vint1 and a plurality of third reset signal lines Vint3 interconnected to each other. Optionally, the plurality of first reset signal lines Vint1 extend along a direction substantially parallel to a first direction DR1. Optionally, the plurality of third reset signal lines Vint3 extend along a direction substantially parallel to a second direction DR2. Optionally, a respective first reset signal line of the plurality of first reset signal lines Vint1 is connected to one or more third reset signal lines of the plurality of third reset signal lines Vint3. Optionally, a respective third reset signal line of the plurality of third reset signal lines Vint3 is connected to one or more first reset signal lines of the plurality of first reset signal lines Vint1.

Referring to FIG. 7A to FIG. 7C, optionally, the plurality of first reset signal lines Vint1 are in the second conductive layer. Optionally, the plurality of third reset signal lines Vint3 are in the first signal line layer.

Referring to FIG. 8A to FIG. 8C, optionally, the plurality of first reset signal lines Vint1 are in the second conductive layer. Optionally, the plurality of third reset signal lines Vint3 are in the second signal line layer.

Referring to FIG. 7A to FIG. 7C, and FIG. 8A to FIG. 8C, the second reset signal network in some embodiments includes a plurality of second reset signal lines Vint2 and a plurality of fourth reset signal lines Vint4 interconnected to each other. Optionally, the plurality of second reset signal lines Vint2 extend along a direction substantially parallel to a first direction DR1. Optionally, the plurality of fourth reset signal lines Vint4 extend along a direction substantially parallel to a second direction DR2. Optionally, a respective second reset signal line of the plurality of second reset signal lines Vint2 is connected to one or more fourth reset signal lines of the plurality of fourth reset signal lines Vint4. Optionally, a respective fourth reset signal line of the plurality of fourth reset signal lines Vint4 is connected to one or more second reset signal lines of the plurality of second reset signal lines Vint2.

Referring to FIG. 7A to FIG. 7C, optionally, the plurality of second reset signal lines Vint2 are in the first signal line layer. Optionally, the plurality of fourth reset signal lines Vint4 are in the first signal line layer.

Referring to FIG. 8A to FIG. 8C, optionally, the plurality of second reset signal lines Vint2 are in the first signal line layer. Optionally, the plurality of fourth reset signal lines Vint4 are in the second signal line layer.

Figure 7D:
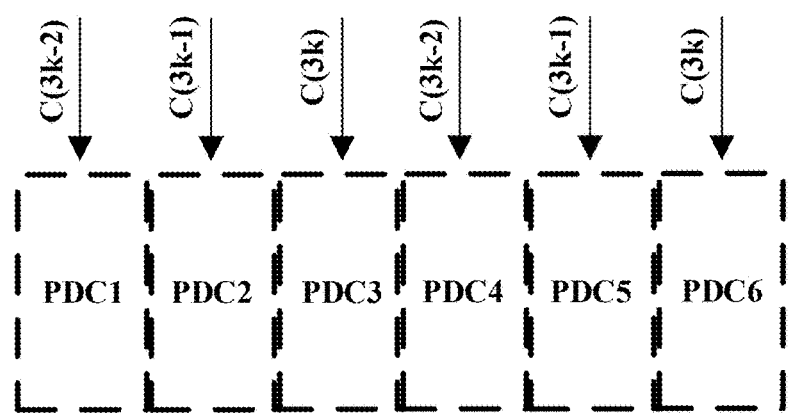
FIG. 7D is a diagram illustrating the structure of an array substrate in some embodiments according to the present disclosure.

FIG. 7D is a diagram illustrating the structure of an array substrate in some embodiments according to the present disclosure. FIG. 7D depicts a portion of the array substrate having six pixel driving circuits, including PDC1, PDC2, PDC3, PDC4, PDC5, and PDC6. The portion of the array substrate depicted in FIG. 7D corresponds to a portion of the array substrate having the first reset signal network and the second reset signal network depicted in FIG. 7A to FIG. 7C.

Figure 8D:
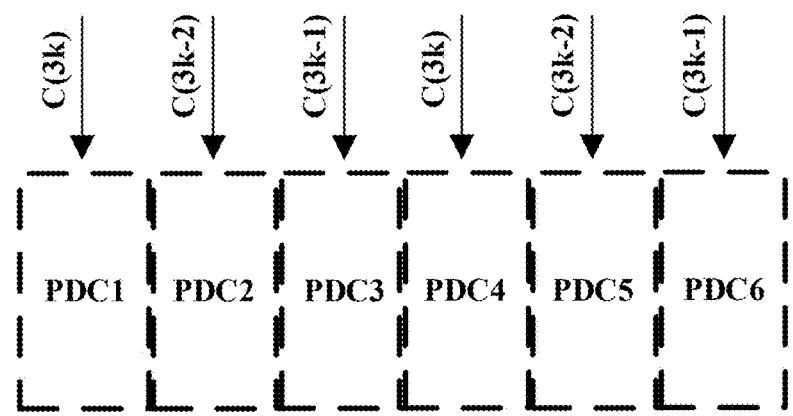
FIG. 8D is a diagram illustrating the structure of an array substrate in some embodiments according to the present disclosure.

FIG. 8D is a diagram illustrating the structure of an array substrate in some embodiments according to the present disclosure. FIG. 8D depicts a portion of the array substrate having six pixel driving circuits, including PDC1, PDC2, PDC3, PDC4, PDC5, and PDC6. The portion of the array substrate depicted in FIG. 8D corresponding to a portion of the array substrate having the first reset signal network and the second reset signal network depicted in FIG. 8A to FIG. 8C.

Referring to FIG. 7A to FIG. 7D, and FIG. 8A to FIG. 8D, in some embodiments, the pixel driving circuits of the array substrate are arranged in columns, a (3k–2)-th column C(3k–2), a (3k–1)-th column C(3k–1), and a (3k)-th column C(3k) of K columns, K and k being positive integers, $1 \le k \le (K/3)$.

As used herein, the terms "(3k–2)-th column", "(3k–1)-th column", and "(3k)-th column" are used in the context of the K columns. The array substrate may or may not include additional column(s) before the first column of the K columns and/or additional columns after the last column of the K columns. In the context of the array substrate, the term "(3k–1)-th column" does not necessarily denote an odd-numbered column, and the term "(3k–2)-th column" or "(3k)-th column does not necessarily denote an even-numbered column. In one example, the (3k–2)-th column is an even-numbered column in the context of the K columns, but may be an odd-numbered column in the context of the array substrate. In another example, the (3k–2)-th column is an even-numbered column in the context of the K columns, and also an even-numbered column in the context of the array substrate. In one example, the (3k–1)-th column is an odd-numbered column in the context of the K columns, but may be an even-numbered column in the context of the array substrate. In another example, the (3k–1)-th column is an odd-numbered column in the context of the K columns, and also an odd-numbered column in the context of the array substrate. In one example, the (3k)-th column is an even-numbered column in the context of the K columns, but may be an odd-numbered column in the context of the array substrate. In another example, the (3k)-th column is an even-numbered column in the context of the K columns, and also an even-numbered column in the context of the array substrate.

In some embodiments, the (3k–2)-th column C(3k–1) includes a (3k–2)-th pixel driving circuit, the (3k–1)-th column C(3k–1) includes a (3k–1)-th pixel driving circuit, and the (3k)-th column C(3k) includes a (3k)-th pixel driving circuit. The (3k–2)-th pixel driving circuit, the (3k–1)-th pixel driving circuit, and the (3k)-th pixel driving circuit are in a same row.

In some embodiments, the (3k–2)-th column C(3k–2) includes a third reset signal line of the plurality of third reset signal lines Vint3; the (3k)-th column C(3k) includes a fourth reset signal line of the plurality of fourth reset signal lines Vint4.

Optionally, the plurality of third reset signal lines Vint3 are absent in the (3k)-th column C(3k) and are absent in the (3k–1)-th column C(3k–1).

Optionally, the plurality of fourth reset signal lines Vint4 are absent in the (3k–2)-th column C(3k–2) and are absent in the (3k–1)-th column C(3k–1).

Optionally, the (3k–1)-th column C(3k–1) is absent of the plurality of third reset signal lines Vint3, and is absent of the plurality of fourth reset signal lines Vint4.

In some embodiments, the (3k–2)-th column C(3k–2) of pixel driving circuits are configured to drive light emission of a (3k–2)-th column C(3k–2) of subpixels of a first color, the (3k)-th column C(3k) of pixel driving circuits are configured to drive light emission of a (3k)-th column C(3k) of subpixels of a second color, and the (3k–1)-th column C(3k–1) of pixel driving circuits are configured to drive light emission of a (3k–1)-th column C(3k–1) of subpixels of a third color. Optionally, the plurality of third reset signal lines Vint3 and the plurality of fourth reset signal lines Vint4 are both absent in the (3k–1)-th column C(3k–1) of pixel driving circuits. Optionally, the third color is a red color, and the (3k–1)-th column C(3k–1) of subpixels of the third color is a column of red subpixels. Optionally, the first color and the second color are two different colors selected from a green color and a blue color. In one example, the first color is a green color, the second color is a blue color, and the third color is a red color. In another example, the first color is a blue color, the second color is a green color, and the third color is a red color.

In some embodiments, referring to FIG. 3G, and FIG. 7A to FIG. 7D, the first connecting line Cl1 is absent in the (3k–2)-th column C(3k–2). In some embodiments, referring to FIG. 3G, FIG. 7A to FIG. 7D, the second connecting line Cl2 is absent in the (3k)-th column C(3k).

In some embodiments, referring to FIG. 5G, FIG. 5I, and FIG. 8A to FIG. 8D, the first reset signal network further includes a first connecting line Cl1 in the (3k–2)-th column C(3k–2). A third reset signal line of the plurality of third reset signal lines Vint3 is connected to the first connecting line Cl1 in the (3k–2)-th column C(3k–2). The first connecting line Cl1 in the (3k–2)-th column C(3k–2) further connects a first electrode of the first transistor T1 in the (3k–2)-th column C(3k–2) to a first reset signal line of the plurality of first reset signal lines Vint1.

In some embodiments, referring to FIG. 5G, FIG. 5I, and FIG. 8A to FIG. 8D, the second reset signal network further includes a second connecting line Cl2 in the (3k)-th column C(3k). A fourth reset signal line of the plurality of fourth reset signal lines is connected to the second connecting line Cl2 in the (3k)-th column C(3k). The second connecting line Cl2 in the (3k)-th column C(3k) further connects a first electrode of the sixth transistor T6 to a second reset signal line of the plurality of second reset signal lines Vint2.

Referring to FIG. 2A, FIG. 2B, FIG. 3A, FIG. 3D, FIG. 3E, FIG. 3G, FIG. 4A, FIG. 5A, FIG. 5D, FIG. 5E, FIG. 5G, and FIG. 6A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as at least one of the plurality of second voltage supply lines Vdd2, the first connecting line Cl1, the second connecting line Cl2, the relay electrode RE, the data signal connecting pad DCP, the plurality of third reset signal lines Vint3, or the plurality of fourth reset signal lines Vint4.

In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and the node connecting line Cln is connected the semiconductor material layer SML through the second via v2. Optionally, the node connecting line Cln is connected to the second electrode D3 of third transistor, as depicted in FIG. 4A and FIG. 6A.

Referring to FIG. 2A, FIG. 2B, FIG. 3A to FIG. 3L, and FIG. 4B, the array substrate in some embodiments further includes a third via v3 and a fourth via v4. The third via v3 extends through the inter-layer dielectric layer ILD. The fourth via v4 extends through the inter-layer dielectric layer ILD, the insulating layer IN, and the gate insulating layer GI. Optionally, a respective third reset signal line of the plurality of third reset signal lines Vint3 is connected to a first reset signal line of the plurality of first reset signal lines Vint1 through the third via v3. Optionally, the respective third reset signal line of the plurality of third reset signal lines Vint3 is connected to a first electrode S1 of the first transistor T1 through the fourth via v4.

Referring to FIG. 2A, FIG. 2B, FIG. 3A to FIG. 3L, and FIG. 4C, the array substrate in some embodiments further includes a fifth via v5 and a sixth via v6. The fifth via v5 extends through the inter-layer dielectric layer ILD. The sixth via v6 extends through the inter-layer dielectric layer ILD, the insulating layer IN, and the gate insulating layer GI. Optionally, a first connecting line Cl1 is connected to a first reset signal line of the plurality of first reset signal lines Vint1 through the fifth via v5. Optionally, the first connecting line Cl1 is connected to a first electrode S1 of the first transistor T1 through the sixth via v6.

Referring to FIG. 2A, FIG. 2B, FIG. 3A to FIG. 3L, and FIG. 4D, the array substrate in some embodiments further includes a seventh via v7 and an eighth via v8. The seventh via v7 extends through the inter-layer dielectric layer ILD. The eighth via v8 extends through the inter-layer dielectric layer ILD, the insulating layer IN, and the gate insulating layer GI. Optionally, a respective fourth reset signal line of the plurality of fourth reset signal lines Vint4 is connected to a second reset signal line of the plurality of second reset signal lines Vint2 through the seventh via v7. Optionally, the respective fourth reset signal line of the plurality of fourth reset signal lines Vint4 is connected to a first electrode S6 of the sixth transistor T6 through the eighth via v8.

Referring to FIG. 2A, FIG. 2B, FIG. 3A to FIG. 3L, and FIG. 4E, the array substrate in some embodiments further includes a ninth via v9 and a tenth via v10. The ninth via v9 extends through the inter-layer dielectric layer ILD. The tenth via v10 extends through the inter-layer dielectric layer ILD, the insulating layer IN, and the gate insulating layer GI. Optionally, a second connecting line Cl2 is connected to a second reset signal line of the plurality of second reset signal lines Vint2 through the ninth via v9. Optionally, the second connecting line Cl2 is connected to a first electrode S6 of the sixth transistor T6 through the tenth via v10.

Referring to FIG. 2A, FIG. 2B, FIG. 5A to FIG. 5L, and FIG. 6B, the array substrate in some embodiments further includes an eleventh via v11, a twelfth via v12, and a thirteenth via v13. The eleventh via v11 extends through the first planarization layer PLN1. The twelfth via v12 extends through the inter-layer dielectric layer ILD. The thirteenth via v13 extends through the inter-layer dielectric layer ILD, the insulating layer IN, and the gate insulating layer GI. Optionally, a respective third reset signal line of the plurality of third reset signal lines Vint3 is connected to a first connecting line Cl1 through the eleventh via v11. Optionally, the first connecting line Cl1 is connected to a first reset signal line of the plurality of first reset signal lines Vint1 through the twelfth via v12. Optionally, the first connecting line Cl1 is connected to a first electrode S1 of the first transistor T1 through the thirteenth via v13.

Referring to FIG. 2A, FIG. 2B, FIG. 5A to FIG. 5L, and FIG. 6C, the array substrate in some embodiments further includes a fourteenth via v14 and a fifteenth via v15. The fourteenth via v14 extends through the inter-layer dielectric layer ILD. The fifteenth via v15 extends through the inter-layer dielectric layer ILD, the insulating layer IN, and the gate insulating layer GI. Optionally, a first connecting line Cl1 is connected to a first reset signal line of the plurality of first reset signal lines Vint1 through the fourteenth via v14. Optionally, the first connecting line Cl1 is connected to a first electrode S1 of the first transistor T1 through the fifteenth via v15.

Referring to FIG. 2A, FIG. 2B, FIG. 5A to FIG. 5L, and FIG. 6D, the array substrate in some embodiments further includes a sixteenth via v16, a seventeenth via v17, and an eighteenth via v18. The sixteenth via v16 extends through the first planarization layer PLN1. The seventeenth via v17 extends through the inter-layer dielectric layer ILD. The eighteenth via v18 extends through the inter-layer dielectric layer ILD, the insulating layer IN, and the gate insulating layer GI. Optionally, a respective fourth reset signal line of the plurality of fourth reset signal lines Vint4 is connected to a second connecting line Cl2 through the sixteenth via v16. Optionally, the second connecting line Cl2 is connected to a second reset signal line of the plurality of second reset signal lines Vint2 through the seventeenth via v17. Optionally, the second connecting line Cl2 is connected to a first electrode S6 of the sixth transistor T6 through the eighteenth via v18.

Referring to FIG. 2A, FIG. 2B, FIG. 5A to FIG. 5L, and FIG. 6E, the array substrate in some embodiments further includes a nineteenth via v19 and a twentieth via v20. The nineteenth via v19 extends through the inter-layer dielectric layer ILD. The twentieth via v20 extends through the inter-layer dielectric layer ILD, the insulating layer IN, and the gate insulating layer GI. Optionally, a second connecting line Cl2 is connected to a second reset signal line of the plurality of second reset signal lines Vint2 through the nineteenth via v19. Optionally, the second connecting line Cl2 is connected to a first electrode S6 of the sixth transistor T6 through the twentieth via v20.

Figure 9:
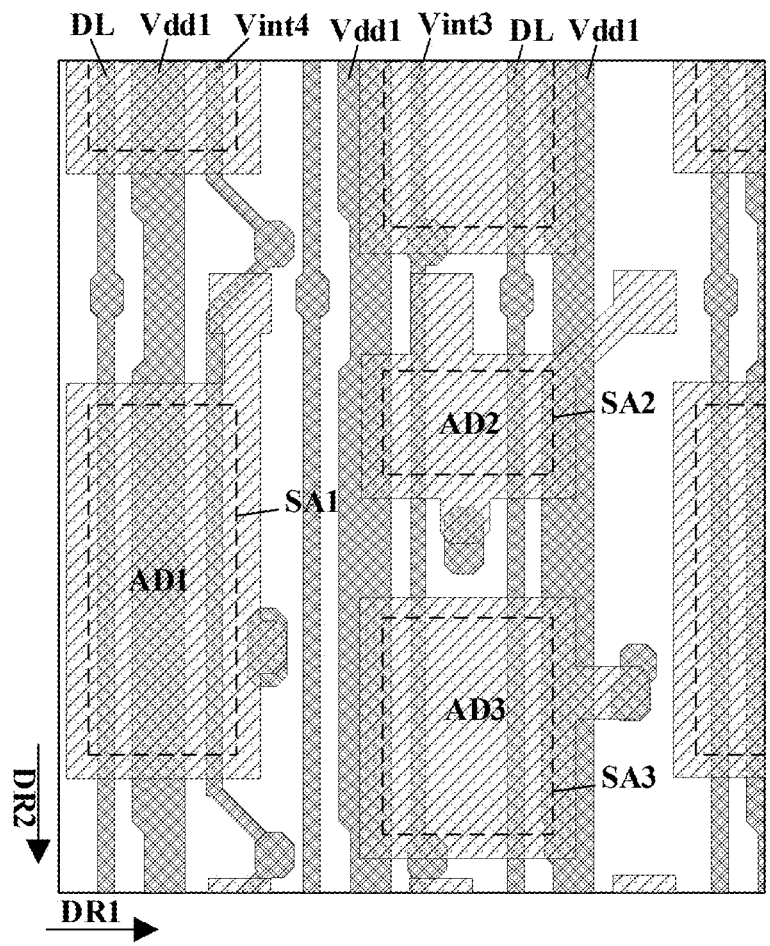
FIG. 9 illustrates a layout of signal lines in a second signal line layer and an anode layer in a portion of an array substrate in some embodiments according to the present disclosure.

FIG. 9 illustrates a layout of signal lines in a second signal line layer and an anode layer in a portion of an array substrate in some embodiments according to the present disclosure. Referring to FIG. 9, in some embodiments, an orthographic projection of an anode on a base substrate at least partially overlaps with an orthographic projection of a reset signal line on the base substrate; at least partially overlaps with an orthographic projection of a first voltage supply line of the plurality of first voltage supply lines Vdd1 on the base substrate; and at least partially overlaps with an orthographic projection of a data line of the plurality of data lines DL on the base substrate.

In some embodiments, the anode layer includes a first anode AD1, a second anode AD2, and a third anode AD3. In one example, the first anode AD1 is an anode of a light emitting element of a first color; the second anode AD2 is an anode of a light emitting element of a second color, and the third anode AD3 is an anode of a light emitting element of a third color. In another example, the first color, the second color, and the third color are three different colors selected from a red color, a green color, and a blue color.

In some embodiments, an orthographic projection of the first anode AD1 on a base substrate at least partially overlaps with an orthographic projection of a fourth reset signal line of the plurality of fourth reset signal lines Vint4 on the base substrate; at least partially overlaps with an orthographic projection of a first voltage supply line of the plurality of first voltage supply lines Vdd1 on the base substrate; and at least partially overlaps with an orthographic projection of a data line of the plurality of data lines DL on the base substrate.

In some embodiments, an orthographic projection of the second anode AD2 on a base substrate at least partially overlaps with an orthographic projection of a third reset signal line of the plurality of third reset signal lines Vint3 on the base substrate; at least partially overlaps with an orthographic projection of two first voltage supply lines of the plurality of first voltage supply lines Vdd1 on the base substrate; and at least partially overlaps with an orthographic projection of a data line of the plurality of data lines DL on the base substrate.

In some embodiments, an orthographic projection of the third anode AD3 on a base substrate at least partially overlaps with an orthographic projection of a third reset signal line of the plurality of third reset signal lines Vint3 on the base substrate; at least partially overlaps with an orthographic projection of two first voltage supply lines of the plurality of first voltage supply lines Vdd1 on the base substrate; and at least partially overlaps with an orthographic projection of a data line of the plurality of data lines DL on the base substrate.

The inventors of the present disclosure discover that a degree of evenness of anodes in a display panel could adversely affect image display. For example, color shift may result from the anodes being tilted. It is discovered in the present disclosure that signal lines underneath the anodes could significantly affect the degree the anodes being tilted. In one example, underneath an anode, at one side a signal line is disposed while the other side is absent of a signal line. This results in an uneven surface of a planarization layer on top of the signal line. The uneven surface of the planarization layer in turn results in the anode on top of the planarization layer being tilted. For example, the presence of a signal line underneath a left side portion of a planarization layer results in an uneven surface of the planarization, which in turn results in an anode on top of the planarization layer being tilted toward the right side. The tilted anode reflects more light toward the right side of the display panel. In the display panel, anodes associated with subpixels of different colors have different tilted angles, thus light reflected by anodes in subpixels of different colors reflect light of different colors respectively at different angles. The accumulated effect of this issue lead to color shift at a large viewing angle.

In the present disclosure, by having the orthographic projection of the anode on the base substrate at least partially overlaps with the orthographic projection of a reset signal line on the base substrate; at least partially overlaps with the orthographic projection of a first voltage supply line of the plurality of first voltage supply lines Vdd1 on the base substrate; and at least partially overlaps with the orthographic projection of a data line of the plurality of data lines DL on the base substrate, the array substrate achieves an even surface of the planarization layer underneath the anodes. As a result, color shift issue can be alleviated.

In some embodiments, a fourth reset signal line of the plurality of fourth reset signal lines Vint4, a first voltage supply line of the plurality of first voltage supply lines Vdd1, and a data line of the plurality of data lines DL cross over the first anode AD1, respectively.

In some embodiments, the fourth reset signal line of the plurality of fourth reset signal lines Vint4, the first voltage supply line of the plurality of first voltage supply lines Vdd1, and the data line of the plurality of data lines DL are substantially evenly distributed along the first direction DR1 with respect to the first anode AD1.

For example, portions of the fourth reset signal line of the plurality of fourth reset signal lines Vint4, the first voltage supply line of the plurality of first voltage supply lines Vdd1, and the data line of the plurality of data lines DL, in a region crossing over the first anode AD1, are equi-spaced.

In another example, portions of the fourth reset signal line of the plurality of fourth reset signal lines Vint4, the first voltage supply line of the plurality of first voltage supply lines Vdd1, and the data line of the plurality of data lines DL, in a region crossing over the first anode AD1, have a substantial (e.g., at least 80%, at least 85%, at least 90%, at least 95%, or at least 99%) mirror symmetry with respect to a plane perpendicular to the first anode AD1 and intersecting the first anode AD1.

In another example, in the region where portions of the fourth reset signal line of the plurality of fourth reset signal lines Vint4, the first voltage supply line of the plurality of first voltage supply lines Vdd1, and the data line of the plurality of data lines DL cross over the first anode AD1, the first voltage supply line of the plurality of first voltage supply lines Vdd1 spaces apart the fourth reset signal line of the plurality of fourth reset signal lines Vint4 from the data line of the plurality of data lines DL.

The inventors of the present disclosure discover that, by having the intricate structure of anodes and signal lines according to the present disclosure, an even surface of the planarization layer underneath the first anode AD1 can be achieved. As a result, color shift issue can be alleviated.

In some embodiments, the array substrate includes a first subpixel aperture SA1 extending through the pixel definition layer and exposing a portion of the first anode AD1. In some embodiments, a fourth reset signal line of the plurality of fourth reset signal lines Vint4, a first voltage supply line of the plurality of first voltage supply lines Vdd1, and a data line of the plurality of data lines DL cross over the first subpixel aperture SA1, respectively.

In some embodiments, the fourth reset signal line of the plurality of fourth reset signal lines Vint4, the first voltage supply line of the plurality of first voltage supply lines Vdd1, and the data line of the plurality of data lines DL are substantially evenly distributed along the first direction DR1 with respect to the first subpixel aperture SA1.

For example, portions of the fourth reset signal line of the plurality of fourth reset signal lines Vint4, the first voltage supply line of the plurality of first voltage supply lines Vdd1, and the data line of the plurality of data lines DL, in a region crossing over the first subpixel aperture SA1, are equispaced.

In another example, portions of the fourth reset signal line of the plurality of fourth reset signal lines Vint4, the first voltage supply line of the plurality of first voltage supply lines Vdd1, and the data line of the plurality of data lines DL, in a region crossing over the first subpixel aperture SA1, have a substantial (e.g., at least 80%, at least 85%, at least 90%, at least 95%, or at least 99%) mirror symmetry with respect to a plane perpendicular to the first anode AD1 and intersecting the first subpixel aperture SA1.

In another example, in the region where portions of the fourth reset signal line of the plurality of fourth reset signal lines Vint4, the first voltage supply line of the plurality of first voltage supply lines Vdd1, and the data line of the plurality of data lines DL cross over the first subpixel aperture SA1, the first voltage supply line of the plurality of first voltage supply lines Vdd1 spaces apart the fourth reset signal line of the plurality of fourth reset signal lines Vint4 from the data line of the plurality of data lines DL.

The inventors of the present disclosure discover that, by having the intricate structure of anodes and signal lines according to the present disclosure, an even surface of the planarization layer underneath the first anode AD1 can be achieved. As a result, color shift issue can be alleviated.

In some embodiments, a first adjacent first voltage supply line of the plurality of first voltage supply lines Vdd1, a third reset signal line of the plurality of third reset signal lines Vint3, a data line of the plurality of data lines DL, and a second adjacent first voltage supply line of the plurality of first voltage supply lines Vdd1, cross over the second anode AD2, respectively.

In another example, portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1, in a region crossing over the second anode AD2, have a substantial (e.g., at least 80%, at least 85%, at least 90%, at least 95%, or at least 99%) mirror symmetry with respect to a plane perpendicular to the second anode AD2 and intersecting the second anode AD2.

In another example, in the region where portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1 cross over the second anode AD2, the third reset signal line of the plurality of third reset signal lines Vint3 and the data line of the plurality of data lines DL space apart the first adjacent first voltage supply line of the plurality of first voltage supply lines Vdd1 from the second adjacent first voltage supply line of the plurality of first voltage supply lines Vdd1.

The inventors of the present disclosure discover that, by having the intricate structure of anodes and signal lines according to the present disclosure, an even surface of the planarization layer underneath the second anode AD2 can be achieved. As a result, color shift issue can be alleviated.

In some embodiments, the array substrate includes a second subpixel aperture SA2 extending through the pixel definition layer and exposing a portion of the second anode AD2. In some embodiments, a first adjacent first voltage supply line of the plurality of first voltage supply lines Vdd1, a third reset signal line of the plurality of third reset signal lines Vint3, a data line of the plurality of data lines DL, and a second adjacent first voltage supply line of the plurality of first voltage supply lines Vdd1 cross over the second subpixel aperture SA2, respectively.

In another example, portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1, in a region crossing over the second subpixel aperture SA2, have a substantial (e.g., at least 80%, at least 85%, at least 90%, at least 95%, or at least 99%) mirror symmetry with respect to a plane perpendicular to the second anode AD2 and intersecting the second subpixel aperture SA2.

In another example, in the region where portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1 cross over the second subpixel aperture SA2, the third reset signal line of the plurality of third reset signal lines Vint3 and the data line of the plurality of data lines DL space apart the first adjacent first voltage supply line of the plurality of first voltage supply lines Vdd1 from the second adjacent first voltage supply line of the plurality of first voltage supply lines Vdd1.

The inventors of the present disclosure discover that, by having the intricate structure of anodes and signal lines according to the present disclosure, an even surface of the planarization layer underneath the second anode AD2 can be achieved. As a result, color shift issue can be alleviated.

In some embodiments, a first adjacent first voltage supply line of the plurality of first voltage supply lines Vdd1, a third reset signal line of the plurality of third reset signal lines Vint3, a data line of the plurality of data lines DL, and a second adjacent first voltage supply line of the plurality of first voltage supply lines Vdd1, cross over the third anode AD3, respectively.

In another example, portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1, in a region crossing over the third anode AD3, have a substantial (e.g., at least 80%, at least 85%, at least 90%, at least 95%, or at least 99%) mirror symmetry with respect to a plane perpendicular to the third anode AD3 and intersecting the third anode AD3.

In another example, in the region where portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1 cross over the third anode AD3, the third reset signal line of the plurality of third reset signal lines Vint3 and the data line of the plurality of data lines DL space apart the first adjacent first voltage supply line of the plurality of first voltage supply lines Vdd1 from the second adjacent first voltage supply line of the plurality of first voltage supply lines Vdd1.

The inventors of the present disclosure discover that, by having the intricate structure of anodes and signal lines according to the present disclosure, an even surface of the planarization layer underneath the third anode AD3 can be achieved. As a result, color shift issue can be alleviated.

In some embodiments, the array substrate includes a third subpixel aperture SA3 extending through the pixel definition layer and exposing a portion of the third anode AD3. In some embodiments, a first adjacent first voltage supply line of the plurality of first voltage supply lines Vdd1, a third reset signal line of the plurality of third reset signal lines Vint3, a data line of the plurality of data lines DL, and a second adjacent first voltage supply line of the plurality of first voltage supply lines Vdd1 cross over the third subpixel aperture SA3, respectively.

In another example, portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1, in a region crossing over the third subpixel aperture SA3, have a substantial (e.g., at least 80%, at least 85%, at least 90%, at least 95%, or at least 99%) mirror symmetry with respect to a plane perpendicular to the third anode AD3 and intersecting the third subpixel aperture SA3.

In another example, in the region where portions of the first adjacent first voltage supply line of the plurality of first voltage supply lines Vdd1, the third reset signal line of the plurality of third reset signal lines Vint3, the data line of the plurality of data lines DL, and the second adjacent first voltage supply line of the plurality of first voltage supply lines Vdd1 cross over the third subpixel aperture SA3, the third reset signal line of the plurality of third reset signal lines Vint3 and the data line of the plurality of data lines DL space apart the first adjacent first voltage supply line of the plurality of first voltage supply lines Vdd1 from the second adjacent first voltage supply line of the plurality of first voltage supply lines Vdd1.

The inventors of the present disclosure discover that, by having the intricate structure of anodes and signal lines according to the present disclosure, an even surface of the planarization layer underneath the third anode AD3 can be achieved. As a result, color shift issue can be alleviated.

Figure 10A:
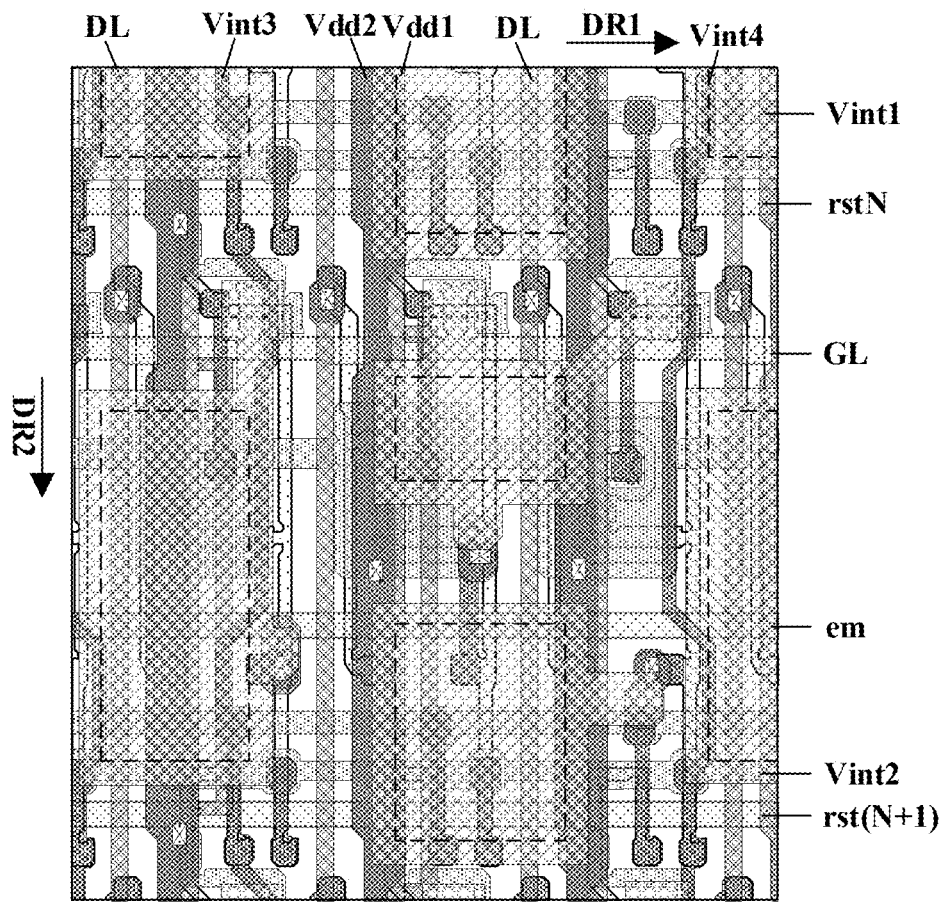
FIG. 10A is a diagram illustrating the structure of an array substrate in some embodiments according to the present disclosure.
Figure 10B:
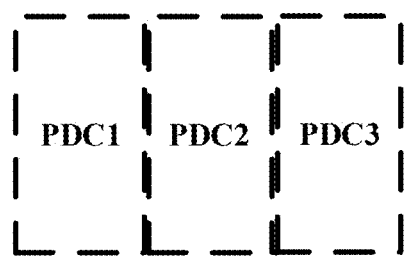
FIG. 10B is a schematic diagram illustrating an arrangement of a plurality of pixel driving circuits in an array substrate depicted in FIG. 10A.
Figure 10C:
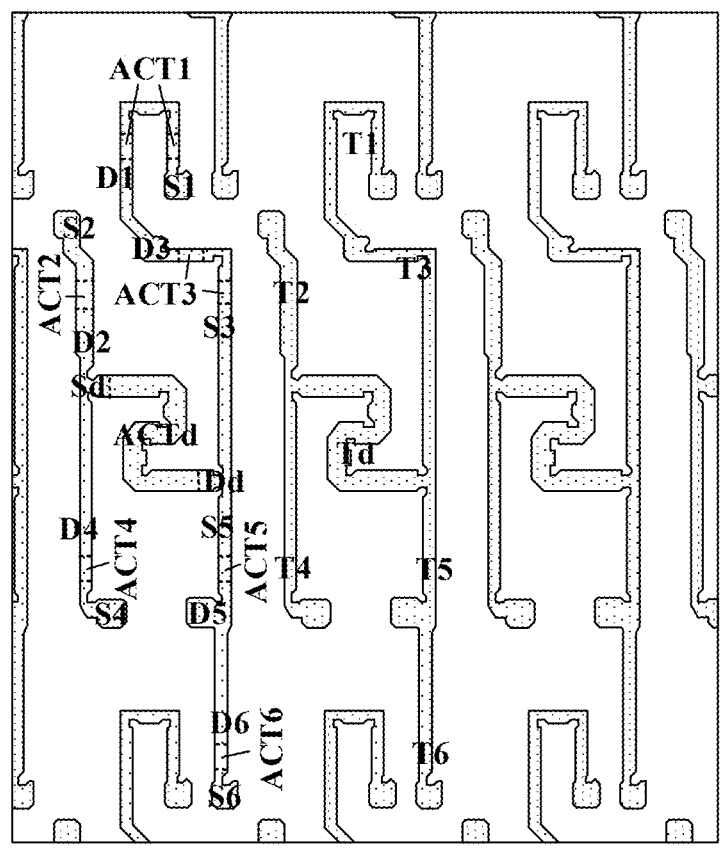
FIG. 10C is a diagram illustrating the structure of a semiconductor material layer in an array substrate depicted in FIG. 10A.
Figure 10D:
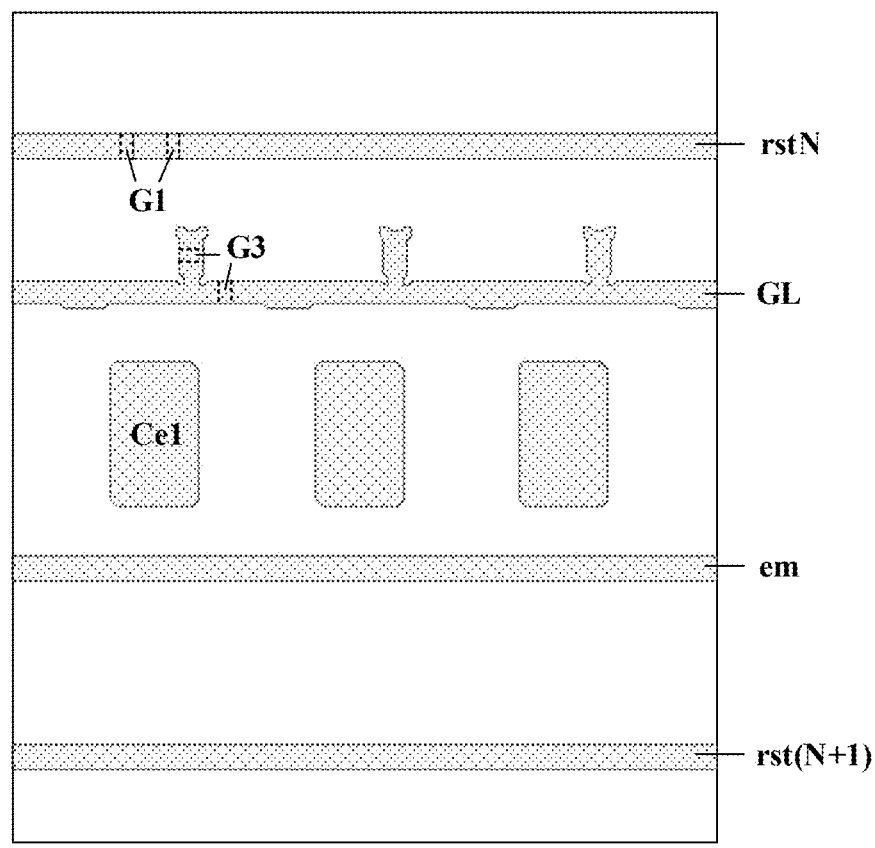
FIG. 10D is a diagram illustrating the structure of a first conductive layer in an array substrate depicted in FIG. 10A.
Figure 10E:
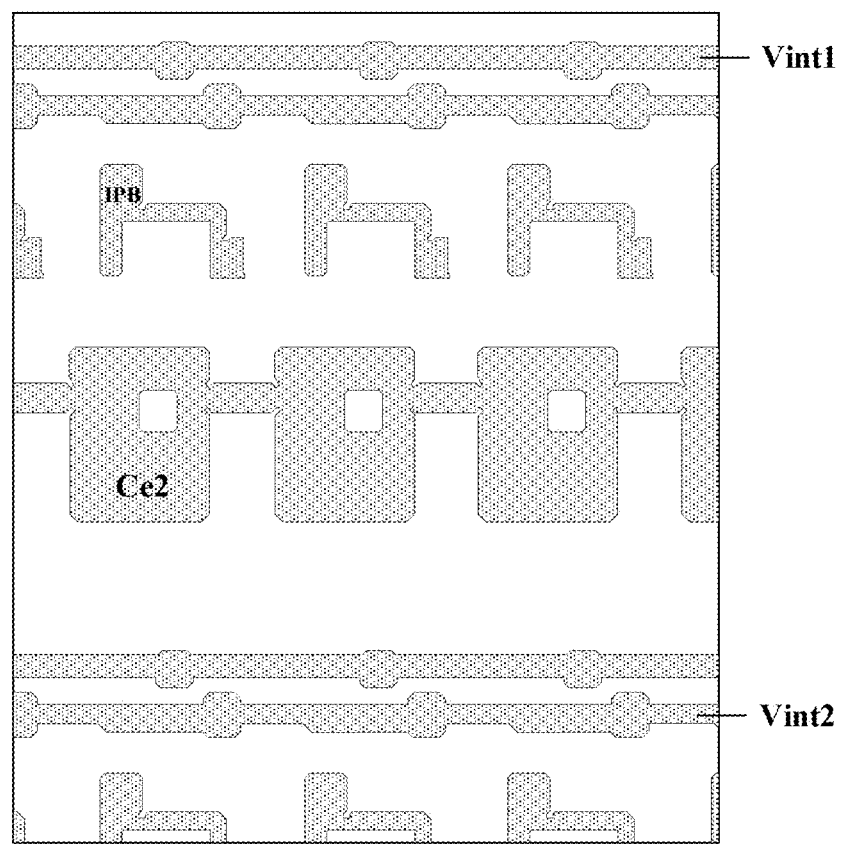
FIG. 10E is a diagram illustrating the structure of a second conductive layer in an array substrate depicted in FIG. 10A.
Figure 10F:
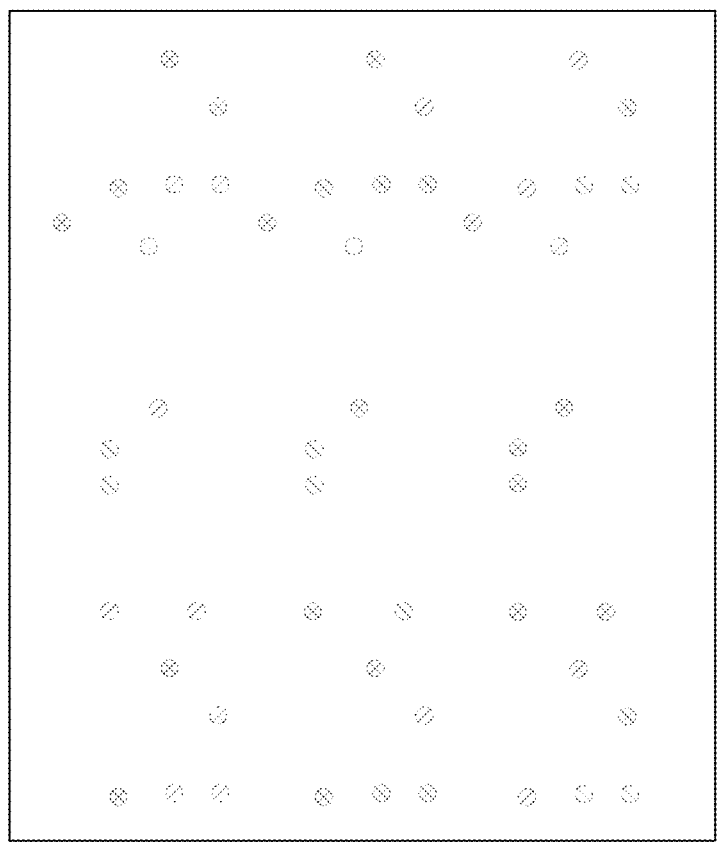
FIG. 10F is a diagram illustrating the structure of an inter-layer dielectric layer in an array substrate depicted in FIG. 10A.
Figure 10G:
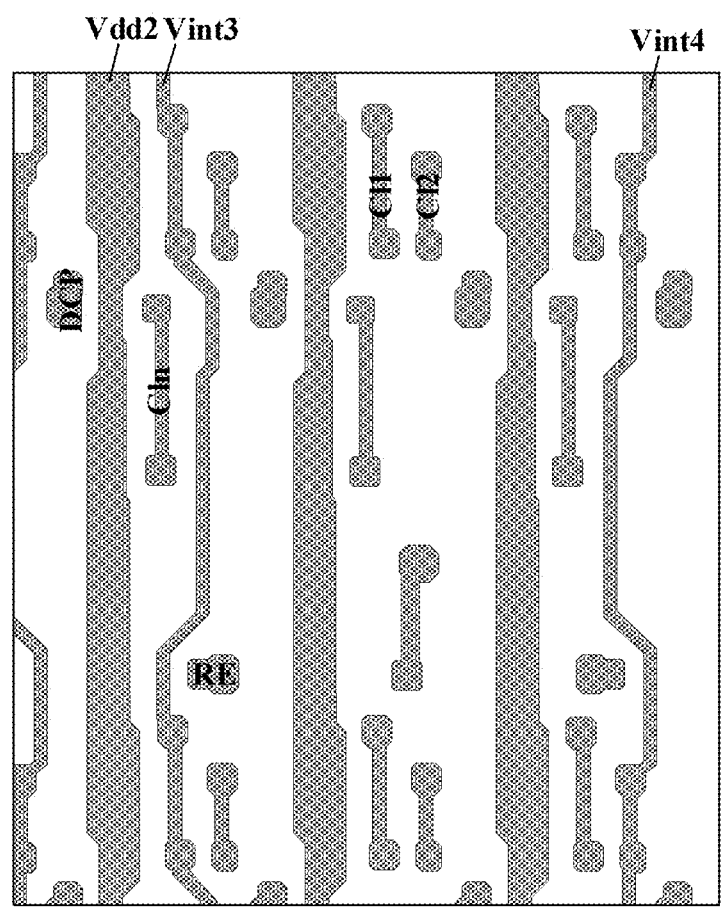
FIG. 10G is a diagram illustrating the structure of a first signal line layer in an array substrate depicted in FIG. 10A.
Figure 10H:
FIG. 10H is a diagram illustrating the structure of a first planarization layer in an array substrate depicted in FIG. 10A.
Figure 10I:
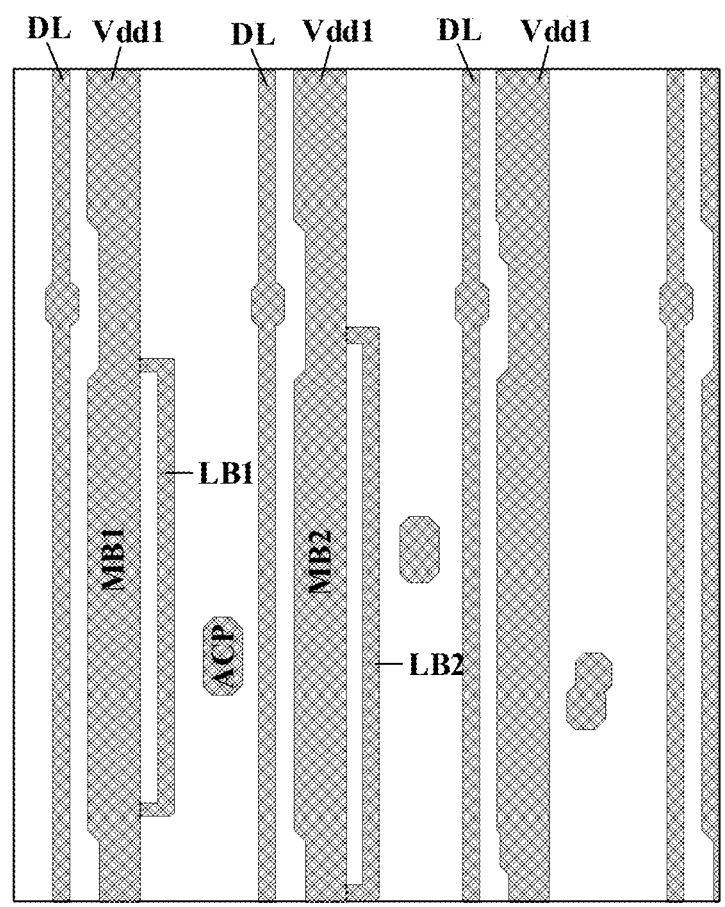
FIG. 10I is a diagram illustrating the structure of a second signal line layer in an array substrate depicted in FIG. 10A.
Figure 10J:
FIG. 10J is a diagram illustrating the structure of a second planarization layer in an array substrate depicted in FIG. 10A.
Figure 10K:
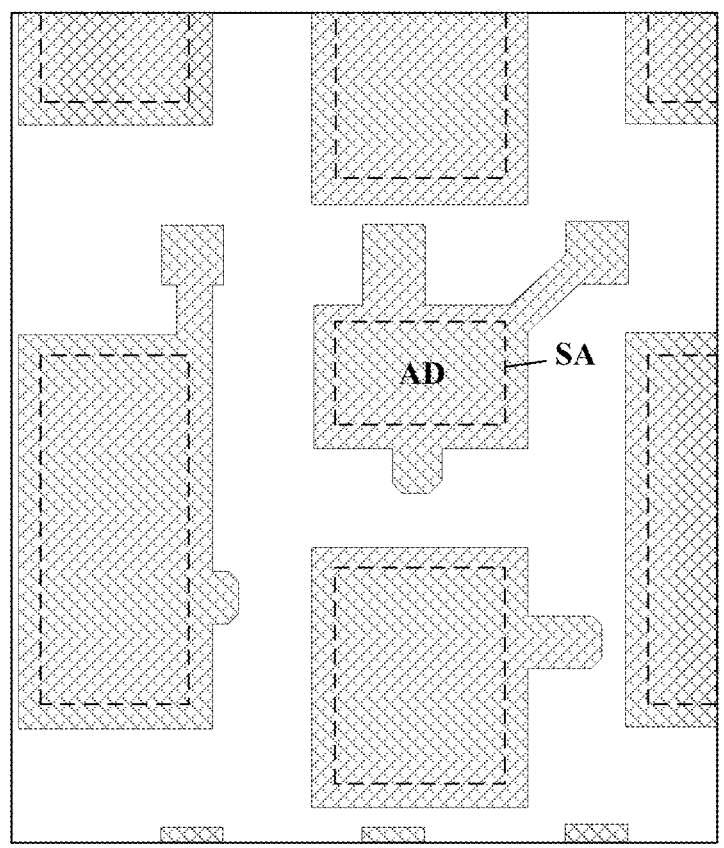
FIG. 10K is a diagram illustrating the structure of an anode layer in an array substrate depicted in FIG. 10A.
Figure 10L:
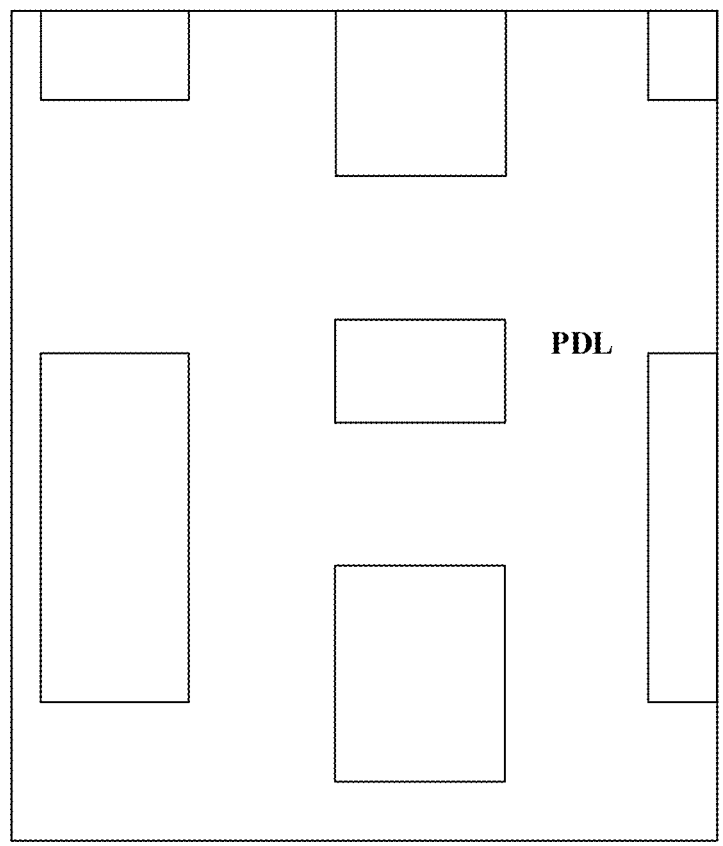
FIG. 10L is a diagram illustrating the structure of a pixel definition layer in an array substrate depicted in FIG. 10A.

FIG. 10A is a diagram illustrating the structure of an array substrate in some embodiments according to the present disclosure. FIG. 10B is a schematic diagram illustrating an arrangement of a plurality of pixel driving circuits in an array substrate depicted in FIG. 10A. FIG. 10C is a diagram illustrating the structure of a semiconductor material layer in an array substrate depicted in FIG. 10A. FIG. 10D is a diagram illustrating the structure of a first conductive layer in an array substrate depicted in FIG. 10A. FIG. 10E is a diagram illustrating the structure of a second conductive layer in an array substrate depicted in FIG. 10A. FIG. 10F is a diagram illustrating the structure of an inter-layer dielectric layer in an array substrate depicted in FIG. 10A. FIG. 10G is a diagram illustrating the structure of a first signal line layer in an array substrate depicted in FIG. 10A. FIG. 10H is a diagram illustrating the structure of a first planarization layer in an array substrate depicted in FIG. 10A. FIG. 10I is a diagram illustrating the structure of a second signal line layer in an array substrate depicted in FIG. 10A. FIG. 10J is a diagram illustrating the structure of a second planarization layer in an array substrate depicted in FIG. 10A. FIG. 10K is a diagram illustrating the structure of an anode layer in an array substrate depicted in FIG. 10A. FIG. 10L is a diagram illustrating the structure of a pixel definition layer in an array substrate depicted in FIG. 10A. Referring to FIG. 10A to FIG. 10L, a first voltage supply line of the plurality of first voltage supply lines Vdd1 in some embodiments includes a branch connected to a main body of the first voltage supply line. In some embodiments, the second signal line layer does not include the plurality of third reset signal lines and the plurality of fourth reset signal lines. The inventors of the present disclosure discover that, by having the first voltage supply line with the branch, an even surface of the planarization layer underneath the anode can be achieved.

Figures 10M, 10N:
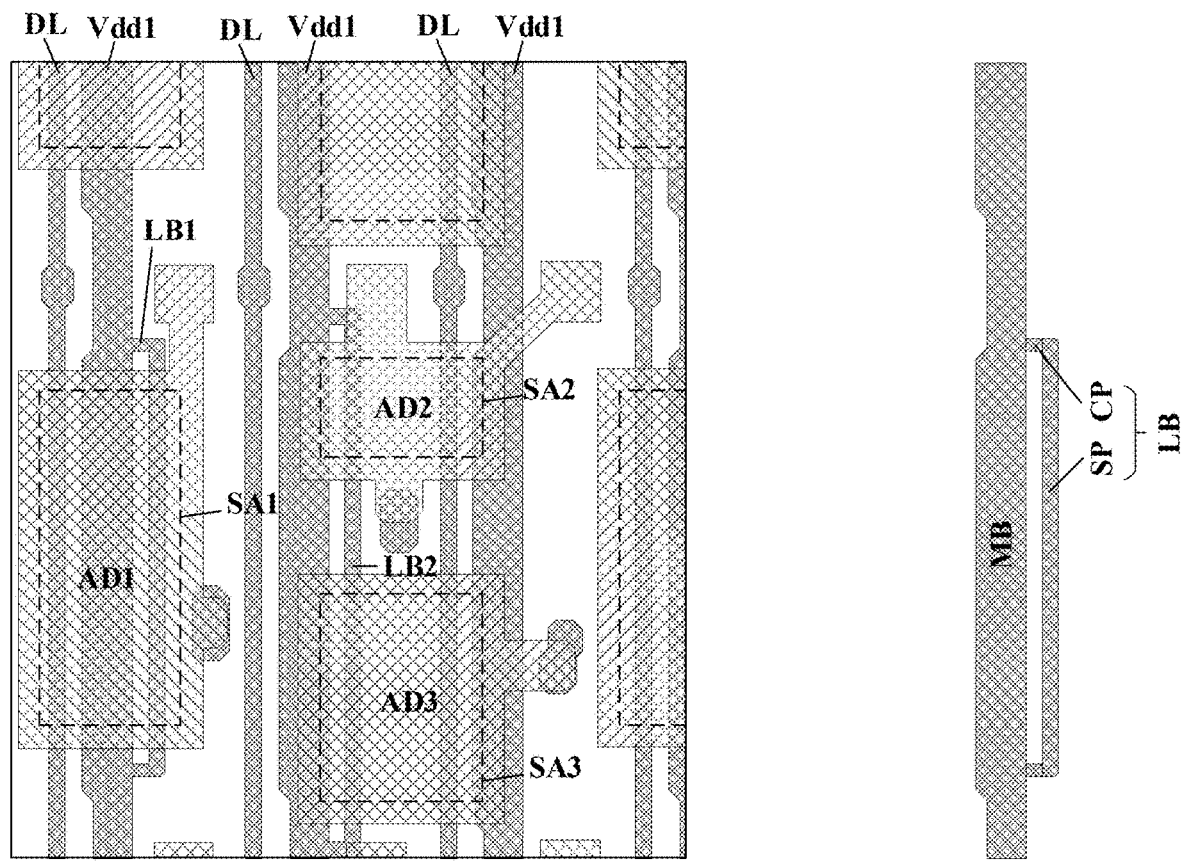
FIG. 10M illustrates a layout of signal lines in a second signal line layer and an anode layer in a portion of an array substrate in some embodiments according to the present disclosure.
FIG. 10N illustrates the structure of a respective first voltage supply line in some embodiments according to the present disclosure.

In some embodiments, a first adjacent first voltage supply line of the plurality of first voltage supply lines Vdd1 includes a first main body MB1 and a first branch LB1 connected to the first main body MB1; and a second adjacent first voltage supply line of the plurality of first voltage supply lines Vdd1 includes a second main body MB2 and a second branch LB2 connected to the second main body MB2. FIG. 10M illustrates a layout of signal lines in a second signal line layer and an anode layer in a portion of an array substrate in some embodiments according to the present disclosure. Referring to FIG. 10I and FIG. 10M, in some embodiments, an orthographic projection of an anode on a base substrate at least partially overlaps with an orthographic projection of a main body of a first voltage supply line of the plurality of first voltage supply lines Vdd1 on the base substrate; at least partially overlaps with an orthographic projection of a branch of the first voltage supply line on the base substrate; and at least partially overlaps with an orthographic projection of a data line of the plurality of data lines DL on the base substrate.

In some embodiments, an orthographic projection of the first anode AD1 on a base substrate at least partially overlaps with an orthographic projection of a data line of the plurality of data lines DL on the base substrate; at least partially overlaps with an orthographic projection of a first main body MB1 of a first adjacent first voltage supply line of the plurality of first voltage supply lines Vdd1 on the base substrate; and at least partially overlaps with an orthographic projection of a first branch LB1 of the first adjacent first voltage supply line on the base substrate.

In some embodiments, an orthographic projection of the second anode AD2 on a base substrate at least partially overlaps with an orthographic projection of a second main body MB2 of a second adjacent first voltage supply line of the plurality of first voltage supply lines Vdd1 on the base substrate; at least partially overlaps with an orthographic projection of a second branch LB2 of the second adjacent first voltage supply line on the base substrate; at least partially overlaps with an orthographic projection of a data line of the plurality of data lines DL on the base substrate; and at least partially overlaps with an orthographic projection of a third adjacent first voltage supply line of the plurality of first voltage supply lines Vdd1 on the base substrate.

In some embodiments, an orthographic projection of the third anode AD3 on a base substrate at least partially overlaps with an orthographic projection of a second main body MB2 of a second adjacent first voltage supply line of the plurality of first voltage supply lines Vdd1 on the base substrate; at least partially overlaps with an orthographic projection of a second branch LB2 of the second adjacent first voltage supply line on the base substrate; at least partially overlaps with an orthographic projection of a data line of the plurality of data lines DL on the base substrate; and at least partially overlaps with an orthographic projection of a third adjacent first voltage supply line of the plurality of first voltage supply lines Vdd1 on the base substrate.

In the present disclosure, by having the orthographic projection of the anode on the base substrate at least partially overlaps with the orthographic projection of a branch on the base substrate; at least partially overlaps with the orthographic projection of a main body of a first voltage supply line of the plurality of first voltage supply lines Vdd1 on the base substrate; and at least partially overlaps with the orthographic projection of a data line of the plurality of data lines DL on the base substrate, the array substrate achieves an even surface of the planarization layer underneath the anodes. As a result, color shift issue can be alleviated.

In some embodiments, a data line of the plurality of data lines DL, a first main body MB1 of a first voltage supply line of the plurality of first voltage supply lines Vdd1, and a first branch LB1 of the first voltage supply line, cross over the first anode AD1, respectively. In some embodiments, the data line of the plurality of data lines DL, the first main body MB1 of the first voltage supply line, and the first branch LB1 of the first voltage supply line are substantially evenly distributed along the first direction DR1 with respect to the first anode AD1. For example, portions of the data line of the plurality of data lines DL, the first main body MB1 of the first voltage supply line, and the first branch LB1 of the first voltage supply line, in a region crossing over the first anode AD1, are equi-spaced. In another example, portions of the data line of the plurality of data lines DL, the first main body MB1 of the first voltage supply line, and the first branch LB1 of the first voltage supply line, in a region crossing over the first anode AD1, have a substantial (e.g., at least 80%, at least 85%, at least 90%, at least 95%, or at least 99%) mirror symmetry with respect to a plane perpendicular to the first anode AD1 and intersecting the first anode AD1. In another example, in the region where portions of the data line of the plurality of data lines DL, the first main body MB1 of the first voltage supply line, and the first branch LB1 of the first voltage supply line cross over the first anode AD1, the first main body MB1 of the first voltage supply line spaces apart the data line of the plurality of data lines DL from the first branch LB1 of the first voltage supply line. The inventors of the present disclosure discover that, by having the intricate structure of anodes and signal lines according to the present disclosure, an even surface of the planarization layer underneath the first anode AD1 can be achieved. As a result, color shift issue can be alleviated.

In some embodiments, the array substrate includes a first subpixel aperture SA1 extending through the pixel definition layer and exposing a portion of the first anode AD1. In some embodiments, a data line of the plurality of data lines DL, a first main body MB1 of a first voltage supply line of the plurality of first voltage supply lines Vdd1, and a first branch LB1 of the first voltage supply line cross over the first subpixel aperture SA1, respectively. In some embodiments, the data line of the plurality of data lines DL, the first main body MB1 of the first voltage supply line, and the first branch LB1 of the first voltage supply line are substantially evenly distributed along the first direction DR1 with respect to the first subpixel aperture SA1. For example, portions of the data line of the plurality of data lines DL, the first main body MB1 of the first voltage supply line, and the first branch LB1 of the first voltage supply line, in a region crossing over the first subpixel aperture SA1, are equi-spaced. In another example, portions of the data line of the plurality of data lines DL, the first main body MB1 of the first voltage supply line, and the first branch LB1 of the first voltage supply line, in a region crossing over the first subpixel aperture SA1, have a substantial (e.g., at least 80%, at least 85%, at least 90%, at least 95%, or at least 99%) mirror symmetry with respect to a plane perpendicular to the first anode AD1 and intersecting the first subpixel aperture SA1. In another example, in the region where portions of the data line of the plurality of data lines DL, the first main body MB1 of the first voltage supply line, and the first branch LB1 of the first voltage supply line cross over the first subpixel aperture SA1, the first main body MB1 of the first voltage supply line spaces apart the data line of the plurality of data lines DL from the first branch LB1 of the first voltage supply line. The inventors of the present disclosure discover that, by having the intricate structure of anodes and signal lines according to the present disclosure, an even surface of the planarization layer underneath the first anode AD1 can be achieved. As a result, color shift issue can be alleviated.

In some embodiments, a second main body MB2 of a second adjacent first voltage supply line of the plurality of first voltage supply lines Vdd1, a second branch LB2 of the second adjacent first voltage supply line, a data line of the plurality of data lines DL, and a third adjacent first voltage supply line of the plurality of first voltage supply lines Vdd1, cross over the second anode AD2, respectively. In another example, portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1, in a region crossing over the second anode AD2, have a substantial (e.g., at least 80%, at least 85%, at least 90%, at least 95%, or at least 99%) mirror symmetry with respect to a plane perpendicular to the second anode AD2 and intersecting the second anode AD2. In another example, in the region where portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1 cross over the second anode AD2, the second branch LB2 of the second adjacent first voltage supply line and the data line of the plurality of data lines DL space apart the second main body MB2 of the second adjacent first voltage supply line from the third adjacent first voltage supply line of the plurality of first voltage supply lines Vdd1. The inventors of the present disclosure discover that, by having the intricate structure of anodes and signal lines according to the present disclosure, an even surface of the planarization layer underneath the second anode AD2 can be achieved. As a result, color shift issue can be alleviated.

In some embodiments, the array substrate includes a second subpixel aperture SA2 extending through the pixel definition layer and exposing a portion of the second anode AD2. In some embodiments, a second main body MB2 of a second adjacent first voltage supply line of the plurality of first voltage supply lines Vdd1, a second branch LB2 of the second adjacent first voltage supply line, a data line of the plurality of data lines DL, and a third adjacent first voltage supply line of the plurality of first voltage supply lines Vdd1 cross over the second subpixel aperture SA2, respectively. In another example, portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1, in a region crossing over the second subpixel aperture SA2, have a substantial (e.g., at least 80%, at least 85%, at least 90%, at least 95%, or at least 99%) mirror symmetry with respect to a plane perpendicular to the second anode AD2 and intersecting the second subpixel aperture SA2. In another example, in the region where portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1 cross over the second subpixel aperture SA2, the second branch LB2 of the second adjacent first voltage supply line and the data line of the plurality of data lines DL space apart the second main body MB2 of the second adjacent first voltage supply line from the third adjacent first voltage supply line of the plurality of first voltage supply lines Vdd1. The inventors of the present disclosure discover that, by having the intricate structure of anodes and signal lines according to the present disclosure, an even surface of the planarization layer underneath the second anode AD2 can be achieved. As a result, color shift issue can be alleviated.

In some embodiments, a second main body MB2 of a second adjacent first voltage supply line of the plurality of first voltage supply lines Vdd1, a second branch LB2 of the second adjacent first voltage supply line, a data line of the plurality of data lines DL, and a third adjacent first voltage supply line of the plurality of first voltage supply lines Vdd1, cross over the third anode AD3, respectively. In another example, portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1, in a region crossing over the third anode AD3, have a substantial (e.g., at least 80%, at least 85%, at least 90%, at least 95%, or at least 99%) mirror symmetry with respect to a plane perpendicular to the third anode AD3 and intersecting the third anode AD3. In another example, in the region where portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1 cross over the third anode AD3, the second branch LB2 of the second adjacent first voltage supply line and the data line of the plurality of data lines DL space apart the second main body MB2 of the second adjacent first voltage supply line from the third adjacent first voltage supply line of the plurality of first voltage supply lines Vdd1. The inventors of the present disclosure discover that, by having the intricate structure of anodes and signal lines according to the present disclosure, an even surface of the planarization layer underneath the third anode AD3 can be achieved. As a result, color shift issue can be alleviated.

In some embodiments, the array substrate includes a third subpixel aperture SA3 extending through the pixel definition layer and exposing a portion of the third anode AD3. In some embodiments, a second main body MB2 of a second adjacent first voltage supply line of the plurality of first voltage supply lines Vdd1, a second branch LB2 of the second adjacent first voltage supply line, a data line of the plurality of data lines DL, and a third adjacent first voltage supply line of the plurality of first voltage supply lines Vdd1 cross over the third subpixel aperture SA3, respectively. In another example, portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1, in a region crossing over the third subpixel aperture SA3, have a substantial (e.g., at least 80%, at least 85%, at least 90%, at least 95%, or at least 99%) mirror symmetry with respect to a plane perpendicular to the third anode AD3 and intersecting the third subpixel aperture SA3. In another example, in the region where portions of the second main body MB2 of the second adjacent first voltage supply line, the second branch LB2 of the second adjacent first voltage supply line, the data line of the plurality of data lines DL, and the third adjacent first voltage supply line of the plurality of first voltage supply lines Vdd1 cross over the third subpixel aperture SA3, the second branch LB2 of the second adjacent first voltage supply line and the data line of the plurality of data lines DL space apart the second main body MB2 of the second adjacent first voltage supply line from the third adjacent first voltage supply line of the plurality of first voltage supply lines Vdd1. The inventors of the present disclosure discover that, by having the intricate structure of anodes and signal lines according to the present disclosure, an even surface of the planarization layer underneath the third anode AD3 can be achieved. As a result, color shift issue can be alleviated.

FIG. 10N illustrates the structure of a respective first voltage supply line in some embodiments according to the present disclosure. Referring to FIG. 10N, the respective first voltage supply line in some embodiments includes a main body MB and a branch LB connected to the main body MB. The branch LB includes one or more connecting parts CP and a support part SP. The support part SP is spaced apart from the main body MB. The one or more connecting parts CP connect the support part SP with the main body MB.

Referring to FIG. 5I, in some embodiments, a respective fourth reset signal line of the plurality of fourth reset signal lines Vint4 includes a first portion P1, a second portion P2, a third portion P3, and a fourth portion P4. The second portion P2 connects the first portion P1 with the third portion P3. The third portion P3 connects the second portion P2 with the fourth portion P4. The first portion P1 and the fourth portion P4 extend along a direction substantially parallel to the second direction DR2. The second portion P2 and the third portion P3 extend along a direction non-parallel to the first direction DR1 and non-parallel to the second direction DR2. At least one of the second portion P2 or the third portion P3 is connected to the second connecting line Cl2 in the first signal line layer. Optionally, the respective fourth reset signal line of the plurality of fourth reset signal lines Vint4 is in a second signal line layer on a side of the first signal line layer away from the base substrate.

Figure 11A:
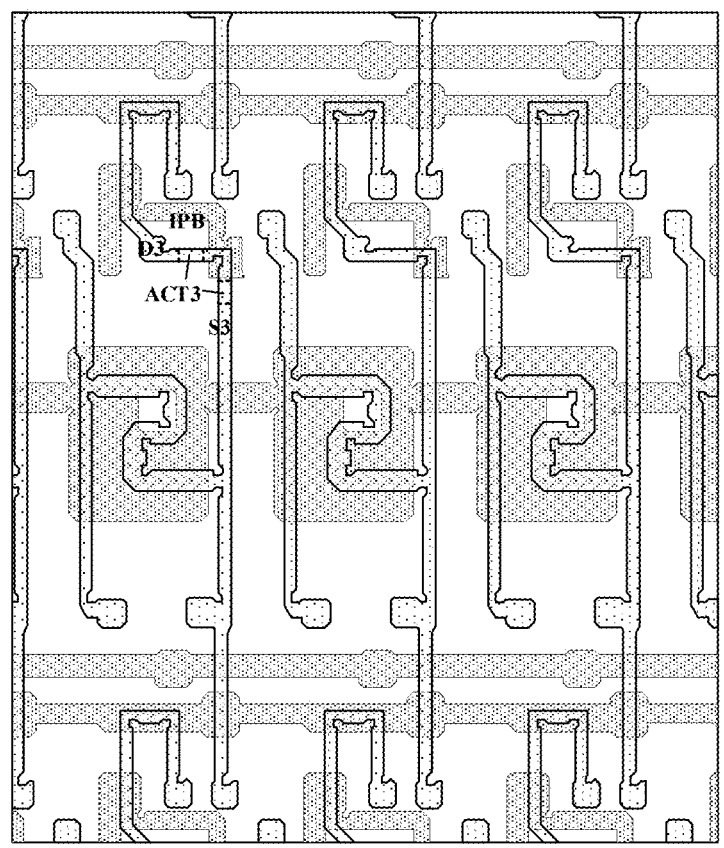
FIG. 11A illustrates a layout of signal lines in a semiconductor material layer and a second conductive layer in a portion of an array substrate in some embodiments according to the present disclosure.

FIG. 11A illustrates a layout of signal lines in a semiconductor material layer and a second conductive layer in a portion of an array substrate in some embodiments according to the present disclosure. Referring to FIG. 11A, FIG.

3A, FIG. 3C, FIG. 3E, FIG. 3G, FIG. 5C, FIG. 5E, FIG. 5G, the array substrate in some embodiments further includes an interference prevention block IPB. Optionally, the interference prevention block IPB is in the second conductive layer. Optionally, the interference prevention block IPB is in a same layer as the second capacitor electrode Ce2. Optionally, the interference prevention block IPB is connected to a respective second voltage supply line of the plurality of second voltage supply lines Vdd2. Optionally, the interference prevention block IPB is configured to receive a first reference voltage signal. Optionally, the first reference voltage signal is a constant voltage signal, e.g., a high reference voltage signal.

In some embodiments, an orthographic projection of the interference prevention block IPB on a base substrate at least partially overlaps with an orthographic projection of a portion of the semiconductor material layer between two active layer portions (e.g., two channel parts) of the third transistor T3 on the base substrate. The inventors of the present disclosure discover that this unique structure enhances stability of the third transistor T3.

Figure 11B:
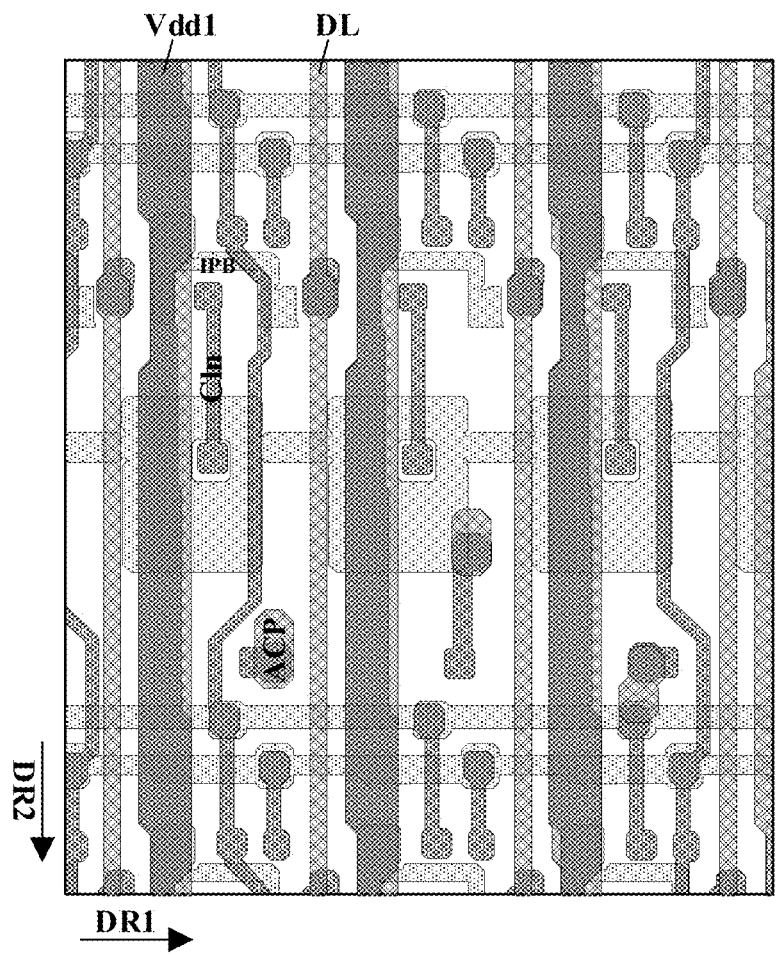
FIG. 11B illustrates a layout of signal lines in a second conductive layer, a first signal line layer, and a second signal line layer in a portion of an array substrate in some embodiments according to the present disclosure.

FIG. 11B illustrates a layout of signal lines in a second conductive layer, a first signal line layer, and a second signal line layer in a portion of an array substrate in some embodiments according to the present disclosure. Referring to FIG. 11B, FIG. 3A, FIG. 3C, FIG. 3E, FIG. 3G, and FIG. 3I, in some embodiments, an orthographic projection of the interference prevention block IPB on a base substrate spaces apart an orthographic projection of the node connecting line Cln on the base substrate from an orthographic projection of a respective data line of the plurality of data lines DL on the base substrate. The respective data line is configured to provide data signals to a pixel driving circuit comprising the interference prevention block IPB and the node connecting line Cln. In particular, the orthographic projection of the interference prevention block IPB on a base substrate spaces apart an orthographic projection of a portion of the node connecting line Cln extending through a via (e.g., the second via v2 in FIG. 4A) to connect to a first electrode of the third transistor on the base substrate from an orthographic projection of a respective data line of the plurality of data lines DL on the base substrate. The node connecting line Cln (including the portion extending through the via to connect to a first electrode of the third transistor) may be considered as the first node N1. The inventors of the present disclosure discover that this unique structure can reduce interference from data signals in the respective data line to the node connecting line Cln (e.g., the first node N1).

Figure 11C:
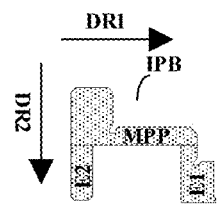
FIG. 11C illustrates the structure of an interference prevention block in some embodiments according to the present disclosure.

FIG. 11C illustrates the structure of an interference prevention block in some embodiments according to the present disclosure. Referring to FIG. 11C, the interference prevention block IPB in some embodiments includes a main pad part MPP, a first extension E1, and a second extension E2. The first extension E1 and the second extension E2 extend away from the main pad part MPP along a direction substantially parallel to the second direction DR2. The main pad part MPP connects the first extension E1 with the second extension E2. In some embodiments, referring to FIG. 11A and FIG. 11C, an orthographic projection of the first extension E1 on a base substrate at least partially overlaps with an orthographic projection of a portion of the semiconductor material layer between two active layer portions (e.g., two channel parts) of the third transistor T3 on the base substrate. Optionally, an orthographic projection of the second extension E2 on the base substrate is non-overlapping with the orthographic projection of the portion of the semiconductor material layer between the two active layer portions (e.g., the two channel parts) of the third transistor T3 on the base substrate.

Referring to FIG. 11B and FIG. 11C, in some embodiments, the second extension E2 overlaps with the node connecting line Cln along the second direction DR2. The second extension E2 spaces apart the node connecting line Cln from a data line of the plurality of data lines DL. Optionally, the data line of the plurality of data lines DL is a data line connected to a pixel driving circuit comprising the node connecting line Cln. The inventors of the present disclosure discover that this unique structure can minimize interference from the data line to the node connecting line Cln (corresponding to the first node N1).

Figure 12:
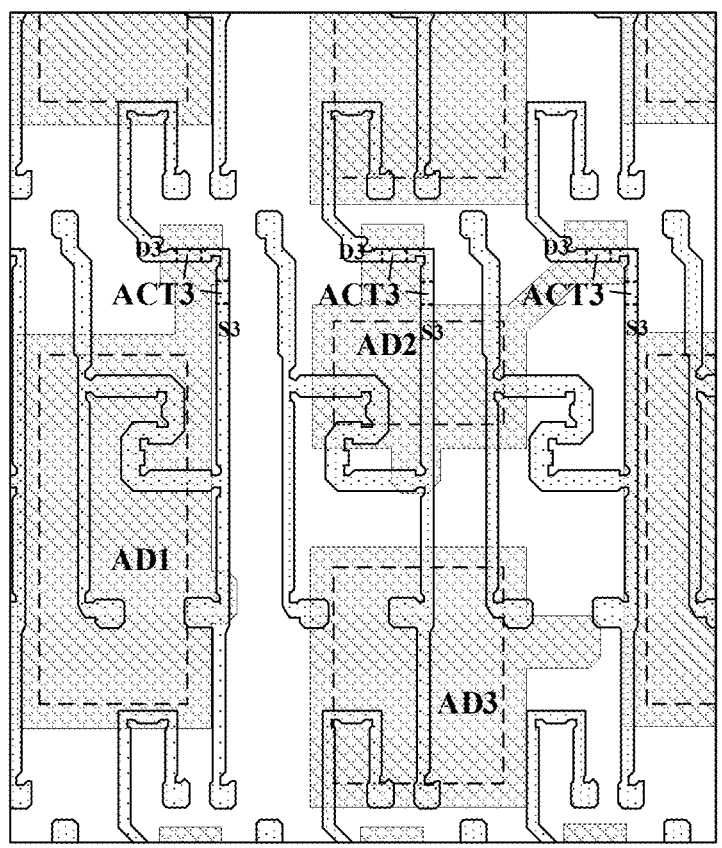
FIG. 12 illustrates a layout of signal lines in a semiconductor material layer and an anode layer in a portion of an array substrate in some embodiments according to the present disclosure.

FIG. 12 illustrates a layout of signal lines in a semiconductor material layer and an anode layer in a portion of an array substrate in some embodiments according to the present disclosure. Referring to FIG. 12, in some embodiments, an orthographic projection of the anode layer on a base substrate at least partially overlaps with an orthographic projection of at least one active layer portion (e.g., two channel parts) of the third transistor T3 on the base substrate. Optionally, the orthographic projection of the anode layer on the base substrate substantially covers (e.g., at least 80% covers, at least 85% covers, at least 90% covers, at least 95% covers, at least 99% covers, or completely covers) an orthographic projection of at least one active layer portion of the third transistor T3 on the base substrate. The inventors of the present disclosure discover that, by having this unique structure, at least one active layer portion of the third transistor T3 can be at least partially shielded from irradiation, e.g., irradiation by ambient light. The stability of the third transistor can be enhanced.

In some embodiments, the two active layer portions of the third transistor T3 includes a first active layer portion (e.g., a first channel part) and a second active layer portion (e.g., a second channel part). Optionally, the first active layer portion is connected to the second electrode D3 of the third transistor T3, and the second active layer portion is connected to the first electrode S3 of the third transistor T3. Optionally, the orthographic projection of the anode layer on the base substrate substantially covers an orthographic projection of the first active layer portion of the third transistor T3 on the base substrate.

In some embodiments, the anode layer includes a first anode AD1, a second anode AD2, and a third anode AD3. In one example, the first anode AD1 is an anode of a light emitting element of a first color; the second anode AD2 is an anode of a light emitting element of a second color, and the third anode AD3 is an anode of a light emitting element of a third color. In another example, the first color, the second color, and the third color are three different colors selected from a red color, a green color, and a blue color.

In some embodiments, an orthographic projection of the first anode AD1 on a base substrate substantially covers an orthographic projection of the first active layer portion (e.g., the first channel part) of the third transistor T3 in a first pixel driving circuit on the base substrate.

In some embodiments, an orthographic projection of the second anode AD2 on a base substrate substantially covers an orthographic projection of the first active layer portion (e.g., the first channel part) of the third transistor T3 in a second pixel driving circuit on the base substrate; and substantially covers an orthographic projection of the first active layer portion (e.g., the first channel part) of the third transistor T3 in a third pixel driving circuit on the base substrate. Optionally, the second pixel driving circuit and the third pixel driving circuit are in two adjacent columns of pixel driving circuits, respectively. Optionally, the first pixel driving circuit, the second pixel driving circuit, and the third pixel driving circuit are in three adjacent columns of pixel driving circuits, respectively.

In some embodiments, an orthographic projection of the third anode AD3 on a base substrate is non-overlapping with an orthographic projection of an active layer of the third transistor T3 in any pixel driving circuit on the base substrate.

Figure 13:
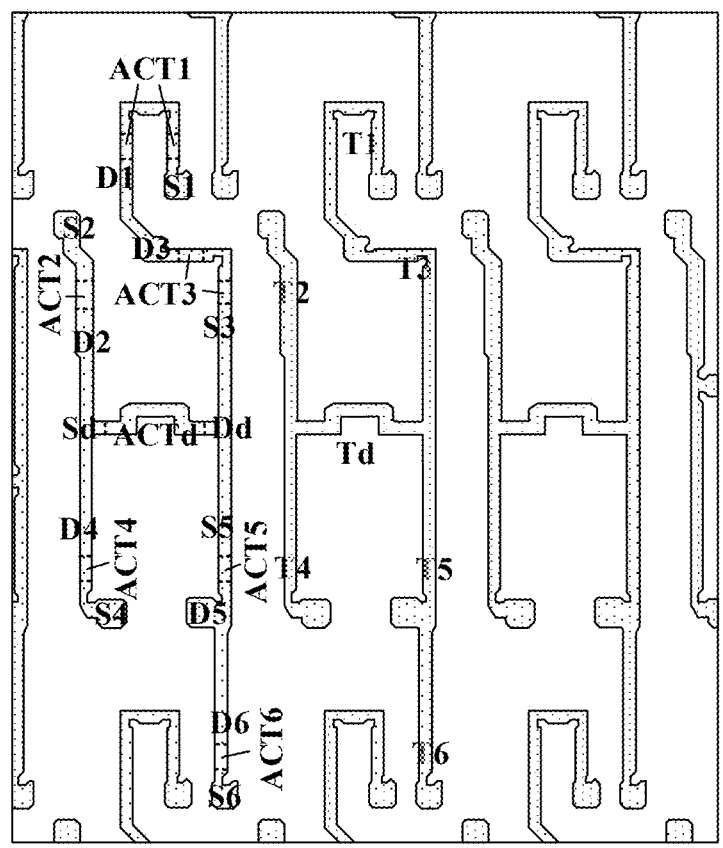
FIG. 13 is a diagram illustrating the structure of a semiconductor material layer in an array substrate in some embodiments according to the present disclosure.

Referring to FIG. 3C, in some embodiments, the active layer ACTd of the driving transistor Td has a reverse S shape. The inventors of the present disclosure discover that this unique structure can achieve a longer channel length. Various appropriate alternative implementations may be practiced. FIG. 13 is a diagram illustrating the structure of a semiconductor material layer in an array substrate in some embodiments according to the present disclosure. Referring to FIG. 13, the active layer ACTd of the driving transistor Td has a Π shape.

Figure 14:
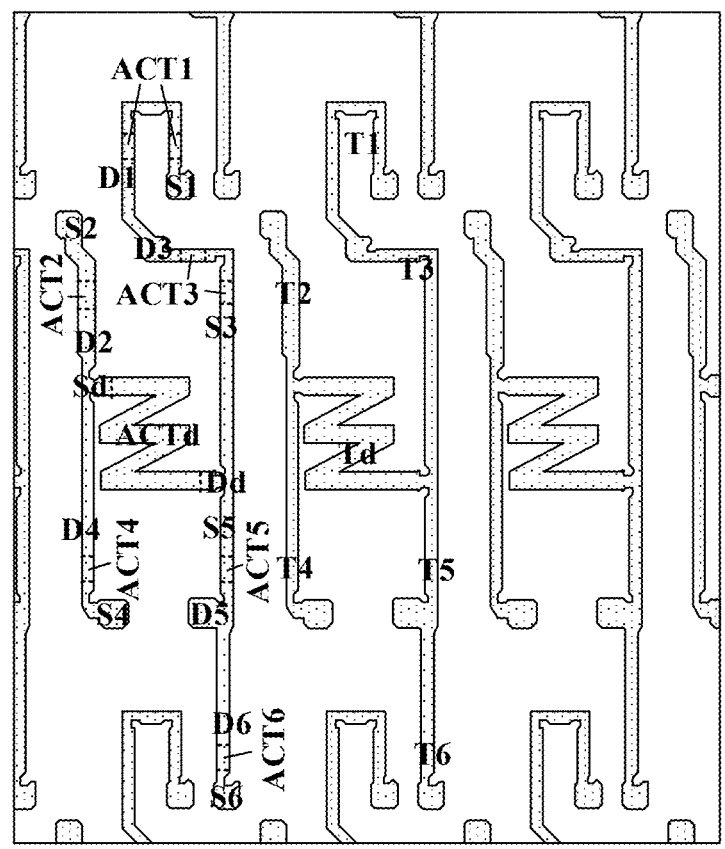
FIG. 14 is a diagram illustrating the structure of a semiconductor material layer in an array substrate in some embodiments according to the present disclosure.

FIG. 14 is a diagram illustrating the structure of a semiconductor material layer in an array substrate in some embodiments according to the present disclosure. Referring to FIG. 14, in some embodiments, the active layer ACTd of the driving transistor Td has a zig-zag shape. The inventors of the present disclosure discover that the unique structure results in a driving transistor having an increased channel length and a reduced leakage current.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating an array substrate. In some embodiments, the method includes forming a plurality of subpixels. Optionally, forming the plurality of subpixels comprises forming a first subpixel. Optionally, forming the first subpixel comprises forming a second conductive layer on a base substrate, and forming an anode layer on a side of the second conductive layer away from the base substrate. Optionally, forming the anode layer comprises forming a first anode in the first subpixel. Optionally, forming the second conductive layer comprises forming a first signal line and forming a second signal line, the first signal line and the second signal line extending along a direction substantially parallel to a second direction, respectively. Optionally, forming the second signal line comprises forming a main body extending along a direction substantially parallel to the second direction and forming a branch connected to the main body, the branch is on a side of the main body away from the first signal line along a direction substantially parallel to a first direction, the first direction and the second direction intersecting each other. Optionally, the branch is on a side of the main body away from the first signal line. Optionally, an orthographic projection of the first anode on the base substrate at least partially overlaps with an orthographic projection of the first signal line on the base substrate, at least partially overlaps with an orthographic projection of the main body on the base substrate, and at least partially overlaps with an orthographic projection of the branch on the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of subpixels; wherein the plurality of subpixels comprises a first subpixel;

the array substrate further comprises a base substrate, a second conductive layer on the base substrate, and an anode layer on a side of the second conductive layer away from the base substrate;

the anode layer comprises a first anode in the first subpixel;

the second conductive layer comprises a first signal line and a second signal line extending along a direction substantially parallel to a second direction, respectively;

the second signal line comprises a main body extending along a direction substantially parallel to the second direction and a branch connected to the main body, the branch is on a side of the main body away from the first signal line along a direction substantially parallel to a first direction, the first direction and the second direction intersecting each other; and an orthographic projection of the first anode on the base substrate at least partially overlaps with an orthographic projection of the first signal line on the base substrate, at least partially overlaps with an orthographic projection of the main body on the base substrate, and at least partially overlaps with an orthographic projection of the branch on the base substrate.

2. The array substrate of claim 1, comprising a plurality of first voltage supply lines and a plurality of data lines;
   wherein the first signal line is one of the plurality of data lines; and
   the second signal line is one of the plurality of first voltage supply lines;
   wherein a first adjacent first voltage supply line of the plurality of first voltage supply lines comprises a first main body and a first branch connected to the first main body;
   an orthographic projection of the first anode on the base substrate at least partially overlaps with an orthographic projection of a data line of the plurality of data lines on the base substrate; at least partially overlaps with an orthographic projection of the first main body on the base substrate; and at least partially overlaps with an orthographic projection of the first branch on the base substrate; and
   portions of the data line, the first main body, and the first branch, in a region crossing over the first anode, have a substantial mirror symmetry with respect to a plane perpendicular to the first anode and intersecting the first anode.

3. The array substrate of claim 1, wherein the branch comprises a support part and one or more connecting parts;
   the support part is spaced apart from the main body;
   the one or more connecting parts connect the support part with the main body.

4. The array substrate of claim 1, further comprising a first reset signal network and a second reset signal network, and comprising a first column of pixel driving circuits, a second column of pixel driving circuits, and a third column of pixel driving circuits adjacent to each other;
   wherein the first reset signal network comprises a plurality of first reset signal lines and a plurality of third reset signal lines interconnected to each other;
   the second reset signal network comprises a plurality of second reset signal lines and a plurality of fourth reset signal lines interconnected to each other;
   a third reset signal line of the plurality of third reset signal lines is present in the first column of pixel driving circuits, and the plurality of third reset signal lines are absent in the second column of pixel driving circuits;
   a fourth reset signal line of the plurality of fourth reset signal lines is present in the second column of pixel driving circuits, and the plurality of fourth reset signal lines are absent in the first column of pixel driving circuits; and
   the plurality of third reset signal lines and the plurality of fourth reset signal lines are absent in the third column of pixel driving circuits.

5. The array substrate of claim 4, wherein the first column of pixel driving circuits is configured to drive light emission of a first column of subpixels of a first color;
   the second column of pixel driving circuits is configured to drive light emission of a second column of subpixels of a second color;
   the third column of pixel driving circuits is configured to drive light emission of a third column of subpixels of a third color; and
   the first color, the second color, and the third color are different colors.

6. The array substrate of claim 4, wherein the plurality of first reset signal lines and the plurality of second reset signal lines are in a same conductive layer;
   the plurality of third reset signal lines and the plurality of fourth reset signal lines are in a same layer on a side of the same conductive layer away from a base substrate.

7. The array substrate of claim 4, wherein pixel driving circuits of the array substrate are arranged in K columns including a (3k−2)-th column, a (3k−1)-th column, and a (3k)-th column, K and k being positive integers, 1≤k≤(K/3);
   a third reset signal line of the plurality of third reset signal lines is present in the (3k−2)-th column of pixel driving circuits, and the plurality of third reset signal lines are absent in the (3k)-th column of pixel driving circuits;
   a fourth reset signal line of the plurality of fourth reset signal lines is present in the (3k)-th column of pixel driving circuits, and the plurality of fourth reset signal lines are absent in the (3k−2)-th column of pixel driving circuits; and
   the plurality of third reset signal lines and the plurality of fourth reset signal lines are absent in the (3k−1)-th column of pixel driving circuits.

8. The array substrate of claim 4, wherein a pixel driving circuit in the second column of pixel driving circuits comprises a first connecting line connecting a first electrode of a first reset transistor to a first reset signal line of the plurality of first reset signal lines;
   a pixel driving circuit in the first column of pixel driving circuits comprises a second connecting line connecting a first electrode of a second reset transistor to a second reset signal line of the plurality of second reset signal lines;
   a pixel driving circuit in the third column of pixel driving circuits comprises a first connecting line connecting a first electrode of a first reset transistor to a first reset signal line of the plurality of first reset signal lines and a second connecting line connecting a first electrode of a second reset transistor to a second reset signal line of the plurality of second reset signal lines;
   a first connecting line is absent in the first column of pixel driving circuits, the third reset signal line connects a first electrode of a first reset transistor to a first reset signal line of the plurality of first reset signal lines; and
   a second connecting line is absent in the second column of pixel driving circuits, the fourth reset signal line connects a first electrode of a second reset transistor to a second reset signal line of the plurality of second reset signal lines.

9. The array substrate of claim 4, wherein a respective pixel driving circuit comprises a first connecting line connecting a first electrode of a first reset transistor to a first reset signal line of the plurality of first reset signal lines and a second connecting line connecting a first electrode of a second reset transistor to a second reset signal line of the plurality of second reset signal lines;
   in the first column of pixel driving circuits, the third reset signal line is connected to a first reset signal line of the plurality of first reset signal lines through a first connecting line in a pixel driving circuit in the first column of pixel driving circuits; and
   in the second column of pixel driving circuits, the fourth reset signal line is connected to a second reset signal line of the plurality of second reset signal lines through a second connecting line in a pixel driving circuit in the second column of pixel driving circuits.

10. The array substrate of claim 4, wherein an orthographic projection of the first anode on the base substrate at least partially overlaps with an orthographic projection of a fourth reset signal line of the plurality of fourth reset signal lines on the base substrate; at least partially overlaps with an orthographic projection of a first voltage supply line of a plurality of first voltage supply lines on the base substrate; and at least partially overlaps with an orthographic projection of a data line of a plurality of data lines on the base substrate; and portions of the fourth reset signal line, the first voltage supply line, and the data line, in a region crossing over the first anode, have a substantial mirror symmetry with respect to a plane perpendicular to the first anode and intersecting the first anode.

11. The array substrate of claim 10, wherein, in the region where portions of the fourth reset signal line, the first voltage supply line, and the data line cross over the first anode, the first voltage supply line spaces apart the fourth reset signal line from the data line.

12. The array substrate of claim 10, wherein, in the region where portions of the fourth reset signal line, the first voltage supply line, and the data line cross over the first anode, the fourth reset signal line and the data line have a substantial mirror symmetry with respect to the first voltage supply line.

13. The array substrate of claim 4, further comprising a second anode;

wherein an orthographic projection of the second anode on the base substrate at least partially overlaps with an orthographic projection of a first adjacent first voltage supply line of a plurality of first voltage supply lines on the base substrate; at least partially overlaps with an orthographic projection of a third reset signal line of the plurality of third reset signal lines on the base substrate; at least partially overlaps with an orthographic projection of a data line of a plurality of data lines on the base substrate; and at least partially overlaps with an orthographic projection of a second adjacent first voltage supply line of the plurality of first voltage supply lines on the base substrate; and portions of the first adjacent first voltage supply line, the third reset signal line, the data line, and the second adjacent first voltage supply line, in a region crossing over the second anode, have a substantial mirror symmetry with respect to a plane perpendicular to the second anode and intersecting the second anode.

14. The array substrate of claim 13, wherein, in the region where portions of the first adjacent first voltage supply line, the third reset signal line, the data line, and the second adjacent first voltage supply line cross over the second anode, the third reset signal line and the data line space apart the first adjacent first voltage supply line from the second adjacent first voltage supply line.

15. The array substrate of claim 4, further comprising a second anode and a plurality of first voltage supply lines;

wherein a second adjacent first voltage supply line of the plurality of first voltage supply lines comprises a second main body and a second branch connected to the second main body;

an orthographic projection of the second anode on the base substrate at least partially overlaps with an orthographic projection of the second main body on the base substrate, at least partially overlaps with an orthographic projection of the second branch on the base substrate, at least partially overlaps with an orthographic projection of a data line of a plurality of data lines on the base substrate, and at least partially overlaps with an orthographic projection of a third adjacent first voltage supply line of the plurality of first voltage supply lines on the base substrate; and portions of the second main body, the second branch, the data line, and the third adjacent first voltage supply line, in a region crossing over the second anode, have a substantial mirror symmetry with respect to a plane perpendicular to the second anode and intersecting the second anode.

16. The array substrate of claim 15, wherein, in the region where portions of the second main body, the second branch, the data line, and the third adjacent first voltage supply line cross over the second anode, the second branch and the data line space apart the second main body from the third adjacent first voltage supply line.

17. The array substrate of claim 4, further comprising a second anode and a third anode;

wherein a respective pixel driving circuit comprises a compensating transistor and a driving transistor;

the compensating transistor comprises a first channel part connected to a second electrode of the compensating transistor and a second channel part connected to a first electrode of the compensating transistor;

the second electrode of the compensating transistor is connected to a gate electrode of the driving transistor; and an orthographic projection of the first anode on the base substrate substantially covers an orthographic projection of a first channel part of a compensating transistor in a first pixel driving circuit on the base substrate.

18. The array substrate of claim 17, wherein an orthographic projection of the second anode on the base substrate substantially covers an orthographic projection of a first channel part of a compensating transistor in a second pixel driving circuit on the base substrate, and substantially covers an orthographic projection of a first channel part of a compensating transistor in a third pixel driving circuit on the base substrate; and an orthographic projection of the third anode on the base substrate is non-overlapping with an orthographic projection of an active layer of a compensating transistor in any pixel driving circuit on the base substrate.

19. The array substrate of claim 1, wherein the first subpixel comprises an interference prevention block;

wherein the interference prevention block comprises a main pad part, a first extension, and a second extension;

the first extension and the second extension extend away from the main pad part along a direction substantially parallel to the second direction;

the main pad part connects the first extension with the second extension;

an orthographic projection of the first extension on the base substrate at least partially overlaps with an orthographic projection of a portion of a semiconductor material layer between two channel parts of a compensating transistor on the base substrate; and an orthographic projection of the second extension on the base substrate is non-overlapping with the orthographic projection of the portion of the semiconductor material layer between the two channel parts of the compensating transistor on the base substrate.

20. A display apparatus, comprising the array substrate of claim 1, and one or more integrated circuits connected to the array substrate.

* * * * *